United States Patent
Kuwabara et al.

(10) Patent No.: US 12,058,927 B2
(45) Date of Patent: Aug. 6, 2024

(54) ORGANIC ELECTROLUMINESCENCE DEVICE AND POLYCYCLIC COMPOUND FOR ORGANIC ELECTROLUMINESCENCE DEVICE

(71) Applicant: Samsung Display Co., Ltd., Yongin-si (KR)

(72) Inventors: Hirokazu Kuwabara, Yokohama (JP); Ryuhei Furue, Yokohama (JP)

(73) Assignee: Samsung Display Co., Ltd., Yongin-si (KR)

( * ) Notice: Subject to any disclaimer, the term of this patent is extended or adjusted under 35 U.S.C. 154(b) by 569 days.

(21) Appl. No.: 16/881,872

(22) Filed: May 22, 2020

(65) Prior Publication Data

US 2021/0036227 A1 Feb. 4, 2021

(30) Foreign Application Priority Data

Jul. 30, 2019 (KR) .......................... 10-2019-0092407

(51) Int. Cl.
*H10K 85/30* (2023.01)
*C07F 5/02* (2006.01)
(Continued)

(52) U.S. Cl.
CPC ........... *H10K 85/322* (2023.02); *C07F 5/027* (2013.01); *C07F 9/6561* (2013.01); *C09K 11/06* (2013.01);
(Continued)

(58) Field of Classification Search
CPC . H01L 51/008; H01L 51/006; H01L 51/0069; H01L 51/5024; H01L 51/5012;
(Continued)

(56) References Cited

U.S. PATENT DOCUMENTS 10,374,166 B2 8/2019 Hatakeyama et al.
2014/0058099 A1* 2/2014 Wakamiya .......... H01L 51/0072
544/347

(Continued)

FOREIGN PATENT DOCUMENTS

CN 110790782 A * 2/2020 .............. C07F 5/027
JP 2017-226838 A 12/2017

(Continued)

OTHER PUBLICATIONS

Hirai et al., Chem. Rev, (2019), 119, pp. 8291-8331. (Year: 2019).*

(Continued)

*Primary Examiner* — Dawn L Garrett
(74) *Attorney, Agent, or Firm* — Lewis Roca Rothgerber Christie LLP

(57) ABSTRACT

An organic electroluminescence device of an embodiment includes a first electrode, a second electrode, and an emission layer between the first electrode and the second electrode, wherein the emission layer includes a polycyclic compound represented by Formula 1 below, and shows high emission efficiency:

Formula 1

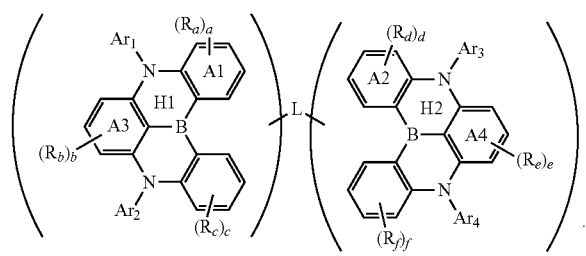

20 Claims, 2 Drawing Sheets

(51) Int. Cl.
*C07F 9/6561* (2006.01)
*C09K 11/06* (2006.01)
*H10K 50/11* (2023.01)
*H10K 50/12* (2023.01)
*H10K 85/60* (2023.01)

(52) U.S. Cl.
CPC .......... *H10K 50/12* (2023.02); *H10K 85/633* (2023.02); *H10K 85/656* (2023.02); *H10K 50/11* (2023.02)

(58) Field of Classification Search
CPC ............ H01L 51/0059; H01L 51/0052; H01L 51/0055; H01L 51/0071; C07F 5/027; C07F 9/6561; C09K 11/06; H10K 85/322; H10K 50/12; H10K 85/633; H10K 85/656; H10K 50/11; H10K 2101/20; H10K 85/631; H10K 85/615; H10K 85/623; H10K 85/657

See application file for complete search history.

(56) References Cited

U.S. PATENT DOCUMENTS

| | | | |
|---|---|---|---|
| 2015/0236274 A1* | 8/2015 | Hatakeyama | C07F 5/02 548/405 |
| 2018/0094000 A1 | 4/2018 | Hatakeyama et al. | |
| 2018/0301629 A1 | 10/2018 | Hatakeyama et al. | |
| 2019/0058124 A1 | 2/2019 | Hatakeyama et al. | |
| 2019/0115537 A1 | 4/2019 | Makishima et al. | |
| 2019/0115538 A1 | 4/2019 | Lim et al. | |
| 2019/0207112 A1 | 7/2019 | Hatakeyama et al. | |
| 2020/0185626 A1 | 6/2020 | Yuuki | |

FOREIGN PATENT DOCUMENTS

| | | |
|---|---|---|
| KR | 10-1876763 B1 | 7/2018 |
| KR | 10-2018-0108604 A | 10/2018 |
| KR | 10-2018-0132129 A | 12/2018 |
| KR | 10-2019-0042791 A | 4/2019 |
| WO | WO 2015/102118 A1 | 7/2015 |
| WO | WO 2016/152418 A1 | 9/2016 |
| WO | WO 2016/152544 A1 | 9/2016 |
| WO | WO 2017/188111 A1 | 11/2017 |
| WO | WO 2018/203666 A1 | 11/2018 |
| WO | WO 2018/212169 A1 | 11/2018 |
| WO | WO 2019/004248 A1 | 1/2019 |
| WO | WO-2019074093 A1 * | 4/2019 ................ C07F 5/02 |

OTHER PUBLICATIONS

Saito, S., Matsuo, K. and Yamaguchi, S., 2012. Polycyclic π-electron system with boron at its center. Journal of the American Chemical Society, 134(22), pp. 9130-9133. (Year: 2012).*

Hatakeyama, T., Shiren, K., Nakajima, K., Nomura, S., Nakatsuka, S., Kinoshita, K., Ni, J., Ono, Y. and Ikuta, T., 2016. Ultrapure blue thermally activated delayed fluorescence molecules: efficient HOMO-LUMO separation by the multiple resonance effect. Advanced Materials, 28(14), pp. 2777-2781. (Year: 2016).*

Wang, X. et al., 2016. Synthesis of NBN-type zigzag-edged polycyclic aromatic hydrocarbons: 1, 9-diaza-9a-boraphenalene as a structural motif. Journal of the American Chemical Society, 138(36), pp. 11606-11615. (Year: 2016).*

He, S., Liu, J., Yang, G., Bin, Z. and You, J., 2022. Dipole moment engineering enables universal B—N-embedded bipolar hosts for OLEDs: an old dog learns a new trick. Materials Horizons, 9(11), pp. 2818-2823. (Year: 2022).*

Monkman, A. (2021). Why do we still need a stable long lifetime deep blue OLED Emitter?. ACS Applied Materials & Interfaces, 14(18), 20463-20467. (Year: 2021).*

Machine translation of WO 2019/074093 A1 (publication date: Apr. 2019). (Year: 2019).*

Machine translation of CN-110790782-A (publication date Feb. 2020). (Year: 2020).*

* cited by examiner

ORGANIC ELECTROLUMINESCENCE DEVICE AND POLYCYCLIC COMPOUND FOR ORGANIC ELECTROLUMINESCENCE DEVICE

CROSS-REFERENCE TO RELATED APPLICATION

This application claims priority to and the benefit of Korean Patent Application No. 10-2019-0092407, filed on Jul. 30, 2019, the entire content of which is hereby incorporated by reference.

BACKGROUND

1. Field

One or more aspects of embodiments of the present disclosure herein relates to an organic electroluminescence device and a polycyclic compound used therein, and more particularly, to a polycyclic compound used as a light-emitting material and an organic electroluminescence device including the same.

2. Description of the Related Art

Recently, the development of an organic electroluminescence display device as an image display device is being actively conducted. Different from a liquid crystal display device, the organic electroluminescence display device is a self-luminescent display device in which holes and electrons injected from a first electrode and a second electrode recombine in an emission layer, and a light-emitting material including an organic compound in the emission layer emits light to attain display of images.

In the application of an organic electroluminescence device to a display device, the decrease of the driving voltage, and the increase of the emission efficiency and the life of the organic electroluminescence device are required (or desired), and developments of materials for an organic electroluminescence device capable of stably attaining these characteristics are being continuously sought.

Particularly, recently, in order to accomplish an organic electroluminescence device with high efficiency, techniques on phosphorescence emission (which uses energy in a triplet state) or delayed fluorescence emission (which uses the generating phenomenon of singlet excitons by the collision of triplet excitons (triplet-triplet annihilation, TTA)) are being developed, and development of a material for thermally activated delayed fluorescence (TADF) using delayed fluorescence phenomenon is being conducted.

SUMMARY

One or more aspects of embodiments of the present disclosure are directed toward an organic electroluminescence device showing excellent (suitable) emission efficiency.

The present disclosure also provides a polycyclic compound, which is a material for an organic electroluminescence device having high efficiency properties.

An embodiment of the present disclosure provides a polycyclic compound represented by the following Formula 1:

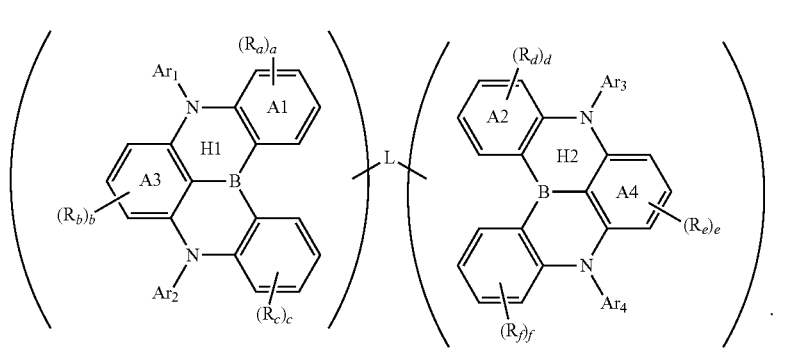

Formula 1

In Formula 1, $Ar_1$ to $Ar_4$ are each independently a substituted or unsubstituted aryl group of 6 to 30 carbon atoms for forming a ring, $R_a$ to $R_f$ are each independently a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. "a", "c", "d", and "f" are each independently an integer of 0 to 4, and "b" and "e" are each independently an integer of 0 to 3.

In embodiments where ring A1 and ring A2 are connected via L, L may be O, S, $BR_p$, $NR_q$, (P=O)$R_s$, (P=S)$R_t$, (C=O), a substituted or unsubstituted arylene group of 6 to 30 carbon atoms for forming a ring, or a substituted or unsubstituted heteroarylene group of 2 to 30 carbon atoms for forming a ring.

In embodiments where ring A3 and ring A4 are connected via L, L may be a direct linkage, O, S, $BR_p$, $NR_q$, (P=O)$R_s$, (P=S)$R_t$, (C=O), a substituted or unsubstituted arylene group of 6 to 30 carbon atoms for forming a ring, or a substituted or unsubstituted heteroarylene group of 2 to 30 carbon atoms for forming a ring, provided that L is not a phenylene group which is substituted with a carbazole group.

In embodiments where ring H1 and ring H2 are connected via L, L interconnects $Ar_1$ and $Ar_3$, and L may be a direct linkage, O, S, $BR_p$, $NR_q$, (P=O)$R_s$, (P=S)$R_t$, (C=O), a substituted or unsubstituted arylene group of 6 to 30 carbon atoms for forming a ring, or a substituted or unsubstituted heteroarylene group of 2 to 30 carbon atoms for forming a ring, and $R_p$, $R_q$, $R_s$, and $R_t$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group.

In an embodiment, $Ar_1$ to $Ar_4$ may be each independently a substituted or unsubstituted phenyl group.

In an embodiment, Formula 1 may be represented by any one among the following Formula 1-1 to Formula 1-3:

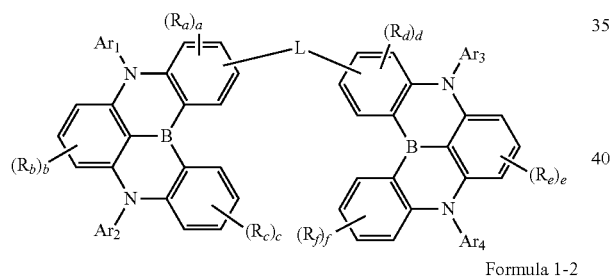

Formula 1-1

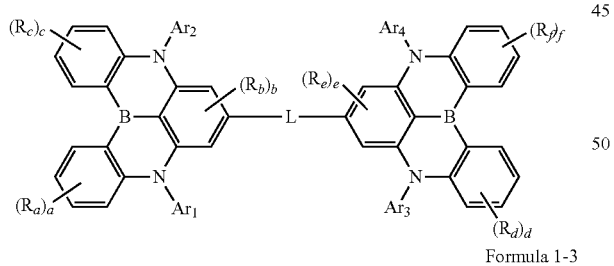

Formula 1-2

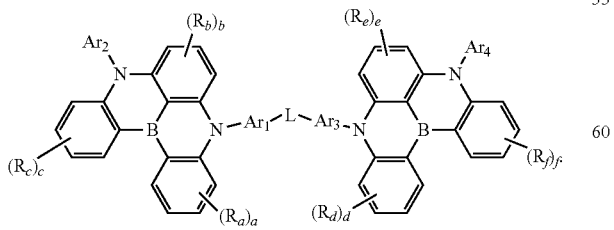

Formula 1-3

In Formula 1-1 to Formula 1-3, $Ar_1$ to $Ar_4$, $R_a$ to $R_f$, "a" to "f", and L are the same as defined in Formula 1.

In an embodiment, Formula 1 may be represented by the following Formula 2:

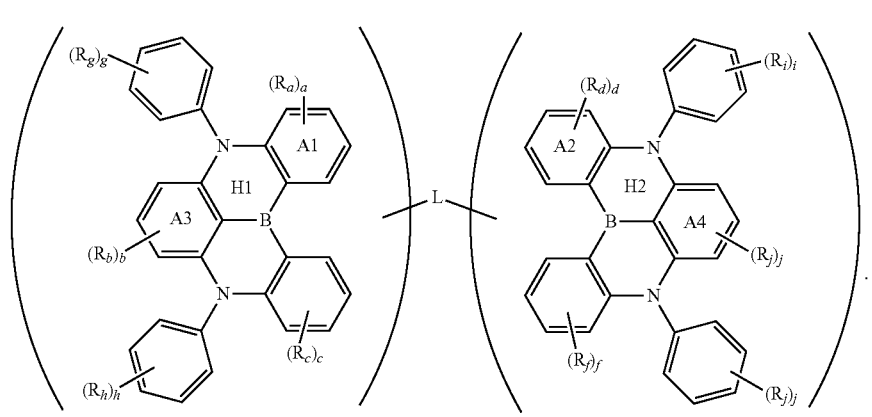

Formula 2

In Formula 2, $R_g$, $R_h$, $R_i$, and $R_j$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group, "g", "h", "i", and "j" may each independently be an integer of 0 to 5, and L, $R_a$ to $R_f$, and "a" to "f" are the same as defined in Formula 1.

In Formula 1, L may be a direct linkage or may be represented by any one among the following Formulae L1 to L9:

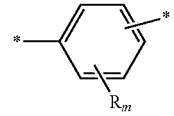

L1

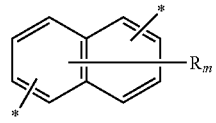

L2

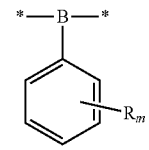

L3

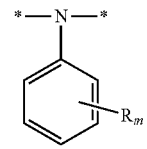

L4

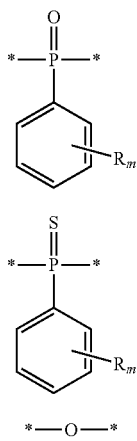

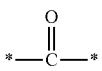

In Formulae L1 to L9, $R_m$ may be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group, provided that $R_m$ in Formula L1 is not a substituted or unsubstituted carbazole group.

In an embodiment, Formula 1-1 may be represented by any one among the following Formula 1-1A to Formula 1-1O:

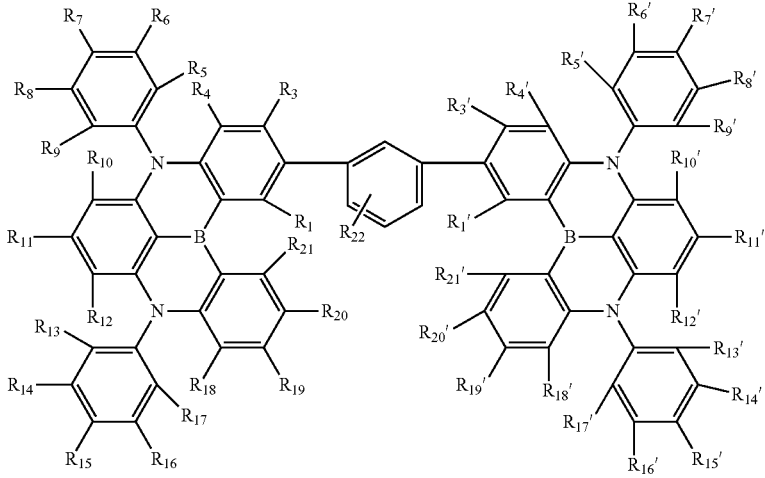

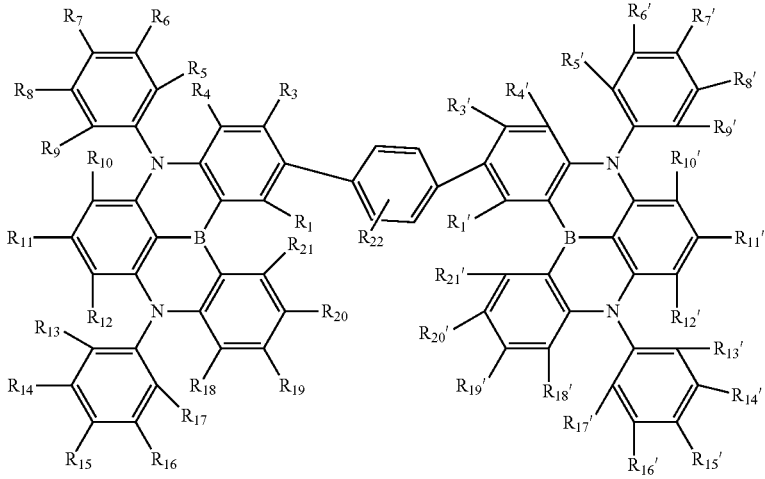

-continued
1-1C
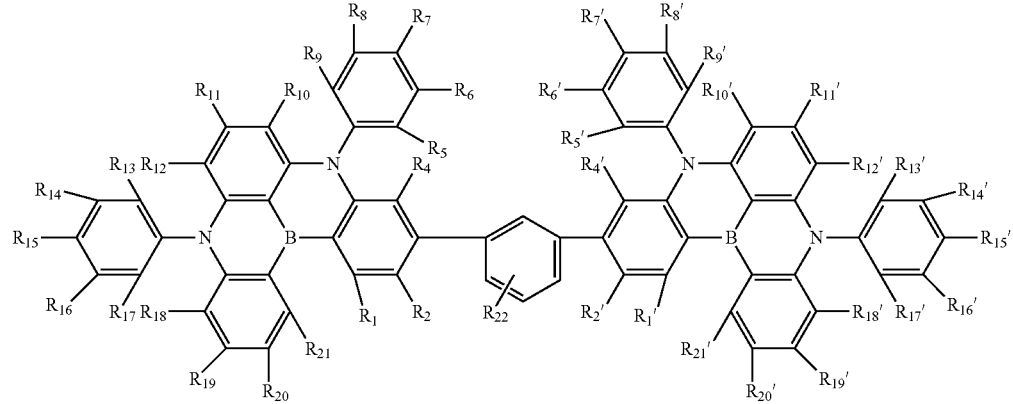
1-1D
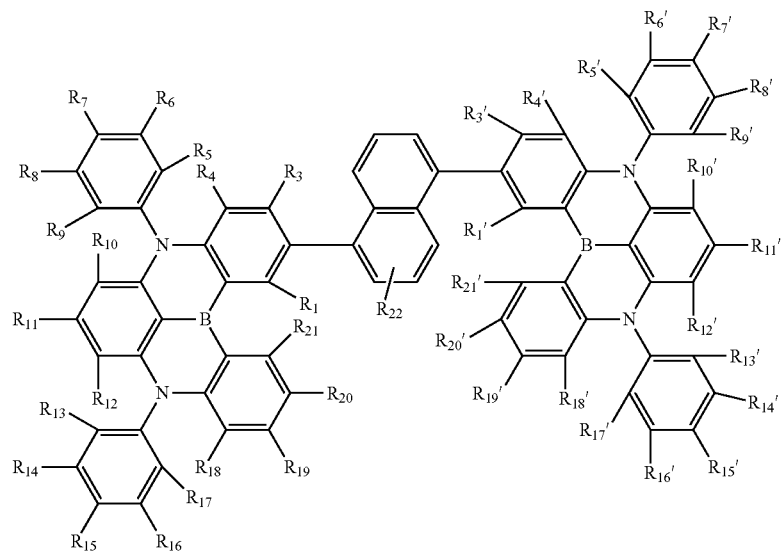
1-1E
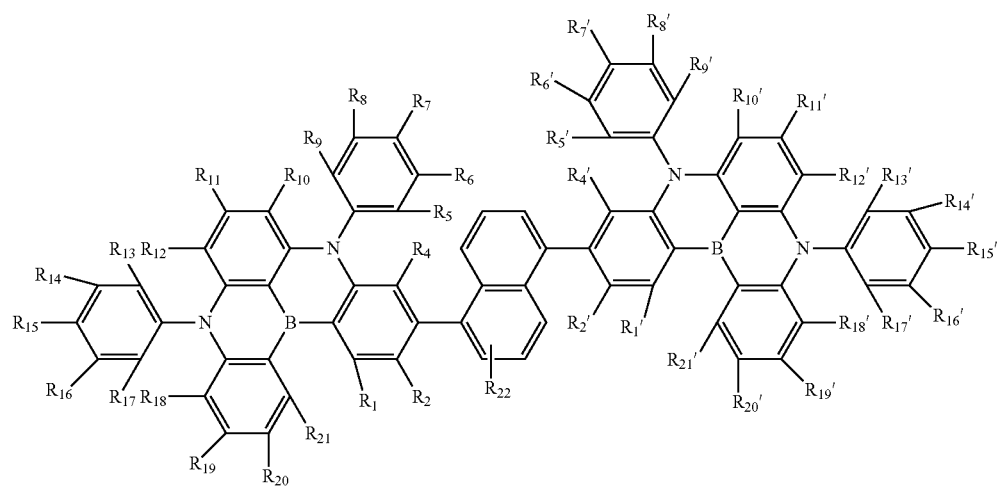

-continued
1-1F
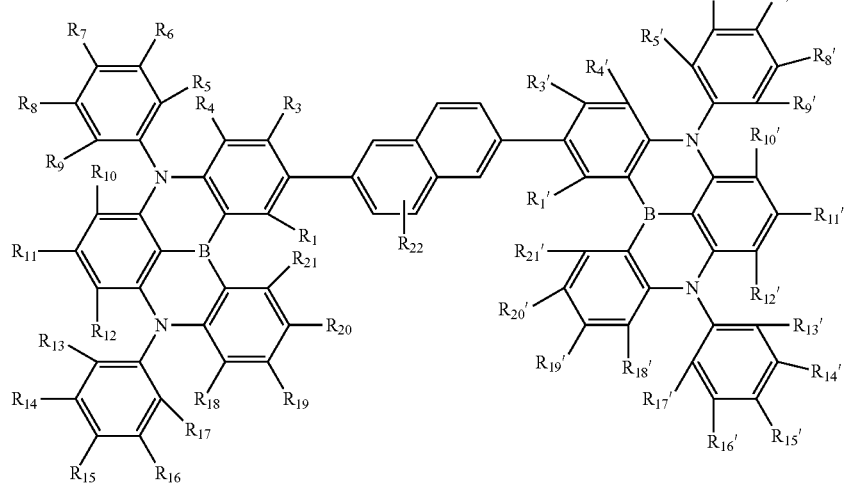
1-1G
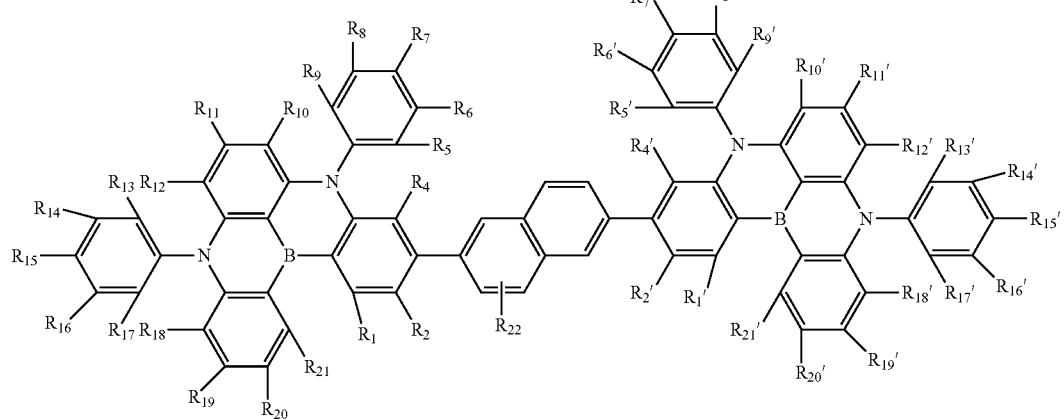
1-1H
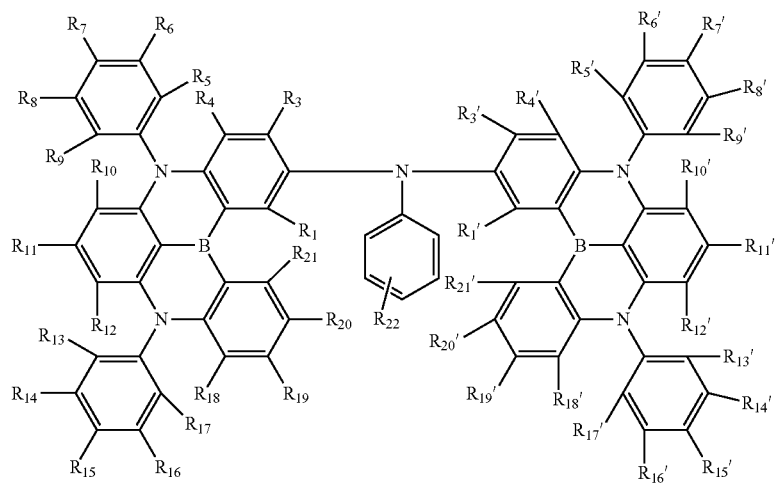

-continued
1-1I
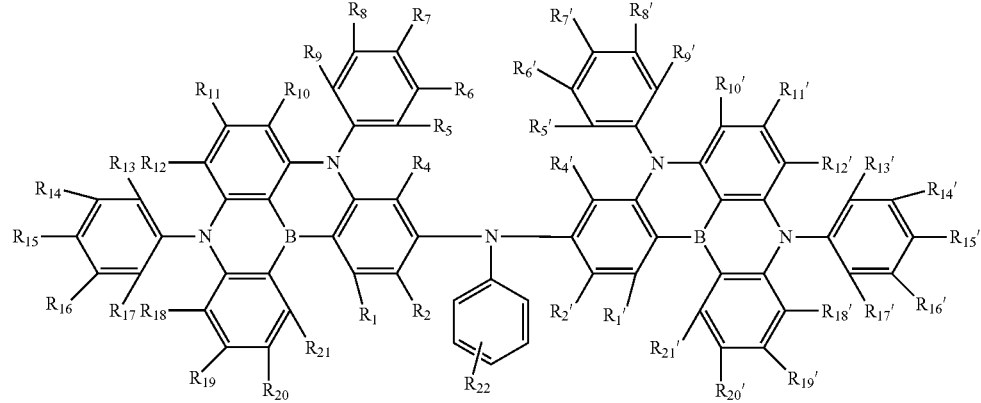
1-1J
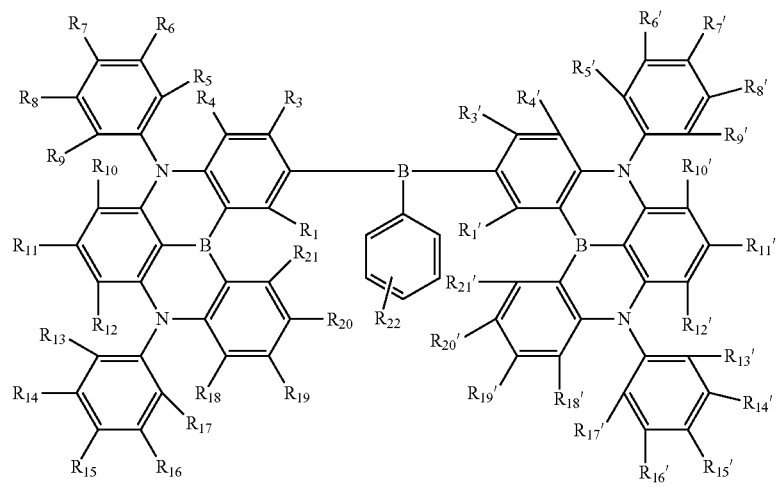
1-1K
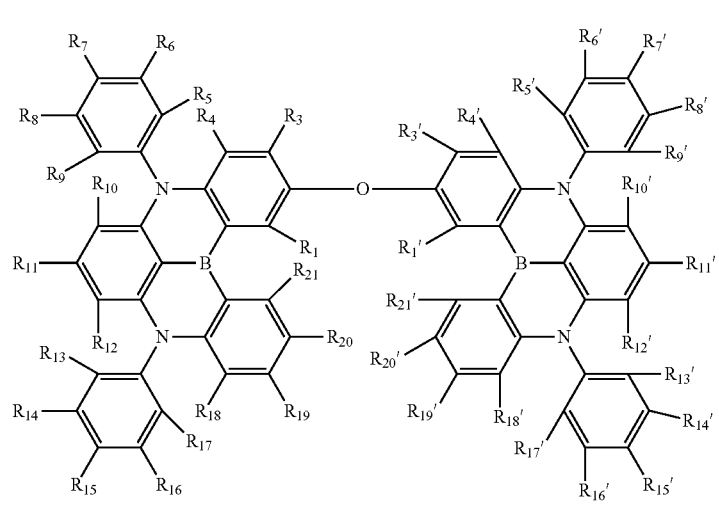

-continued
1-1L
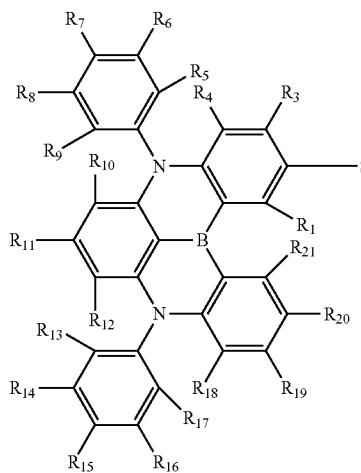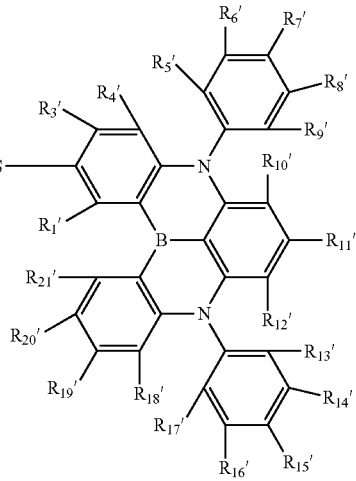
1-1M
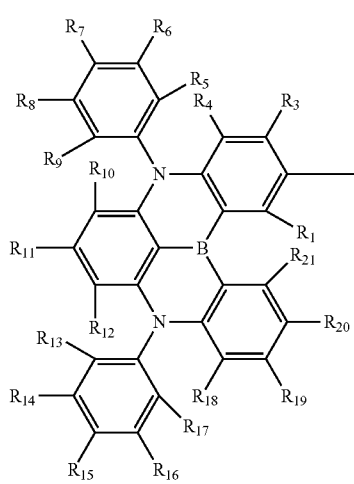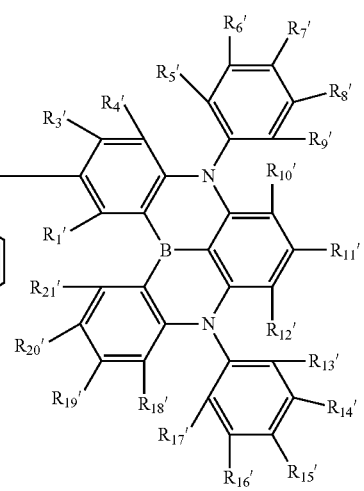
1-1N
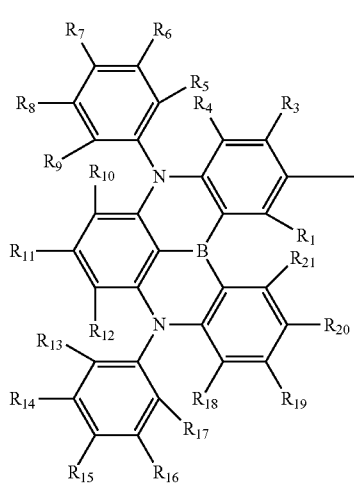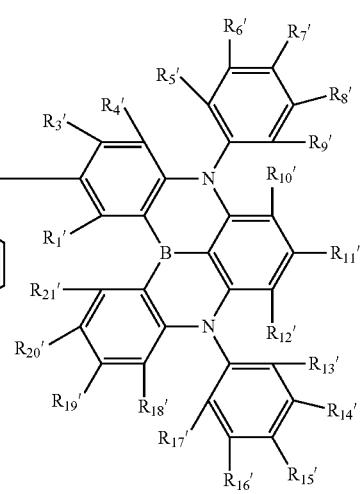

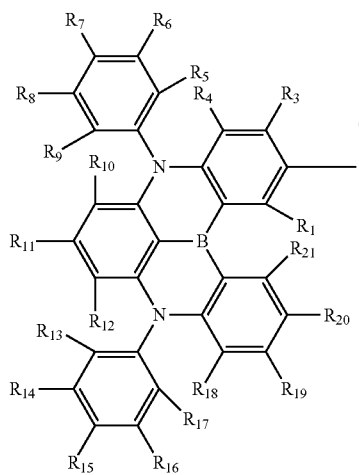
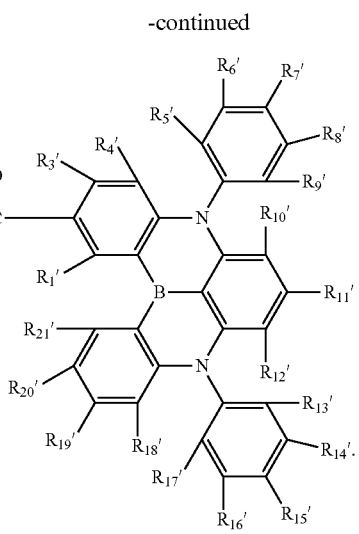

1-1O

In Formula 1-1A to Formula 1-1O, $R_1$ to $R_{22}$ and $R_1{'}$ to $R_{21}{'}$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group.

In an embodiment, Formula 1-2 may be represented by any one among the following Formula 1-2A to Formula 1-2E:

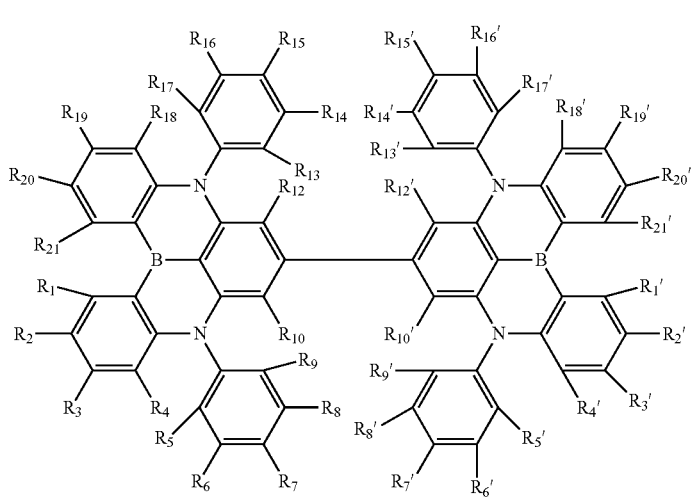

1-2A

-continued
1-2B
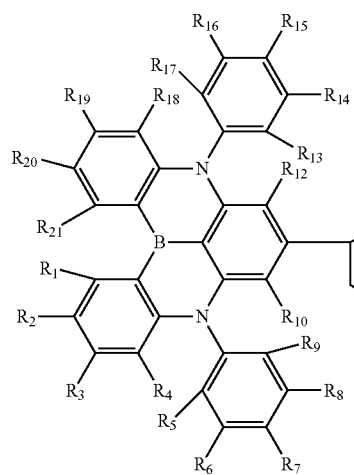
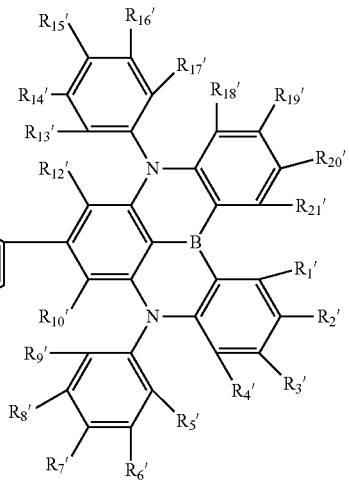
1-2C
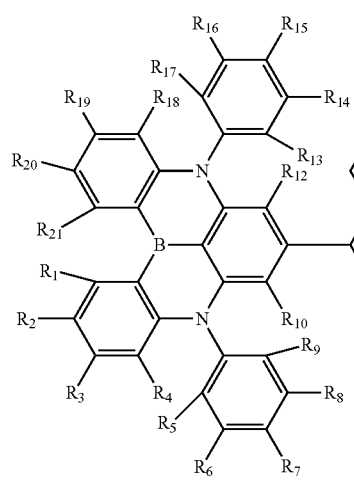
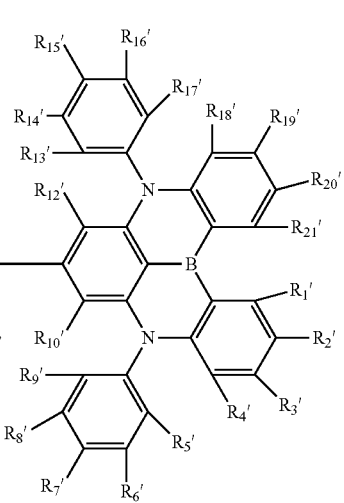
1-2D
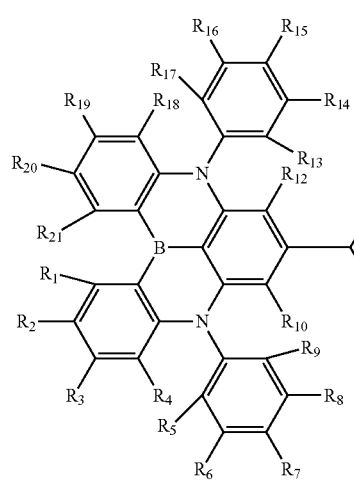
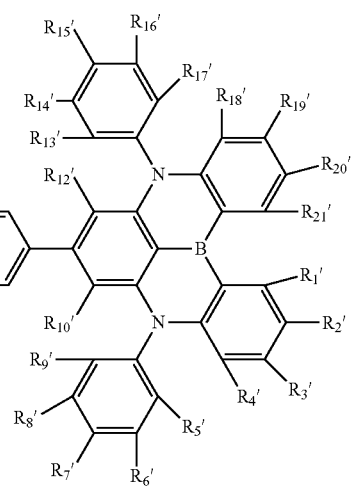

-continued

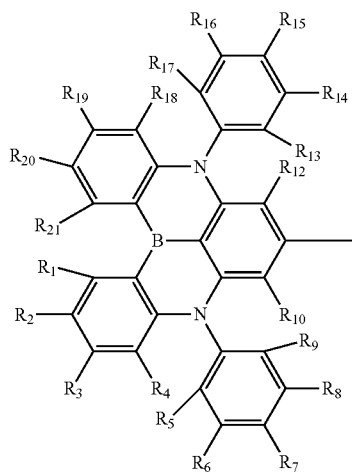

1-2E

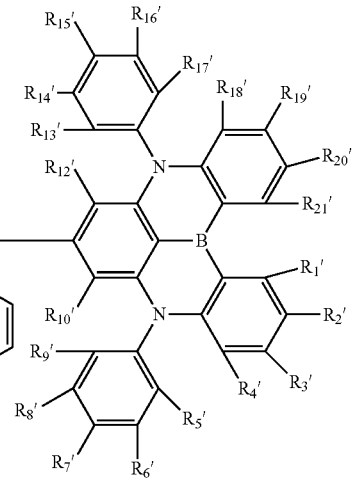

In Formula 1-2A to Formula 1-2E, $R_1$ to $R_{22}$ and $R_1'$ to $R_{21}'$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group, provided that $R_{22}$ is not a substituted or unsubstituted carbazole group.

In an embodiment, Formula 1-3 may be represented by any one among the following Formula 1-3A to Formula 1-3F:

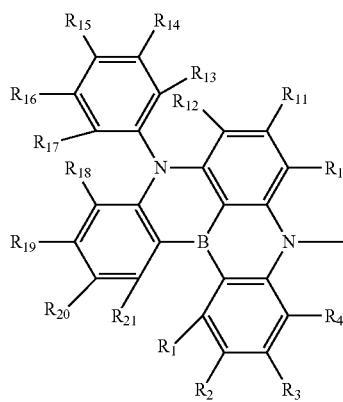

1-3A

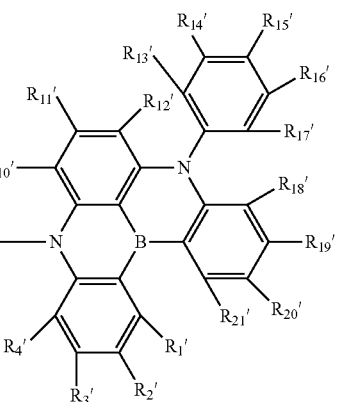

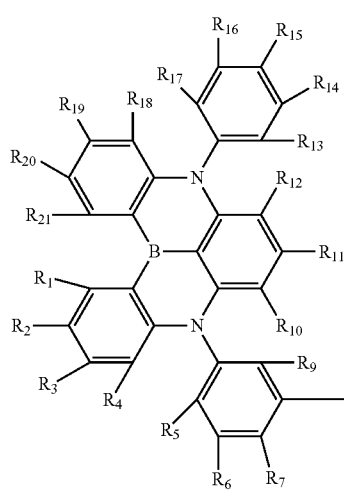

1-3B

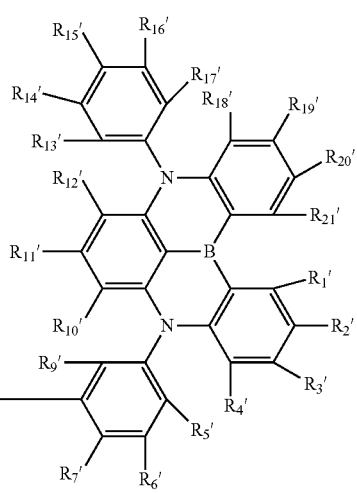

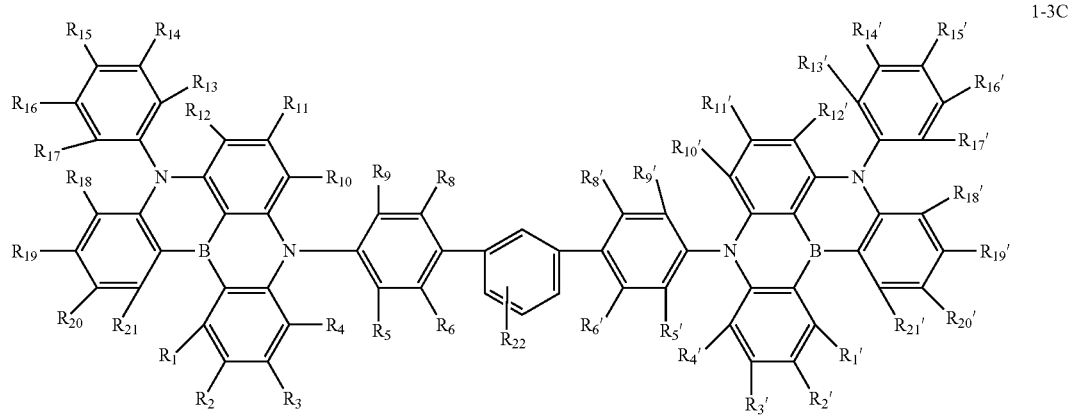
1-3C
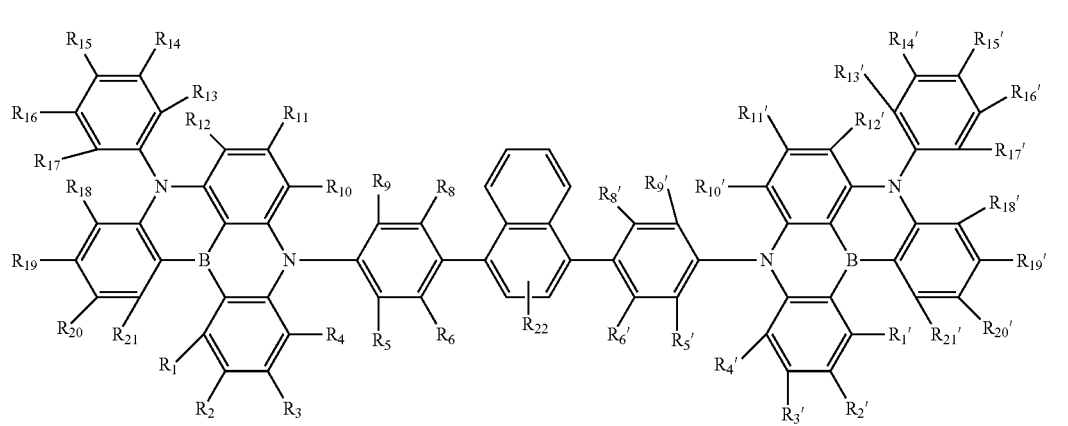
1-3D
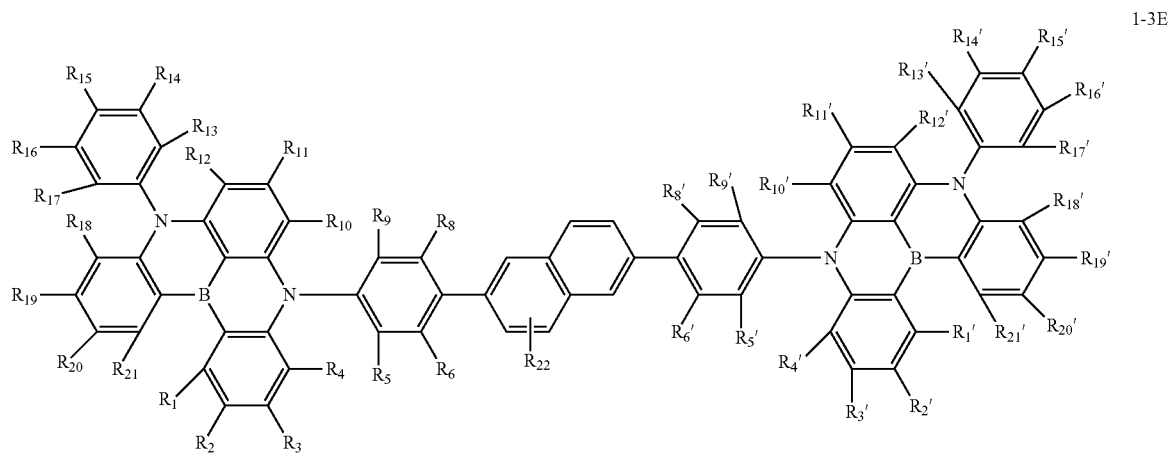
1-3E

-continued 1-3F

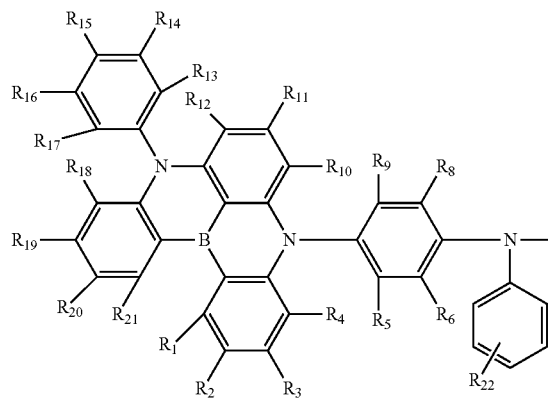
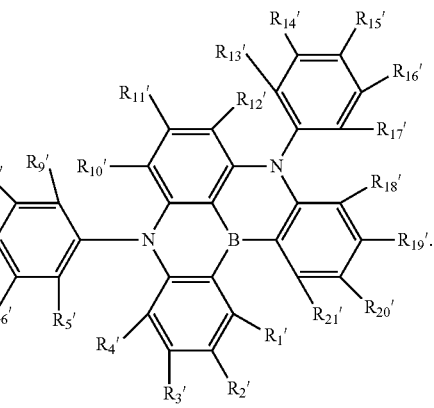

In Formula 1-3A to Formula 1-3F, $R_1$ to $R_{22}$ and $R_1'$ to $R_{21}'$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group.

In an embodiment, the polycyclic compound represented by Formula 1 may be a blue dopant emitting blue light having a center wavelength of about 470 nm or less.

In an embodiment of the present disclosure, there is provided an organic electroluminescence device including a first electrode; a second electrode on the first electrode; and an emission layer between the first electrode and the second electrode and including the polycyclic compound of an embodiment. The first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, or a compound of two or more selected from them, a mixture of two or more selected from them, or oxides thereof.

In an embodiment, the emission layer may be to emit delayed fluorescence.

In an embodiment, the emission layer may include a host and a dopant, and the dopant may include the polycyclic compound.

In an embodiment, the emission layer may emit light with a center wavelength of about 430 nm to about 470 nm.

BRIEF DESCRIPTION OF THE DRAWINGS

The accompanying drawings are included to provide a further understanding of the present disclosure and are incorporated in and constitute a part of this specification. The drawings illustrate example embodiments of the present disclosure and, together with the description, serve to explain principles of the present disclosure. In the drawings.

DETAILED DESCRIPTION

Figure 1:
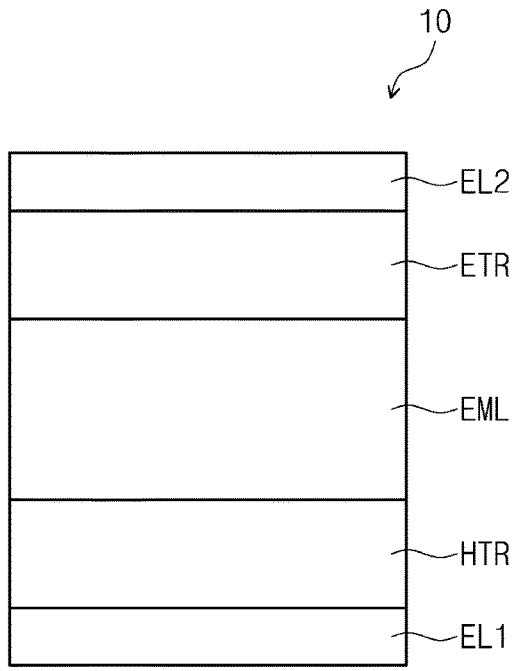
FIG. 1 is a cross-sectional view schematically illustrating an organic electroluminescence device according to an embodiment of the present disclosure.

The present disclosure may have various modifications and may be embodied in different forms, and example embodiments will be explained in more detail with reference to the accompany drawings. The present disclosure may, however, be embodied in different forms and should not be construed as limited to the embodiments set forth herein. Rather, all modifications, equivalents, and substituents which are included in the spirit and technical scope of the present disclosure should be included in the present disclosure.

It will be understood that when an element (or region, layer, part, etc.) is referred to as being "on", "connected to" or "coupled to" another element, it can be directly on, connected or coupled to the other element (without any third intervening elements present) or one or more third intervening elements may be present.

Like reference numerals refer to like elements throughout. In addition, in the drawings, the thickness, the ratio, and/or the dimensions of constituent elements are exaggerated for effective explanation of technical contents.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

It will be understood that, although the terms first, second, etc. may be used herein to describe various elements, these elements should not be limited by these terms. These terms are only used to distinguish one element from another element. Thus, a first element could be termed a second element without departing from the teachings of the present disclosure. Similarly, a second element could be termed a first element. As used herein, the singular forms are intended to include the plural forms as well, unless the context clearly indicates otherwise.

In addition, the terms "below", "beneath", "on" and "above" are used for explaining the relation of elements shown in the drawings. The terms are relative concept and are explained based on the direction shown in the drawing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will be further understood that the terms "comprises" and/or "comprising," when used in this specification, specify the presence of stated features, numerals, steps, operations, elements, parts, or the combination thereof, but do not preclude the presence or addition of one or more other features, numerals, steps, operations, elements, parts, or the combination thereof.

Hereinafter, the organic electroluminescence device according to an embodiment of the present disclosure will be explained with reference to attached drawings.

FIGS. 1 to 4 are cross-sectional views schematically showing organic electroluminescence devices according to embodiments of the present disclosure. Referring to FIGS. 1 to 4, in an organic electroluminescence device 10 according to an embodiment, a first electrode EL1 and a second electrode EL2 are oppositely positioned, and between the first electrode EL1 and the second electrode EL2, an emission layer EML may be placed.

In some embodiments, the organic electroluminescence device 10 of an embodiment further includes a plurality of functional groups (functional layers) between the first electrode EU and the second electrode EL2, in addition to the emission layer EML. The plurality of the functional groups (functional layers) may include a hole transport region HTR and an electron transport region ETR. For example, the organic electroluminescence device 10 of an embodiment may include a first electrode EL1, a hole transport region HTR, an emission layer EML, an electron transport region ETR, and a second electrode, laminated one by one. In some embodiments, the organic electroluminescence device 10 may include a capping layer CPL on the second electrode EL2.

The organic electroluminescence device 10 of an embodiment may include a polycyclic compound of an embodiment, which will be explained in more detail later, in the emission layer EML between the first electrode EL1 and the second electrode EL2. However, an embodiment of the present disclosure is not limited thereto, and the organic electroluminescence device 10 of an embodiment may include the polycyclic compound of an embodiment in the hole transport region HTR and/or the electron transport region ETR, which are a plurality of the functional groups (functional layers) between the first electrode EL1 and the second electrode EL2.

Figure 2:
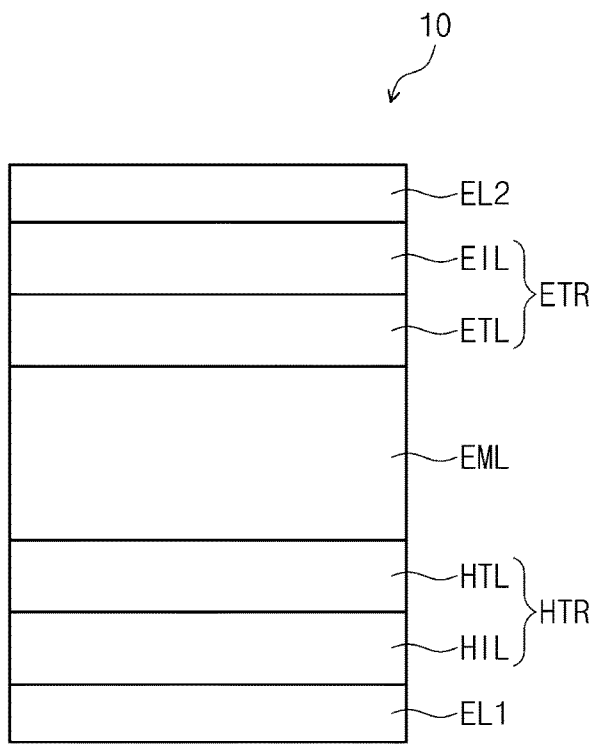
FIG. 2 is a cross-sectional view schematically illustrating an organic electroluminescence device according to an embodiment of the present disclosure.
Figure 3:
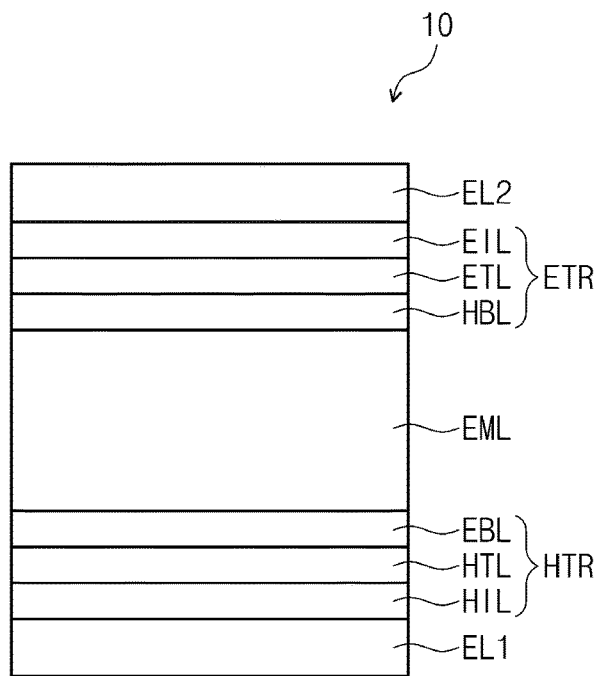
FIG. 3 is a cross-sectional view schematically illustrating an organic electroluminescence device according to an embodiment of the present disclosure.
Figure 4:
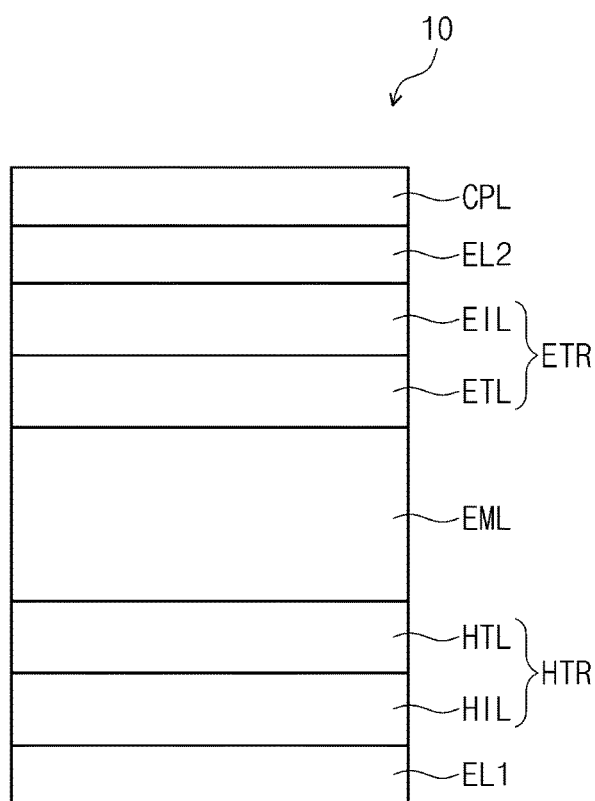
FIG. 4 is a cross-sectional view schematically illustrating an organic electroluminescence device according to an embodiment of the present disclosure.

Meanwhile, when compared with FIG. 1, FIG. 2 shows the cross-sectional view of an organic electroluminescence device 10 of an embodiment, wherein a hole transport region HTR includes a hole injection layer HIL and a hole transport layer HTL;

and an electron transport region ETR includes an electron injection layer EIL and an electron transport layer ETL. When compared with FIG. 1, FIG. 3 shows the cross-sectional view of an organic electroluminescence device 10 of an embodiment, wherein a hole transport region HTR includes a hole injection layer HIL, a hole transport layer HTL, and an electron blocking layer EBL; and an electron transport region ETR includes an electron injection layer EIL, an electron transport layer ETL, and a hole blocking layer HBL. When compared with FIG. 1, FIG. 4 shows the cross-sectional view of an organic electroluminescence device 10 of an embodiment including a capping layer CPL on the second electrode EL2.

The first electrode EL1 has conductivity. The first electrode EU may be formed using a metal alloy or a suitable conductive compound. The first electrode EL1 may be an anode. The first electrode EL1 may be a pixel electrode. The first electrode EL1 may be a transmissive electrode, a transflective electrode, or a reflective electrode. If the first electrode EL1 is the transmissive electrode, the first electrode EL1 may be formed using a transparent metal oxide such as indium tin oxide (ITO), indium zinc oxide (IZO), zinc oxide (ZnO), and/or indium tin zinc oxide (ITZO). If the first electrode EL1 is the transflective electrode or the reflective electrode, the first electrode EL1 may include Ag, Mg, Cu, Al, Pt, Pd, Au, Ni, Nd, Ir, Cr, L1, Ca, LiF/Ca, LiF/Al, Mo, Ti, a compound thereof, or a mixture thereof (for example, a mixture of Ag and Mg). Also, the first electrode EU may have a structure including a plurality of layers including a reflective layer and/or a transflective layer formed using any of the above materials, and a transmissive conductive layer formed using ITO, IZO, ZnO, and/or ITZO. For example, the first electrode EL1 may include a three-layer structure of ITO/Ag/ITO.

However, an embodiment of the present disclosure is not limited thereto. The thickness of the first electrode EU may be from about 1,000 Å to about 10,000 Å, for example, from about 1,000 Å to about 3,000 Å.

The hole transport region HTR is provided on the first electrode EL1. The hole transport region HTR may include at least one selected from a hole injection layer HIL, a hole transport layer HTL, a hole buffer layer, and an electron blocking layer EBL. The thickness of the hole transport region HTR may be from about 50 Å to about 1,500 Å.

The hole transport region HTR may have a single layer formed using a single material, a single layer formed using a plurality of different materials, or a multilayer structure including a plurality of layers formed using a plurality of different materials.

For example, the hole transport region HTR may have the structure of a single layer of a hole injection layer HIL, or a hole transport layer HTL, or may have a structure of a single layer formed using a hole injection material and a hole transport material. In some embodiments, the hole transport region HTR may have a structure of a single layer formed using a plurality of different materials, or a structure laminated from the first electrode EL1 of hole injection layer HIL/hole transport layer HTL, hole injection layer HIL/hole transport layer HTL/hole buffer layer, hole injection layer HIL/hole buffer layer, hole transport layer HTL/hole buffer layer, or hole injection layer HIL/hole transport layer HTL/ electron blocking layer EBL, without limitation.

The hole transport region HTR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

The hole injection layer HIL may include, for example, a phthalocyanine compound (such as copper phthalocyanine), N,N'-diphenyl-N,N'-bis-[4-(phenyl-m-tolyl-amino)-phenyl]-phenyl-4,4'-diamine (DNTPD), 4,4',4"-[tris(3-methylphenyl)phenylamino] triphenylamine (m-MTDATA), 4,4', 4"-tris(N,N-diphenylamino)triphenylamine (TDATA), 4,4', 4"-tris{N,-2-naphthyl)-N-phenylamino}-triphenylamine (2-TNATA), poly(3,4-ethylenedioxythiophene)/poly(4-styrenesulfonate) (PEDOT/PSS), polyaniline/dodecylbenzenesulfonic acid (PANI/DBSA), polyaniline/camphor sulfonic acid (PANI/CSA), polyaniline/poly(4-styrenesulfonate) (PANI/PSS), N,N'-di(1-naphthalene-1-yl)-N,N'-diphenyl-benzidine (NPB), triphenylamine-containing polyetherketone (TPAPEK), 4-isopropyl-4'-methyldiphenyliodonium [tetrakis(pentafluorophenyl)borate], and/or dipyrazino[2,3-f:2',3'-h]quinoxaline-2,3,6,7,10,11-hexacarbonitrile (HAT-CN).

The hole transport layer HTL may include, for example, carbazole derivatives (such as N-phenyl carbazole and/or polyvinyl carbazole), fluorene-based derivatives, N,N'-bis (3-methylphenyl)-N,N'-diphenyl-[1,1-biphenyl]-4,4'-diamine (TPD), triphenylamine-based derivatives (such as 4,4',4"-tris(N-carbazolyl)triphenylamine (TCTA)), N,N'-di (1-naphthalenyl)-N,N'-diphenyl-benzidine (NPB), 4,4'-cyclohexylidene bis[N,N-bis(4-methylphenyl)benzeneamine (TAPC), 4,4'-bis[N,N'-(3-tolyl)amino]-3,3'-dimethylbiphenyl (HMTPD), 1,3-bis(N-carbazolyl)benzene (mCP), etc.

The thickness of the hole transport region HTR may be from about 50 Å to about 10,000 Å, for example, from about 100 Å to about 5,000 Å. The thickness of the hole injection layer HIL may be, for example, from about 30 Å to about 1,000 Å, and the thickness of the hole transport layer HTL may be from about 30 Å to about 1,000 Å. For example, the thickness of the electron blocking layer EBL may be from about 10 Å to about 1,000 Å. When the thicknesses of the hole transport region HTR, the hole injection layer HIL, the hole transport layer HTL and the electron blocking layer EBL satisfy any of the above-described ranges, satisfactory (suitable) hole transport properties may be achieved without substantial increase of a driving voltage.

The hole transport region HTR may further include a charge generating material, in addition to the above-described materials, to increase conductivity. The charge generating material may be dispersed uniformly or non-uniformly in the hole transport region HTR. The charge generating material may be, for example, a p-dopant. The p-dopant may be one selected from quinone derivatives, metal oxides, and cyano group-containing compounds, without limitation. Non-limiting examples of the p-dopant may include quinone derivatives (such as tetracyanoquinodimethane (TCNQ) and/or 2,3,5,6-tetrafluoro-7,7',8,8'-tetracyanoquinodimethane (F4-TCNQ)), and metal oxides (such as tungsten oxide and/or molybdenum oxide), without limitation.

As described above, the hole transport region HTR may further include at least one selected from a hole buffer layer and an electron blocking layer EBL, in addition to the hole injection layer HIL and the hole transport layer HTL. The hole buffer layer may compensate an optical resonance distance according to the wavelength of light emitted from an emission layer EML and may increase light emission efficiency. Materials which may be included in a hole transport region HTR may be used as materials included in a hole buffer layer. The electron blocking layer EBL is a layer playing the role of preventing or reducing the electron injection from the electron transport region ETR to the hole transport region HTR.

The emission layer EML is provided on the hole transport region HTR. The emission layer EML may have a thickness of, for example, about 100 Å to about 1,000 Å or about 100 Å to about 300 Å. The emission layer EML may have a single layer formed using a single material, a single layer formed using a plurality of different materials, or a multi-layer structure having a plurality of layers formed using a plurality of different materials.

In the organic electroluminescence device 10 of an embodiment, the emission layer EML may include the polycyclic compound of an embodiment.

In the present description, the term "substituted or unsubstituted" corresponds to group that is unsubstituted or that is substituted with at least one substituent selected from the group consisting of a deuterium atom, a halogen atom, a cyano group, a nitro group, an amino group, a silyl group, an oxy group, a thio group, a sulfinyl group, a sulfonyl group, a carbonyl group, a boron group, a phosphine oxide group, a phosphine sulfide group, an alkyl group, an alkenyl group, an alkoxy group, a hydrocarbon ring group, an aryl group, and a heterocyclic group (e.g., heterocycle). In addition, each of the exemplified substituents itself may be substituted or unsubstituted. For example, a biphenyl group may be interpreted as an aryl group or a phenyl group substituted with a phenyl group.

In the description, the term "forming a ring via the combination with an adjacent group" may refer to forming a substituted or unsubstituted hydrocarbon ring, or a substituted or unsubstituted heterocycle via the combination of one group with an adjacent group. The hydrocarbon ring includes an aliphatic hydrocarbon ring and an aromatic hydrocarbon ring. The heterocycle includes an aliphatic heterocycle and an aromatic heterocycle. The ring formed by the combination with an adjacent group may be a monocyclic ring or a polycyclic ring. In some embodiments, the ring formed via the combination with an adjacent group may be combined with another ring to form a spiro structure.

In the description, the term "adjacent group" may refer to a pair of substituent groups where the first substituent is connected to an atom which is directly connected to another atom substituted with the second substituent; a pair of substituent groups connected to the same atom; or a pair of substituent groups where the first substituent is sterically positioned at the nearest position to the second substituent. For example, in 1,2-dimethylbenzene, two methyl groups may be interpreted as "adjacent groups" to each other, and in 1,1-diethylcyclopentene, two ethyl groups may be interpreted as "adjacent groups" to each other.

In the description, the halogen atom may be a fluorine atom, a chlorine atom, a bromine atom and/or an iodine atom.

In the description, the alkyl may be a linear, branched or a cyclic alkyl group. The carbon number of the alkyl may be 1 to 50, 1 to 30, 1 to 20, 1 to 10, or 1 to 6. Examples of the alkyl may include methyl, ethyl, n-propyl, isopropyl, n-butyl, s-butyl, t-butyl, i-butyl, 2-ethylbutyl, 3,3-dimethylbutyl, n-pentyl, i-pentyl, neopentyl, t-pentyl, cyclopentyl, 1-methylpentyl, 3-methylpentyl, 2-ethylpentyl, 4-methyl-2-pentyl, n-hexyl, 1-methylhexyl, 2-ethylhexyl, 2-butylhexyl, cyclohexyl, 4-methylcyclohexyl, 4-t-butylcyclohexyl, n-heptyl, 1-methylheptyl, 2,2-dimethylheptyl, 2-ethylheptyl, 2-butylheptyl, n-octyl, t-octyl, 2-ethyloctyl, 2-butyloctyl, 2-hexyloctyl, 3,7-dimethyloctyl, cyclooctyl, n-nonyl, n-decyl, adamantyl, 2-ethyldecyl, 2-butyldecyl, 2-hexyldecyl, 2-octyldecyl, n-undecyl, n-dodecyl, 2-ethyldodecyl, 2-butyldodecyl, 2-hexyldocecyl, 2-octyldodecyl, n-tridecyl, n-tetradecyl, n-pentadecyl, n-hexadecyl, 2-ethylhexadecyl, 2-butylhexadecyl, 2-hexylhexadecyl, 2-octylhexadecyl, n-heptadecyl, n-octadecyl, n-nonadecyl, n-eicosyl, 2-ethyleicosyl, 2-butyleicosyl, 2-hexyleicosyl, 2-octyleicosyl, n-heneicosyl, n-docosyl, n-tricosyl, n-tetracosyl, n-pentacosyl, n-hexacosyl, n-heptacosyl, n-octacosyl, n-nonacosyl, n-triacontyl, etc., without limitation.

In the description, the hydrocarbon ring may refer to an aliphatic hydrocarbon ring or an aromatic hydrocarbon ring of 5 to 60, 5 to 30, or 5 to 20 carbon atoms for forming a ring. The hydrocarbon ring may be a functional group or a substituent, which is derived from an aliphatic hydrocarbon ring, or a functional group or a substituent derived from an aromatic hydrocarbon ring. The carbon number of the hydrocarbon ring for forming a ring may be 5 to 60, 5 to 30, or 5 to 20.

In the description, the aryl group may refer to a functional group or a substituent derived from an aromatic hydrocarbon ring. The aryl group may be a monocyclic aryl group or a polycyclic aryl group. The carbon number for forming a ring in the aryl group may be 6 to 30, 6 to 20, or 6 to 15. Examples of the aryl group may include phenyl, naphthyl, fluorenyl, anthracenyl, phenanthryl, biphenyl, terphenyl, quaterphenyl, quinquephenyl, sexiphenyl, triphenylenyl, pyrenyl, benzofluoranthenyl, chrysenyl, etc., without limitation.

In the description, the heterocyclic group (heterocycle) may refer to a functional group or a substituent derived from a ring including one or more heteroatoms selected from B, O, N, P, Si and S. The heterocyclic group includes an aliphatic heterocyclic group and an aromatic heterocyclic group. The aromatic heterocyclic group may be a heteroaryl group. The aliphatic heterocycle and the aromatic heterocycle may each independently be a monocycle or polycycle.

In the description, the heterocycle may include one or more selected from B, O, N, P, Si and S as heteroatoms. If the heterocycle includes two or more heteroatoms, two or more heteroatoms may be the same or different. The heterocycle may be monocyclic heterocycle or polycyclic heterocycle, and has a concept including heteroaryl. The carbon number for forming a ring of the heterocycle (e.g., heteroaryl) may be 2 to 30, 2 to 20, or 2 to 10.

In the description, the aliphatic heterocyclic group may include one or more selected B, O, N, P, Si and S as heteroatoms. The carbon number for forming a ring of the aliphatic heterocyclic group may be 2 to 30, 2 to 20, or 2 to 10. Examples of the aliphatic heterocyclic group may include an oxirane group, a thiirane group, a pyrrolidine group, a piperidine group, a tetrahydrofuran group, a tetrahydrothiophene group, a thiane group, a tetrahydropyrane group, a 1,4-dioxane group, etc., without limitation.

In the description, the heteroaryl group may include one or more among B, O, N, P, Si and S as heteroatoms. If the heteroaryl group includes two or more heteroatoms, two or more heteroatoms may be the same or different. The heteroaryl group may be a monocyclic heteroaryl group or polycyclic heteroaryl group. The carbon number for forming a ring of the heteroaryl group may be 2 to 30, 2 to 20, or 2 to 10. Examples of the heteroaryl group may include thiophene, furan, pyrrole, imidazole, triazole, pyridine, bipyridine, pyrimidine, triazine, triazole, acridine, pyridazine, pyrazine, quinoline, quinazoline, quinoxaline, phenoxazine, phthalazine, pyrido pyrimidine, pyrido pyrazine, pyrazino pyrazine, isoquinoline, indole, carbazole, N-arylcarbazole, N-heteroarylcarbazole, N-alkylcarbazole, benzoxazole, benzoimidazole, benzothiazole, benzocarbazole, benzothiophene, dibenzothiophene, thienothiophene, benzofurane, phenanthroline, thiazole, isooxazole, oxazole, oxadiazole, thiadiazole, phenothiazine, dibenzosilole, dibenzofuran, etc., without limitation.

In the description, the thio group may include an alkyl thio group and an aryl thio group.

In the description, the oxy group may include an alkoxy group and an aryl oxy group. The alkoxy group may be a linear, branched or cyclic chain. The carbon number of the alkoxy group is not specifically limited but may be, for example, 1 to 20 or 1 to 10. Examples of the oxy group may include methoxy, ethoxy, n-propoxy, isopropoxy, butoxy, pentyloxy, hexyloxy, octyloxy, nonyloxy, decyloxy, benzyloxy, etc. However, an embodiment of the present disclosure is not limited thereto.

In the description, the direct linkage may refer to a single bond.

Meanwhile, in the description, "⎯⎯*" refers to a connected position.

In the description, "atoms for forming a ring" may refer to ring-forming atoms.

The emission layer EML of the organic electroluminescence device 10 of an embodiment may include a polycyclic compound of an embodiment represented by the following Formula 1:

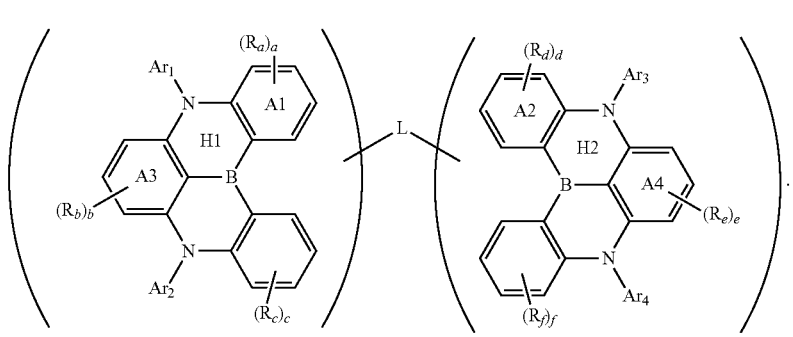

Formula 1

In Formula 1, $Ar_1$ to $Ar_4$ may be substituted or unsubstituted aryl groups of 6 to 30 carbon atoms for forming a ring. In Formula 1, $R_a$ to $R_f$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. In Formula 1, "a", "c", "d", and "f" may each independently be an integer of 0 to 4, and "b" and "e" may each independently be an integer of 0 to 3.

The polycyclic compound of an embodiment, represented by Formula 1 may have a combined structure of two polycyclic aromatic groups linked to each other through a linker L. In an embodiment, the polycyclic aromatic group may include a core moiety represented by the following Formula 1A:

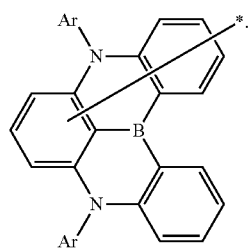

Formula 1A

The two polycyclic aromatic groups combined through L may be symmetric with respect to L. L may be connected with any one of the three rings constituting an azaborine moiety (as shown by "———*" in Formula 1A) in the core moiety of the polycyclic aromatic group which may be represented by Formula 1A.

In Formula 1, in embodiments where "a" to "f" are each an integer of 2 or more, a plurality of $R_a$ to $R_f$ may be the same or at least one thereof may be different from the remainder.

In the polycyclic compound of an embodiment, represented by Formula 1, in embodiments where ring A1 and ring A2 are connected via L, L may be O, S, $BR_p$, $NR_q$, $(P=O)R_s$, $(P=S)R_t$, (C=O), a substituted or unsubstituted arylene group of 6 to 30 carbon atoms for forming a ring, or a substituted or unsubstituted heteroarylene group of 2 to 30 carbon atoms for forming a ring.

In Formula 1, in embodiments where ring A3 and ring A4 are connected via L, L may be a direct linkage, O, S, $BR_p$, $NR_q$, $(P=O)R_s$, $(P=S)R_t$, (C=O), a substituted or unsubstituted arylene group of 6 to 30 carbon atoms for forming a ring, or a substituted or unsubstituted heteroarylene group of 2 to 30 carbon atoms for forming a ring. Meanwhile, in embodiments where ring A3 and ring A4 are connected via L, a case where L is a phenylene group which is substituted with a substituted or unsubstituted carbazole group is excluded.

In Formula 1, in embodiments where ring H1 and ring H2 are connected via L, L interconnects $Ar_1$ and $Ar_3$, and L may be a direct linkage, O, S, $BR_p$, $NR_q$, $(P=O)R_s$, $(P=S)R_t$, (C=O), a substituted or unsubstituted arylene group of 6 to 30 carbon atoms for forming a ring, or a substituted or unsubstituted heteroarylene group of 2 to 30 carbon atoms for forming a ring.

In embodiments where L is $BR_p$, $NR_q$, $(P=O)R_s$ or $(P=S)R_t$, $R_p$, $R_q$, $R_s$, and $R_t$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group.

In the polycyclic compound of an embodiment, represented by Formula 1, $Ar_1$ to $Ar_4$ may each independently be a substituted or unsubstituted benzene ring (e.g., a substituted or unsubstituted phenyl group). In the substituted benzene ring (phenyl group), a benzene ring may be substituted with at least one selected from a deuterium atom, a halogen atom, a substituted or unsubstituted alkyl group of 1 to 10 carbon atoms, and a substituted or unsubstituted aryl group of 6 to 30 carbon atoms for forming a ring.

In Formula 1, L may be a direct linkage or may be represented by any one selected from Formulae L1 to L9. The direct linkage may be a single bond. In Formula 1, in embodiments where ring A1 and ring A2 are connected via L, L may be represented by any one selected from Formulae L1 to L9, while excluding a case where L is the direct linkage. In the polycyclic compound represented by Formula 1, in embodiments where ring A3 and ring A4 are connected via L, or in embodiments where ring H1 and ring H2 are connected via L, L may be a direct linkage or may be represented by any one selected from Formulae L1 to L9 below.

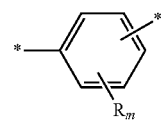

L1

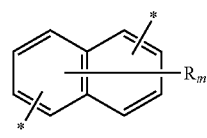

L2

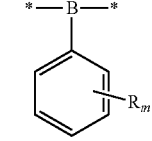

L3

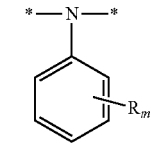

L4

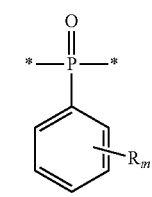

L5

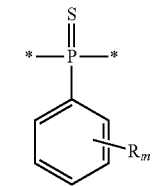

L6

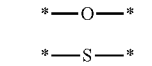

L7

L8

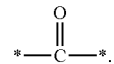

L9

In Formulae L1 to L9, $R_m$ may be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. If L is represented by Formula L1, a case where $R_m$ is a substituted or unsubstituted carbazole group may be excluded.

Formula 1 may be represented by the following Formula 2:

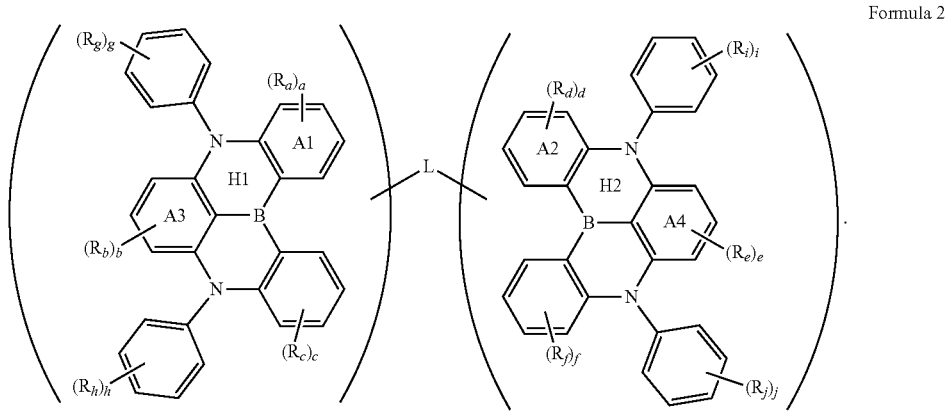

Formula 2

In Formula 2, $R_g$, $R_h$, $R_i$, and $R_j$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group, and "g", "h", "i", and "j" may each independently be an integer of 0 to 5.

In Formula 2, in embodiments where "g" and "j" are each an integer of 2 or more, a plurality of $R_g$ to $R_j$ may be each the same or at least one thereof may be different from the remainder.

In Formula 2, the same explanations (descriptions) for L, $R_a$ to $R_f$, and "a" to "f" as those provided in connection with Formula 1 may be applied.

Formula 1 may be represented by any one among the following Formula 1-1 to Formula 1-3:

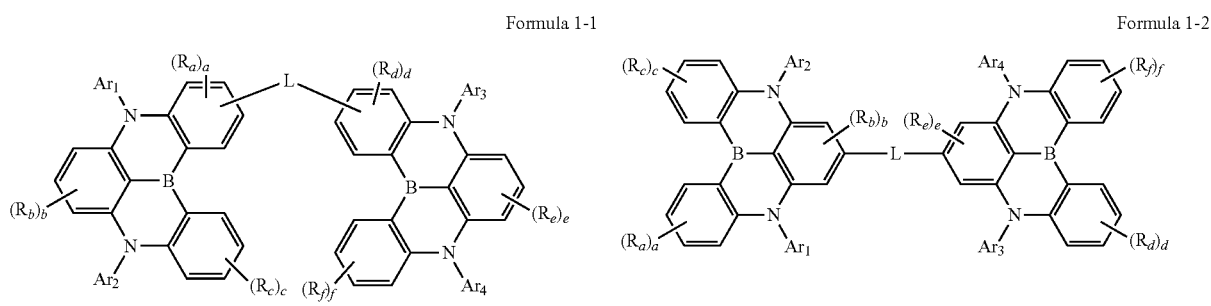

Formula 1-1

Formula 1-2

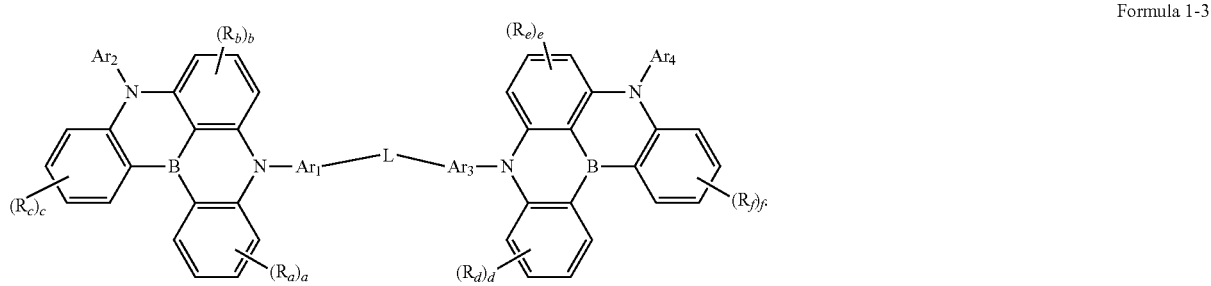

Formula 1-3

In Formula 1-1 to Formula 1-3, the same explanations (descriptions) for $Ar_1$ to $Ar_4$, $R_a$ to $R_f$, "a" to "f", and L as those provided in connection with Formula 1 may be applied.
The polycyclic compound of an embodiment, represented by Formula 1-1 may be represented by any one selected from the following Formula 1-1A to Formula 1-1O:
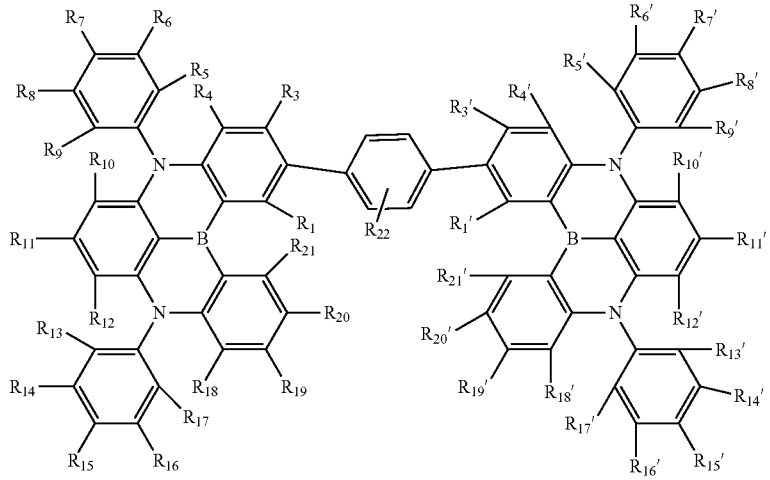
1-1A
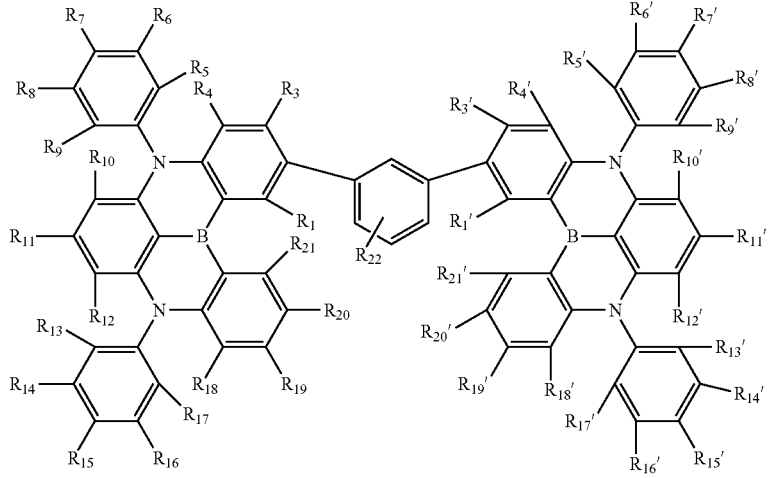
1-1B
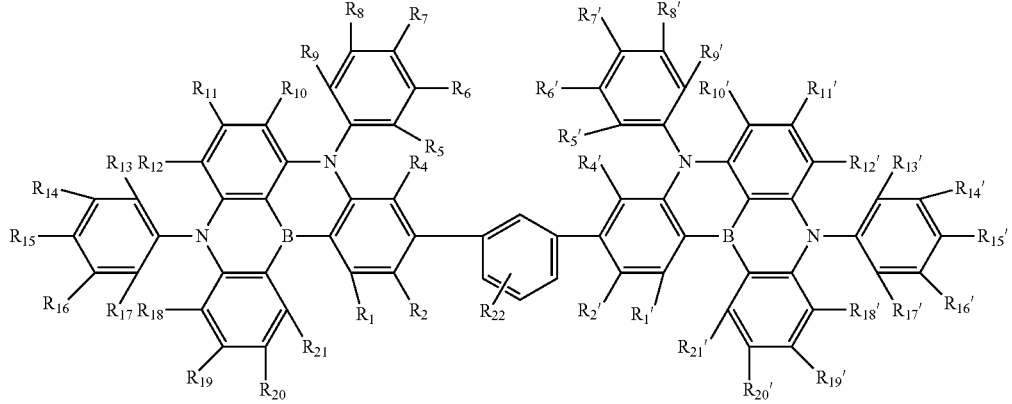
1-1C -continued
1-1D
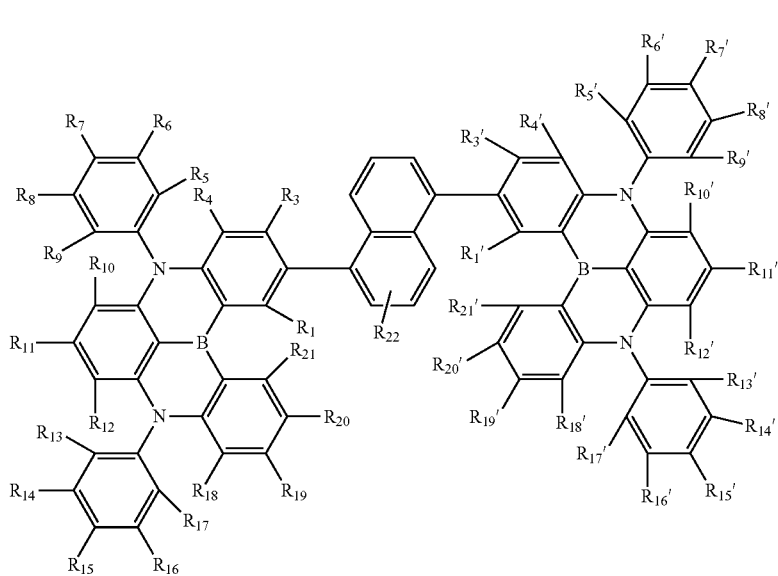
1-1E
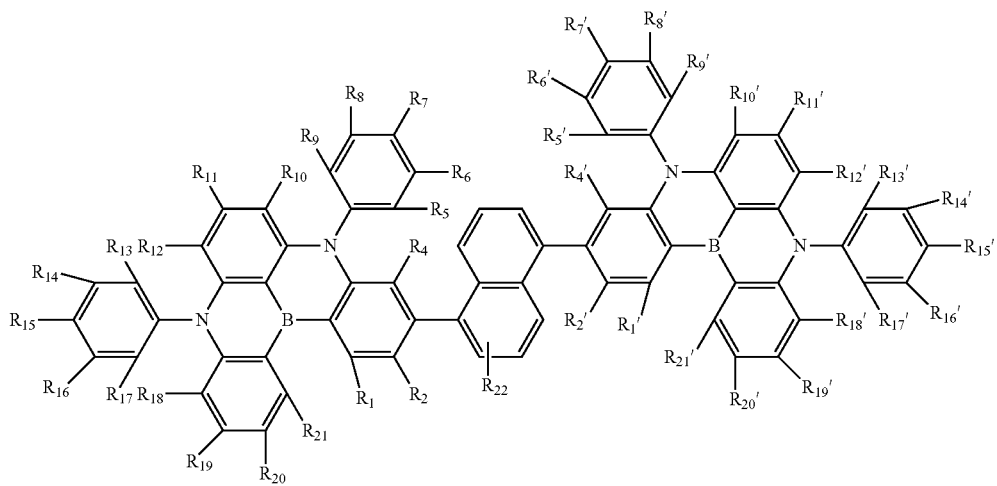
1-1F
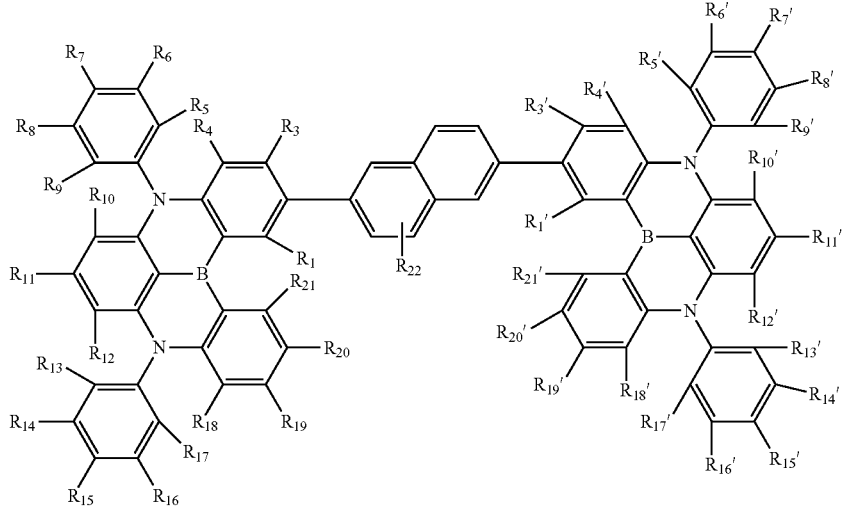

-continued
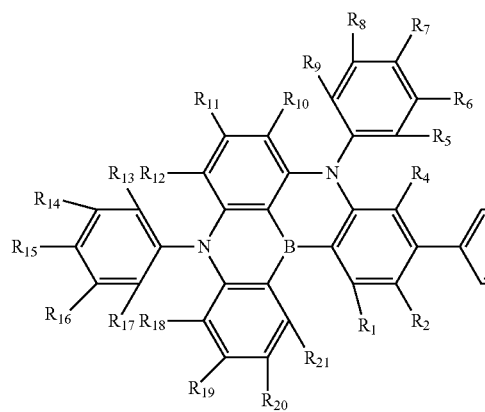
1-1G
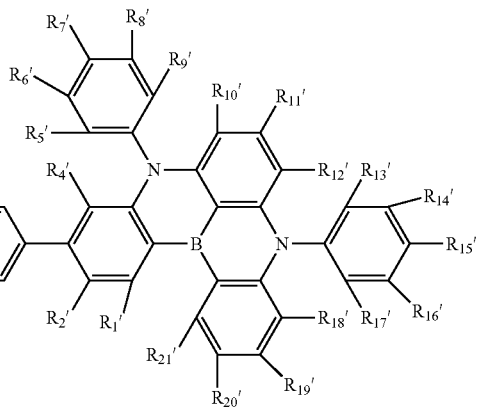
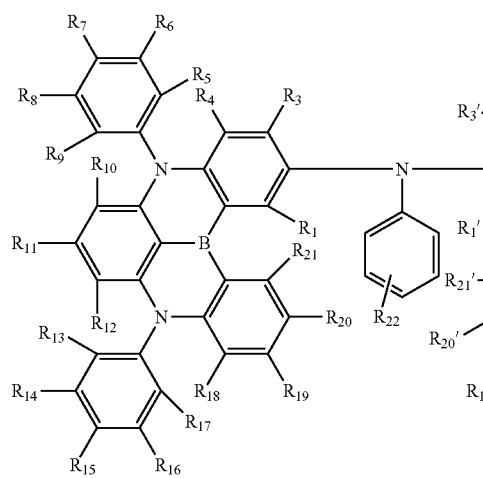
1-1H
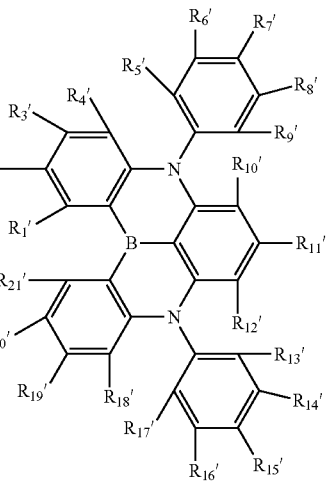
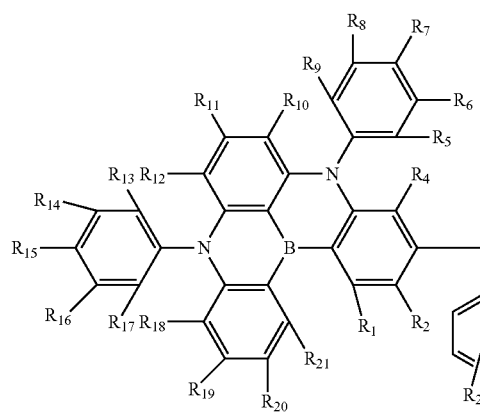
1-1I
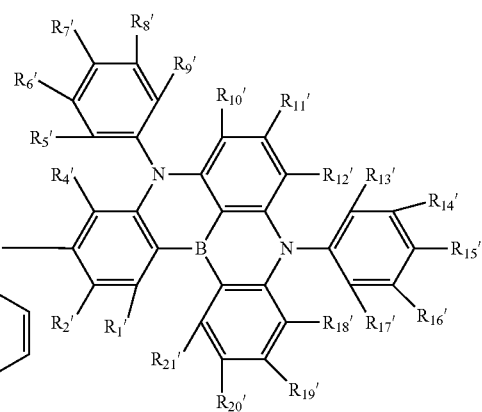

1-1J
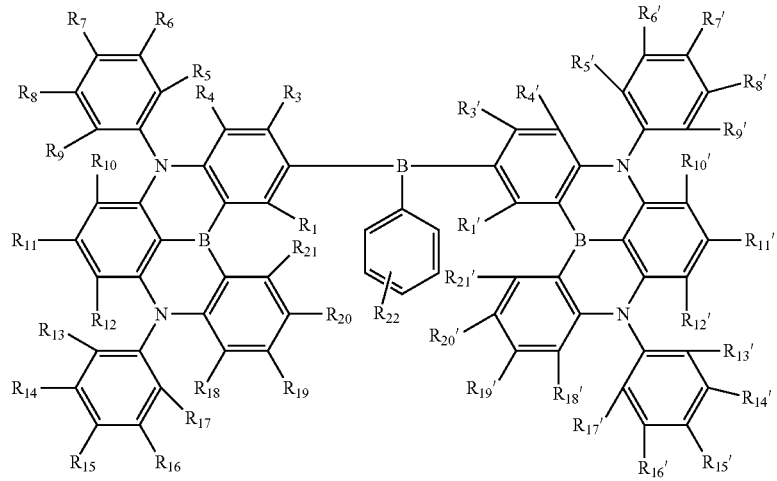
1-1K
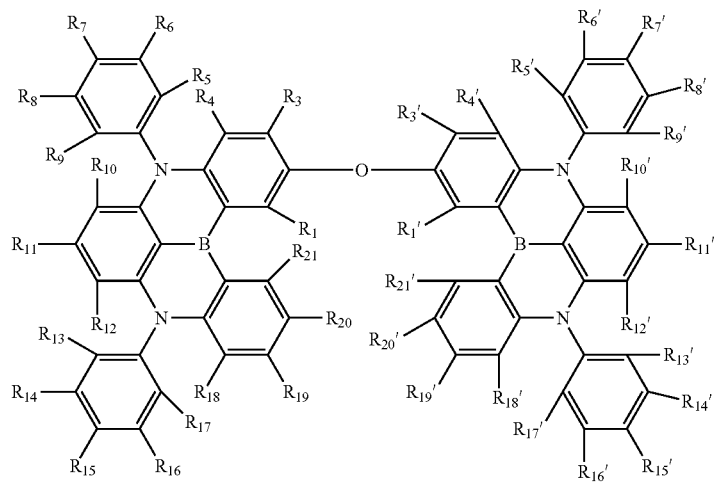
1-1L
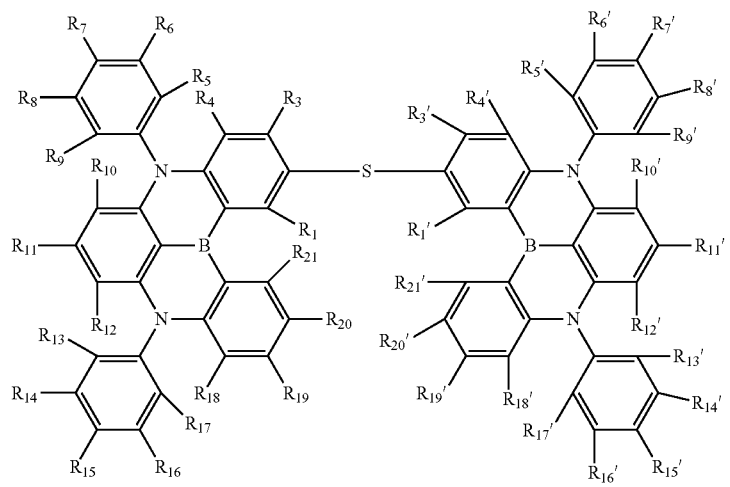

-continued
1-1M
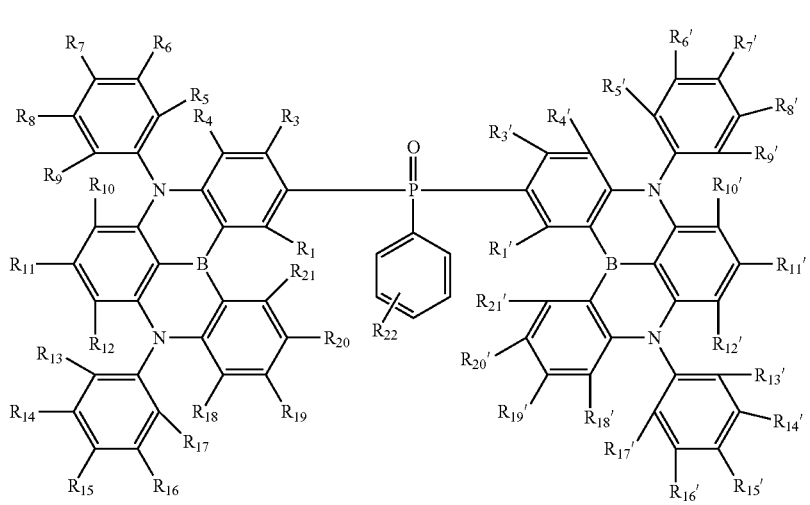
1-1N
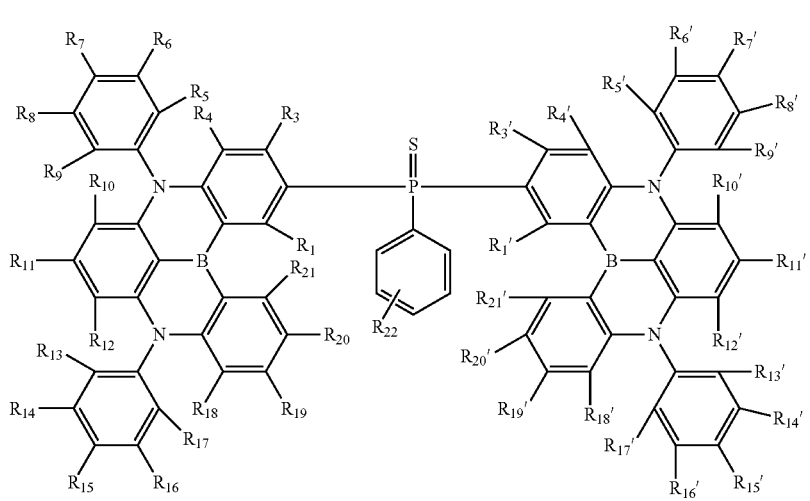
1-1O
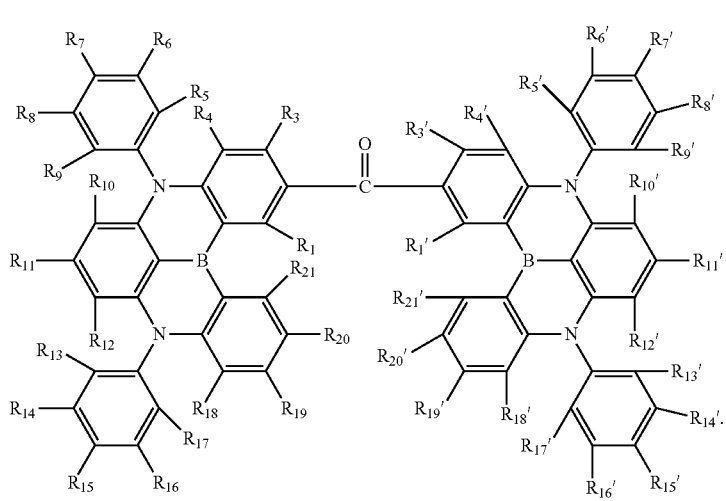

In Formula 1-1A to Formula 1-1O, $R_1$ to $R_{22}$ and $R_1'$ to $R_{21}'$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. For example, $R_1$ to $R_{22}$ and $R_1'$ to $R_{21}'$ may each independently be a hydrogen atom, a methyl group, an isopropyl group, a t-butyl group, a phenyl group, etc., but an embodiment of the present disclosure is not limited thereto.

Formula 1-1A may be represented by Formula 1-1A' below.

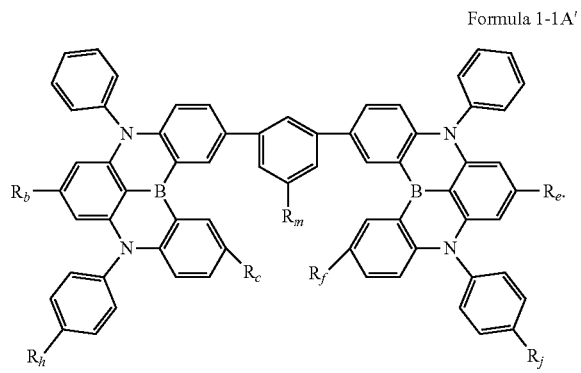

Formula 1-1A'

The polycyclic compound represented by Formula 1-1A' may be represented by Compound 1-1A-1 to Compound 1-1A-9 according to the combination of substituents as shown in Table 1 below. In Table 1, H represents a hydrogen atom, Me represents a methyl group, iPr represents an isopropyl group, tBu represents a t-butyl group, and Ph represents a phenyl group.

TABLE 1

| Compound number | $R_b$ | $R_c$ | $R_h$ | $R_m$ | $R_e$ | $R_f$ | $R_j$ |
|---|---|---|---|---|---|---|---|
| 1-1A-1 | H | H | H | H | H | H | H |
| 1-1A-2 | H | Me | Me | H | H | Me | Me |
| 1-1A-3 | H | iPr | iPr | H | H | iPr | iPr |
| 1-1A-4 | H | tBu | tBu | H | H | tBu | tBu |
| 1-1A-5 | H | Ph | Ph | H | H | Ph | Ph |
| 1-1A-6 | Me | Me | Me | H | Me | Me | Me |
| 1-1A-7 | Me | iPr | iPr | H | Me | iPr | iPr |
| 1-1A-8 | Me | tBu | tBu | H | Me | tBu | tBu |
| 1-1A-9 | Me | Ph | Ph | H | Me | Ph | Ph |

Formula 1-1B may be represented by Formula 1-1B' below.

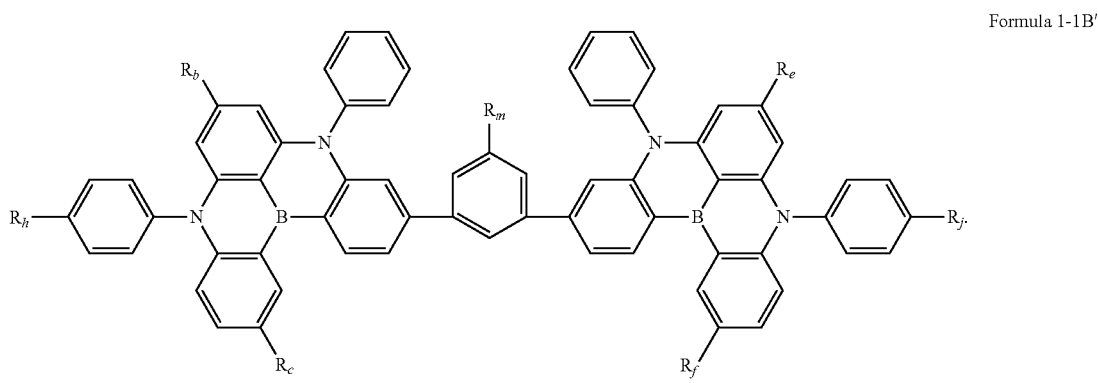

Formula 1-1B'

The polycyclic compound represented by Formula 1-1B' may be represented by Compound 1-1B-1 to Compound 1-1B-9 according to the combination of substituents as shown in Table 2 below. In Table 2, H represents a hydrogen atom, Me represents a methyl group, iPr represents an isopropyl group, tBu represents a t-butyl group, and Ph represents a phenyl group.

TABLE 2

| Compound number | $R_b$ | $R_c$ | $R_h$ | $R_m$ | $R_e$ | $R_f$ | $R_j$ |
|---|---|---|---|---|---|---|---|
| 1-1B-1 | H | H | H | H | H | H | H |
| 1-1B-2 | H | Me | Me | H | H | Me | Me |
| 1-1B-3 | H | iPr | iPr | H | H | iPr | iPr |
| 1-1B-4 | H | tBu | tBu | H | H | tBu | tBu |
| 1-1B-5 | H | Ph | Ph | H | H | Ph | Ph |
| 1-1B-6 | Me | Me | Me | H | Me | Me | Me |
| 1-1B-7 | Me | iPr | iPr | H | Me | iPr | iPr |
| 1-1B-8 | Me | tBu | tBu | H | Me | tBu | tBu |
| 1-1B-9 | Me | Ph | Ph | H | Me | Ph | Ph |

Formula 1-1C may be represented by Formula 1-1C' below.

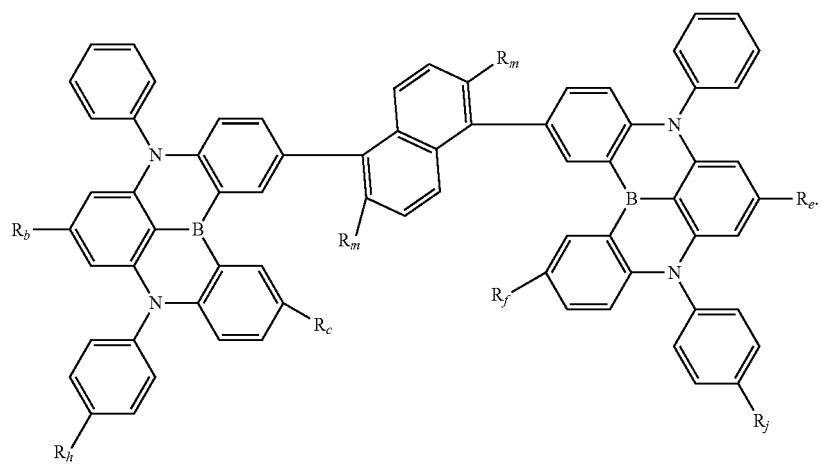

Formula 1-1C'

The polycyclic compound represented by Formula 1-1C' may be represented by Compound 1-1C-1 to Compound 1-1C-10 according to the combination of substituents as shown in Table 3 below. In Table 3, H represents a hydrogen atom, Me represents a methyl group, iPr represents an isopropyl group, tBu represents a t-butyl group, and Ph represents a phenyl group.

TABLE 3

| Compound number | $R_b$ | $R_c$ | $R_h$ | $R_m$ | $R_e$ | $R_f$ | $R_j$ |
|---|---|---|---|---|---|---|---|
| 1-1C-1 | H | H | H | H | H | H | H |
| 1-1C-2 | H | Me | Me | H | H | Me | Me |
| 1-1C-3 | H | H | H | Me | H | H | H |
| 1-1C-4 | H | iPr | iPr | H | H | iPr | iPr |
| 1-1C-5 | H | tBu | tBu | H | H | tBu | tBu |
| 1-1C-6 | H | Ph | Ph | H | H | Ph | Ph |
| 1-1C-7 | Me | Me | Me | H | Me | Me | Me |
| 1-1C-8 | Me | iPr | iPr | H | Me | iPr | iPr |
| 1-1C-9 | Me | tBu | tBu | H | Me | tBu | tBu |
| 1-1C-10 | Me | Ph | Ph | H | Me | Ph | Ph |

Formula 1-1D may be represented by Formula 1-1D' below.

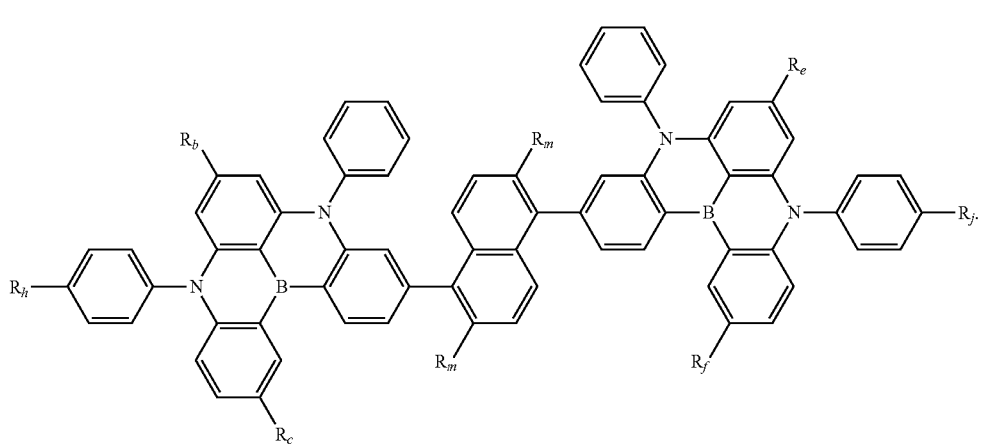

Formula 1-1D'

The polycyclic compound represented by Formula 1-1D' may be represented by Compound 1-1D-1 to Compound 1-1D-10 according to the combination of substituents as shown in Table 4 below. In Table 4, H represents a hydrogen atom, Me represents a methyl group, iPr represents an isopropyl group, tBu represents a t-butyl group, and Ph represents a phenyl group.

TABLE 4

| Compound number | $R_b$ | $R_c$ | $R_h$ | $R_m$ | $R_e$ | $R_f$ | $R_j$ |
| --- | --- | --- | --- | --- | --- | --- | --- |
| 1-1D-1 | H | H | H | H | H | H | H |
| 1-1D-2 | H | Me | Me | H | H | Me | Me |
| 1-1D-3 | H | H | H | Me | H | H | H |
| 1-1D-4 | H | iPr | iPr | H | H | iPr | iPr |
| 1-1D-5 | H | tBu | tBu | H | H | tBu | tBu |
| 1-1D-6 | H | Ph | Ph | H | H | Ph | Ph |
| 1-1D-7 | Me | Me | Me | H | Me | Me | Me |
| 1-1D-8 | Me | iPr | iPr | H | Me | iPr | iPr |
| 1-1D-9 | Me | tBu | tBu | H | Me | tBu | tBu |
| 1-1D-10 | Me | Ph | Ph | H | Me | Ph | Ph |

Formula 1-1E may be represented by Formula 1-1E' below.

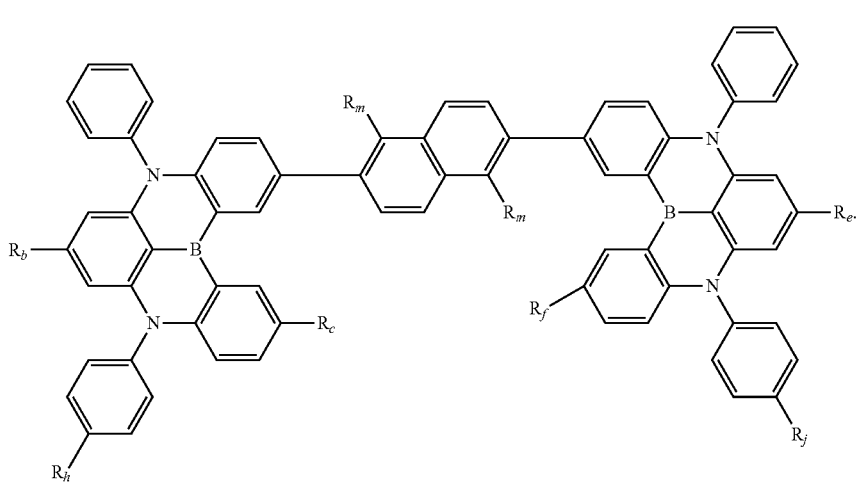

Formula 1-1E'

The polycyclic compound represented by Formula 1-1E' may be represented by Compound 1-1E-1 to Compound 1-1E-10 according to the combination of substituents as shown in Table 5 below. In Table 5, H represents a hydrogen atom, Me represents a methyl group, iPr represents an isopropyl group, tBu represents a t-butyl group, and Ph represents a phenyl group.

TABLE 5

| Compound number | $R_b$ | $R_c$ | $R_h$ | $R_m$ | $R_e$ | $R_f$ | $R_j$ |
| --- | --- | --- | --- | --- | --- | --- | --- |
| 1-1E-1 | H | H | H | H | H | H | H |
| 1-1E-2 | H | Me | Me | H | H | Me | Me |
| 1-1E-3 | H | H | H | Me | H | H | H |
| 1-1E-4 | H | iPr | iPr | H | H | iPr | iPr |
| 1-1E-5 | H | tBu | tBu | H | H | tBu | tBu |
| 1-1E-6 | H | Ph | Ph | H | H | Ph | Ph |
| 1-1E-7 | Me | Me | Me | H | Me | Me | Me |

TABLE 5-continued

| Compound number | $R_b$ | $R_c$ | $R_h$ | $R_m$ | $R_e$ | $R_f$ | $R_j$ |
|---|---|---|---|---|---|---|---|
| 1-1E-8 | Me | iPr | iPr | H | Me | iPr | iPr |
| 1-1E-9 | Me | tBu | tBu | H | Me | tBu | tBu |
| 1-1E-10 | Me | Ph | Ph | H | Me | Ph | Ph |

Formula 1-1F may be represented by Formula 1-1F' below.

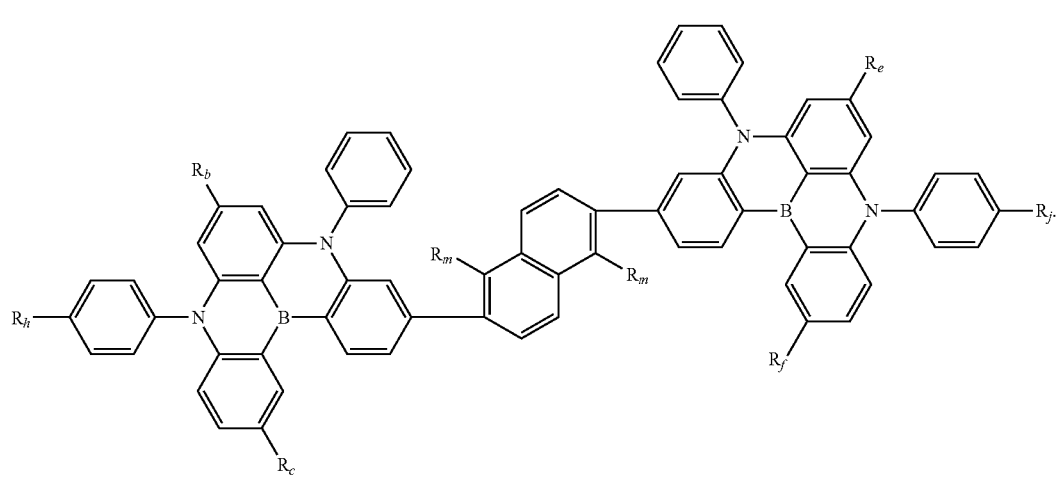

Formula 1-1F'

The polycyclic compound represented by Formula 1-1F' may be represented by Compound 1-1F-1 to Compound 1-1F-9 according to the combination of substituents as shown in Table 6 below. In Table 6, H represents a hydrogen atom, Me represents a methyl group, iPr represents an isopropyl group, tBu represents a t-butyl group, and Ph represents a phenyl group.

TABLE 6

| Compound number | $R_b$ | $R_c$ | $R_h$ | $R_m$ | $R_e$ | $R_f$ | $R_j$ |
|---|---|---|---|---|---|---|---|
| 1-1F-1 | H | H | H | H | H | H | H |
| 1-1F-2 | H | Me | Me | H | H | Me | Me |
| 1-1F-3 | H | H | H | Me | H | H | H |
| 1-1F-4 | H | iPr | iPr | H | H | iPr | iPr |
| 1-1F-5 | H | tBu | tBu | H | H | tBu | tBu |
| 1-1F-6 | H | Ph | Ph | H | H | Ph | Ph |
| 1-1F-7 | Me | Me | Me | H | Me | Me | Me |
| 1-1F-8 | Me | iPr | iPr | H | Me | iPr | iPr |
| 1-1F-9 | Me | tBu | tBu | H | Me | tBu | tBu |

Formula 1-1G may be represented by Formula 1-1G' below.

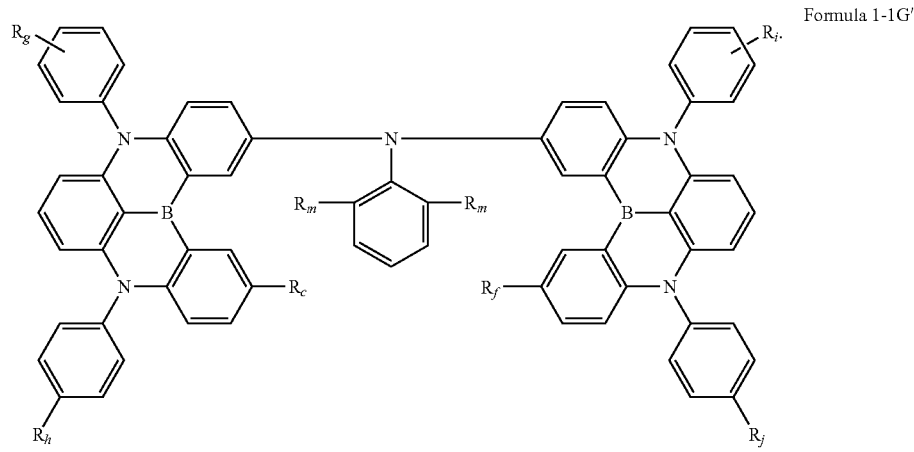

Formula 1-1G'

The polycyclic compound represented by Formula 1-1G' may be represented by Compound 1-1G-1 to Compound 1-1G-10 according to the combination of substituents as shown in Table 7 below. In Table 7, H represents a hydrogen atom, Me represents a methyl group, iPr represents an isopropyl group, tBu represents a t-butyl group, and Ph represents a phenyl group.

TABLE 7

| Compound number | $R_c$ | $R_g$ | $R_h$ | $R_m$ | $R_f$ | $R_i$ | $R_j$ |
|---|---|---|---|---|---|---|---|
| 1-1G-1 | H | H | H | H | H | H | H |
| 1-1G-2 | Me | H | Me | H | Me | H | Me |
| 1-1G-3 | H | H | H | Me | H | H | H |
| 1-1G-4 | iPr | H | iPr | H | iPr | H | iPr |
| 1-1G-5 | tBu | H | tBu | H | tBu | H | tBu |
| 1-1G-6 | Ph | H | Ph | H | Ph | H | Ph |
| 1-1G-7 | Me | Me | Me | H | Me | Me | Me |
| 1-1G-8 | iPr | Me | iPr | H | iPr | Me | iPr |
| 1-1G-9 | tBu | Me | tBu | H | tBu | Me | tBu |
| 1-1G-10 | Ph | Me | Ph | H | Ph | Me | Ph |

Formula 1-1H may be represented by Formula 1-1H' below.

The polycyclic compound represented by Formula 1-1H' may be represented by Compound 1-1H-1 to Compound 1-1H-10 according to the combination of substituents as shown in Table 8 below. In Table 8, H represents a hydrogen atom, Me represents a methyl group, iPr represents an isopropyl group, tBu represents a t-butyl group, and Ph represents a phenyl group.

TABLE 8

| Compound number | $R_c$ | $R_g$ | $R_h$ | $R_m$ | $R_f$ | $R_i$ | $R_j$ |
|---|---|---|---|---|---|---|---|
| 1-1H-1 | H | H | H | H | H | H | H |
| 1-1H-2 | Me | H | Me | H | Me | H | Me |
| 1-1H-3 | H | H | H | Me | H | H | H |
| 1-1H-4 | iPr | H | iPr | H | iPr | H | iPr |
| 1-1H-5 | tBu | H | tBu | H | tBu | H | tBu |
| 1-1H-6 | Ph | H | Ph | H | Ph | H | Ph |
| 1-1H-7 | Me | Me | Me | H | Me | Me | Me |
| 1-1H-8 | iPr | Me | iPr | H | iPr | Me | iPr |
| 1-1H-9 | tBu | Me | tBu | H | tBu | Me | tBu |
| 1-1H-10 | Ph | Me | Ph | H | Ph | Me | Ph |

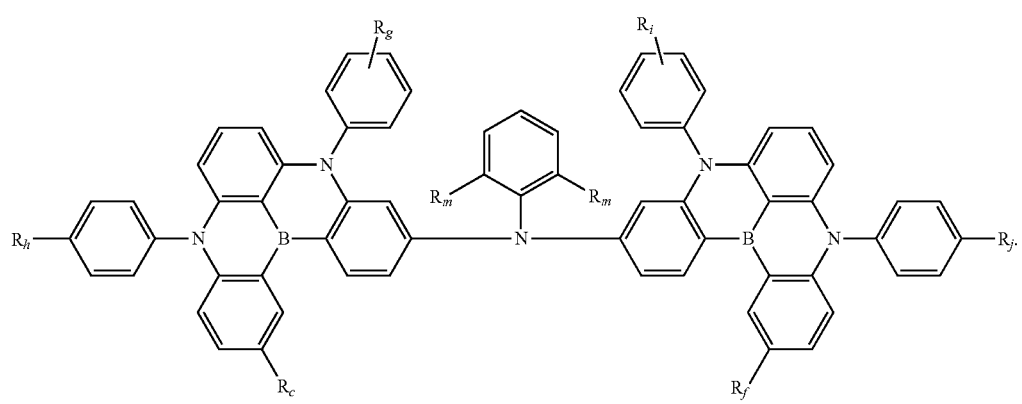

Formula 1-1H'

The polycyclic compound of an embodiment, represented by Formula 1-2 may be represented by any one among Formula 1-2A to Formula 1-2E below.
1-2A
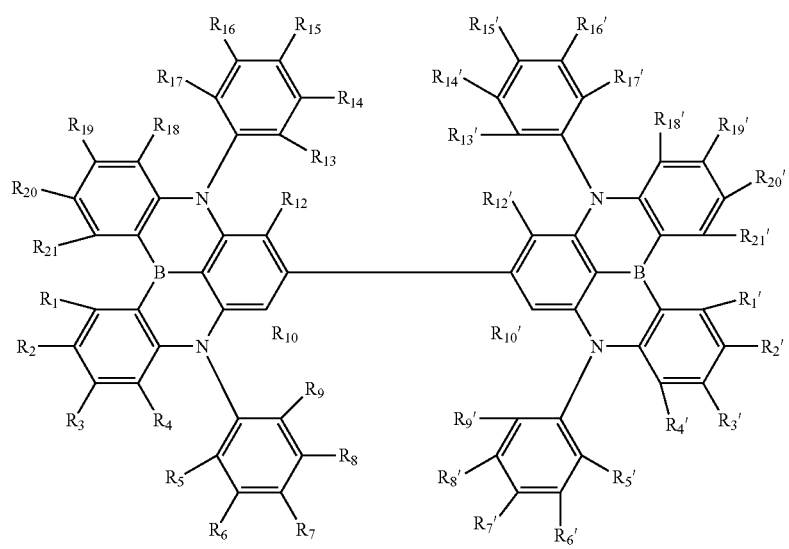
1-2B
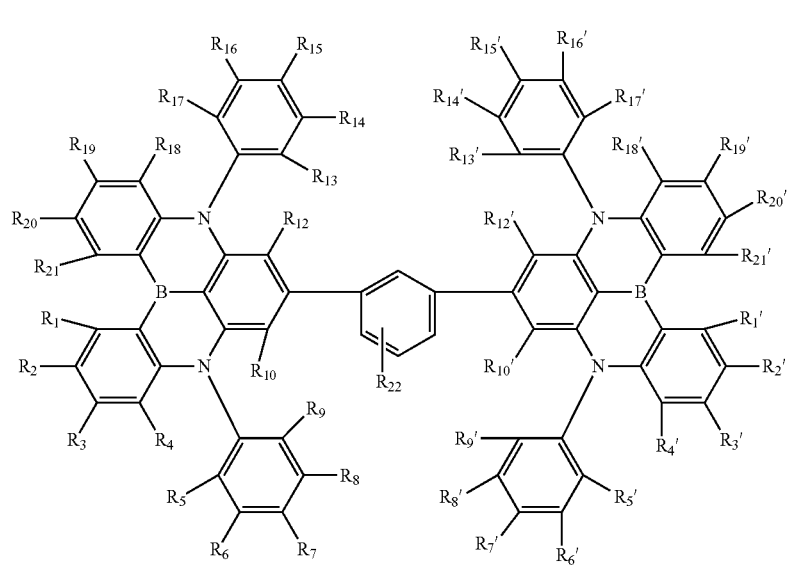

-continued
1-2C
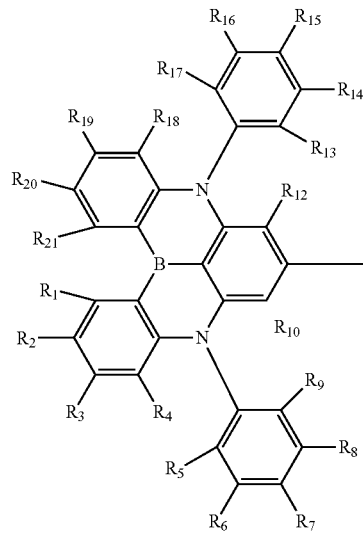
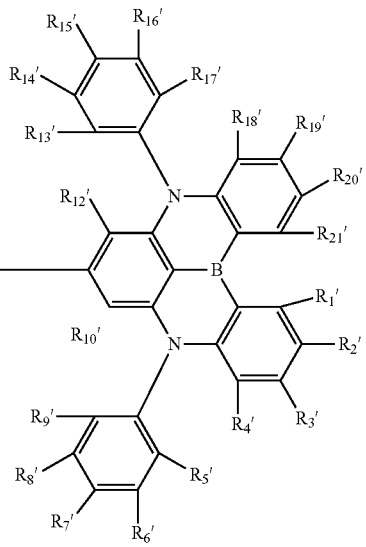
1-2D
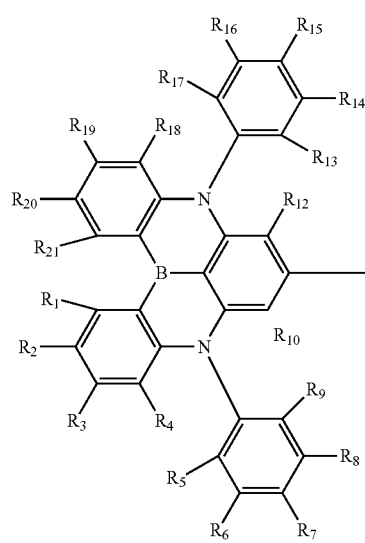
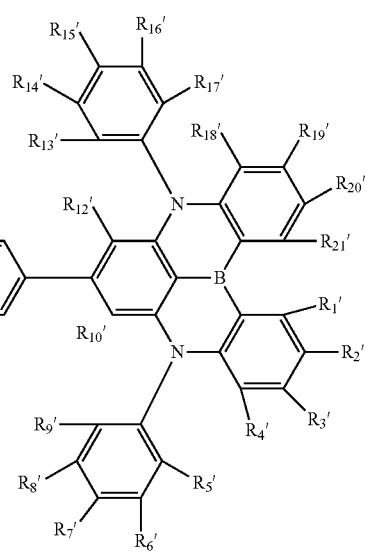

1-2E

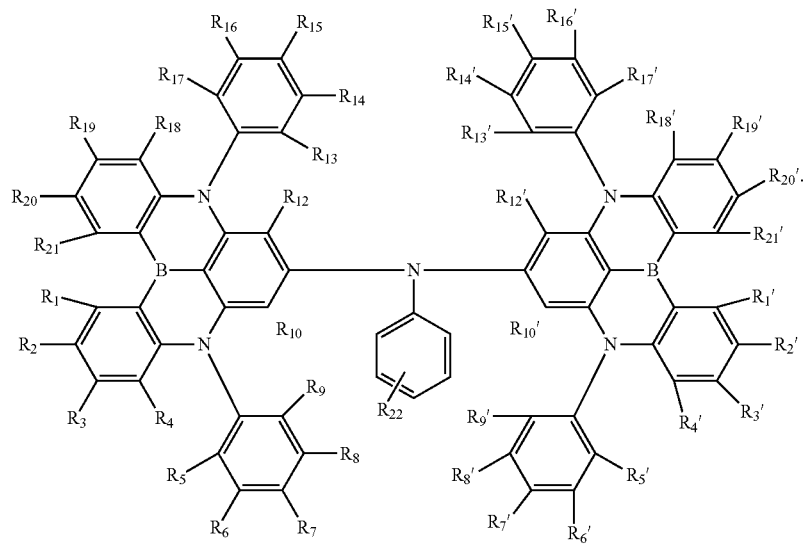

In Formula 1-2A to Formula 1-2E, $R_1$ to $R_{22}$ and $R_1'$ to $R_{21}'$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. For example, $R_1$ to $R_{22}$ and $R_1'$ to $R_{21}'$ may each independently be a hydrogen atom, a methyl group, an isopropyl group, a t-butyl group, a phenyl group, etc., but an embodiment of the present disclosure is not limited thereto. However, an embodiment where $R_{22}$ is a substituted or unsubstituted carbazole group in Formula 1-2B is excluded.

Formula 1-2A may be represented by Formula 1-2A' below.

atom, Me represents a methyl group, iPr represents an isopropyl group, tBu represents a t-butyl group, and Ph represents a phenyl group.

TABLE 9

| Compound number | $R_c$ | $R_g$ | $R_h$ | $R_f$ | $R_i$ | $R_j$ |
|---|---|---|---|---|---|---|
| 1-2A-1 | H | H | H | H | H | H |
| 1-2A-2 | Me | H | Me | Me | H | Me |
| 1-2A-3 | iPr | H | iPr | iPr | H | iPr |
| 1-2A-4 | tBu | H | tBu | tBu | H | tBu |
| 1-2A-5 | Ph | H | Ph | Ph | H | Ph |

Formula 1-2B may be represented by Formula 1-2B' below.

Formula 1-2A'

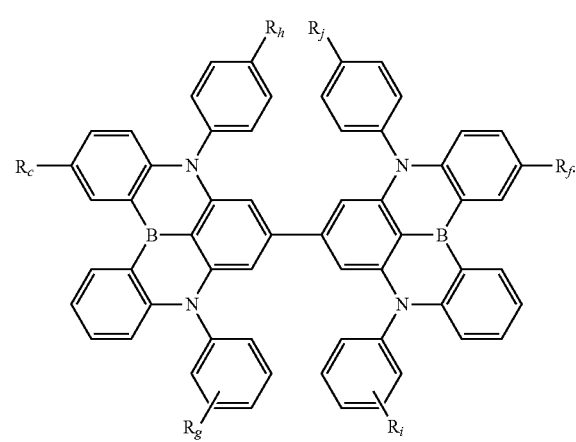

Formula 1-2B'

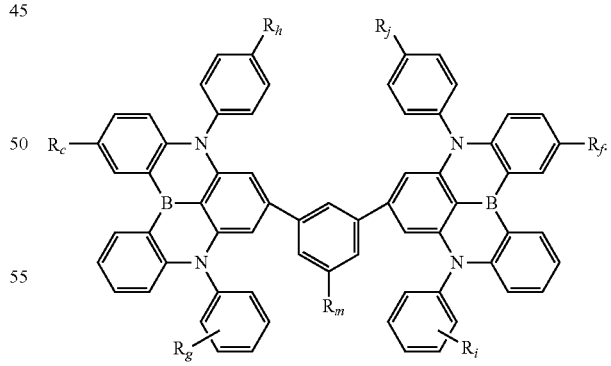

The polycyclic compound represented by Formula 1-2A' may be represented by Compound 1-2A-1 to Compound 1-2A-5 according to the combination of substituents as shown in Table 9 below. In Table 9, H represents a hydrogen The polycyclic compound represented by Formula 1-2B' may be represented by Compound 1-2B-1 to Compound 1-2B-5 according to the combination of substituents as shown in Table 10 below. In Table 10, H represents a hydrogen atom, Me represents a methyl group, iPr represents an isopropyl group, tBu represents a t-butyl group, and Ph represents a phenyl group.

TABLE 10

| Compound number | $R_c$ | $R_g$ | $R_h$ | $R_m$ | $R_f$ | $R_i$ | $R_j$ |
|---|---|---|---|---|---|---|---|
| 1-2B-1 | H | H | H | H | H | H | H |
| 1-2B-2 | Me | H | Me | H | Me | H | Me |
| 1-2B-3 | iPr | H | iPr | H | iPr | H | iPr |
| 1-2B-4 | tBu | H | tBu | H | tBu | H | tBu |
| 1-2B-5 | Ph | H | Ph | H | Ph | H | Ph |

Formula 1-2C may be represented by Formula 1-2C' below.

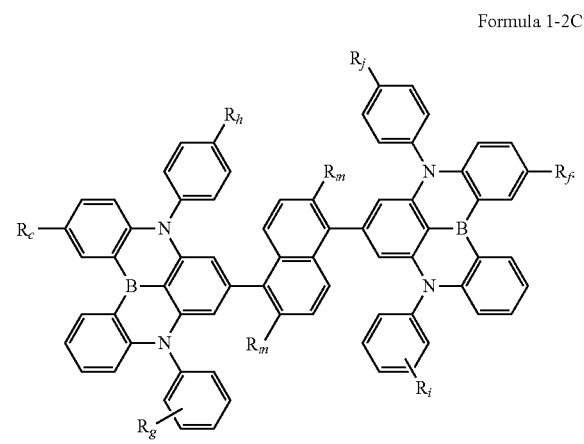

Formula 1-2C'

The polycyclic compound represented by Formula 1-2C' may be represented by Compound 1-2C-1 to Compound 1-2C-9 according to the combination of substituents as shown in Table 11 below. In Table 11, H represents a hydrogen atom, Me represents a methyl group, iPr represents an isopropyl group, tBu represents a t-butyl group, and Ph represents a phenyl group.

TABLE 11

| Compound number | $R_c$ | $R_g$ | $R_h$ | $R_m$ | $R_f$ | $R_i$ | $R_j$ |
|---|---|---|---|---|---|---|---|
| 1-2C-1 | H | H | H | H | H | H | H |
| 1-2C-2 | Me | H | Me | H | Me | H | Me |
| 1-2C-3 | H | H | H | Me | H | H | H |
| 1-2C-4 | iPr | H | iPr | H | iPr | H | iPr |
| 1-2C-5 | tBu | H | tBu | H | tBu | H | tBu |
| 1-2C-6 | Ph | H | Ph | H | Ph | H | Ph |
| 1-2C-7 | Me | Me | Me | H | Me | Me | Me |
| 1-2C-8 | iPr | Me | iPr | H | iPr | Me | iPr |
| 1-2C-9 | tBu | Me | tBu | H | tBu | Me | tBu |

Formula 1-2D may be represented by Formula 1-2D' below.

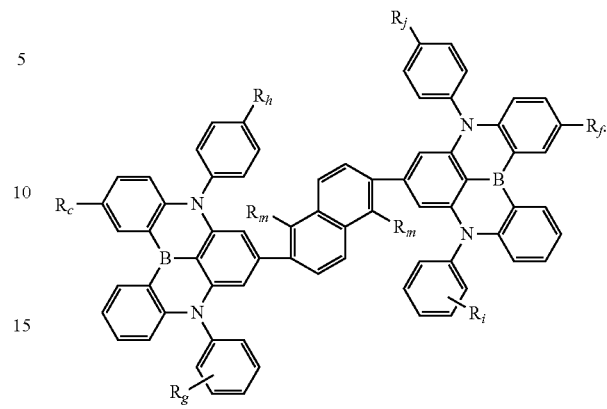

Formula 1-2D'

The polycyclic compound represented by Formula 1-2D' may be represented by Compound 1-2D-1 to Compound 1-2D-10 according to the combination of substituents as shown in Table 12 below. In Table 12, H represents a hydrogen atom, Me represents a methyl group, iPr represents an isopropyl group, tBu represents a t-butyl group, and Ph represents a phenyl group.

TABLE 12

| Compound number | $R_c$ | $R_g$ | $R_h$ | $R_m$ | $R_f$ | $R_i$ | $R_j$ |
|---|---|---|---|---|---|---|---|
| 1-2D-1 | H | H | H | H | H | H | H |
| 1-2D-2 | Me | H | Me | H | Me | H | Me |
| 1-2D-3 | H | H | H | Me | H | H | H |
| 1-2D-4 | iPr | H | iPr | H | iPr | H | iPr |
| 1-2D-5 | tBu | H | tBu | H | tBu | H | tBu |
| 1-2D-6 | Ph | H | Ph | H | Ph | H | Ph |
| 1-2D-7 | Me | Me | Me | H | Me | Me | Me |
| 1-2D-8 | iPr | Me | iPr | H | iPr | Me | iPr |
| 1-2D-9 | tBu | Me | tBu | H | tBu | Me | tBu |
| 1-2D-10 | Ph | Me | Ph | H | Ph | Me | Ph |

Formula 1-2E may be represented by Formula 1-2E' below.

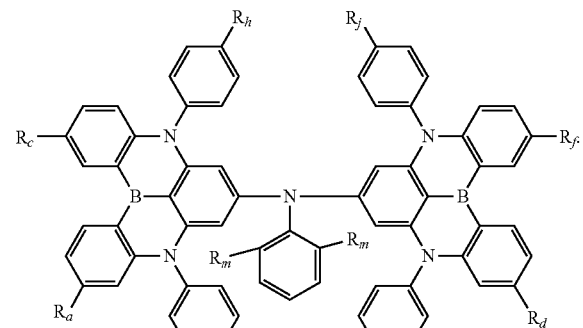

Formula 1-2E'

The polycyclic compound represented by Formula 1-2E' may be represented by Compound 1-2E-1 to Compound 1-2E-10 according to the combination of substituents as shown in Table 13 below. In Table 13, H represents a hydrogen atom, Me represents a methyl group, iPr represents an isopropyl group, tBu represents a t-butyl group, and Ph represents a phenyl group.

TABLE 13

| Compound number | $R_a$ | $R_c$ | $R_h$ | $R_m$ | $R_d$ | $R_f$ | $R_j$ |
|---|---|---|---|---|---|---|---|
| 1-2E-1 | H | H | H | H | H | H | H |
| 1-2E-2 | H | Me | Me | H | H | Me | Me |
| 1-2E-3 | H | H | H | Me | H | H | H |
| 1-2E-4 | H | iPr | iPr | H | H | iPr | iPr |
| 1-2E-5 | H | tBu | tBu | H | H | tBu | tBu |
| 1-2E-6 | H | Ph | Ph | H | H | Ph | Ph |
| 1-2E-7 | Me | Me | Me | H | Me | Me | Me |
| 1-2E-8 | Me | iPr | iPr | H | Me | iPr | iPr |
| 1-2E-9 | Me | tBu | tBu | H | Me | tBu | tBu |
| 1-2E-10 | Me | Ph | Ph | H | Me | Ph | Ph |

The polycyclic compound of an embodiment, represented by Formula 1-3 may be represented by any one among the following Formula 1-3A to Formula 1-3F:

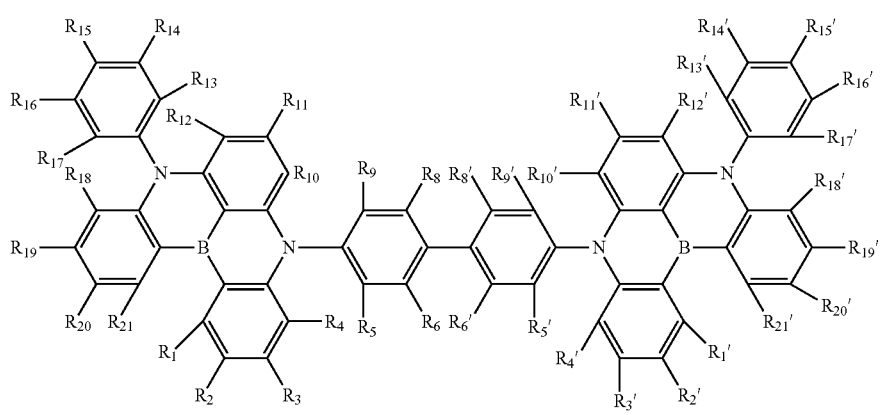

1-3A

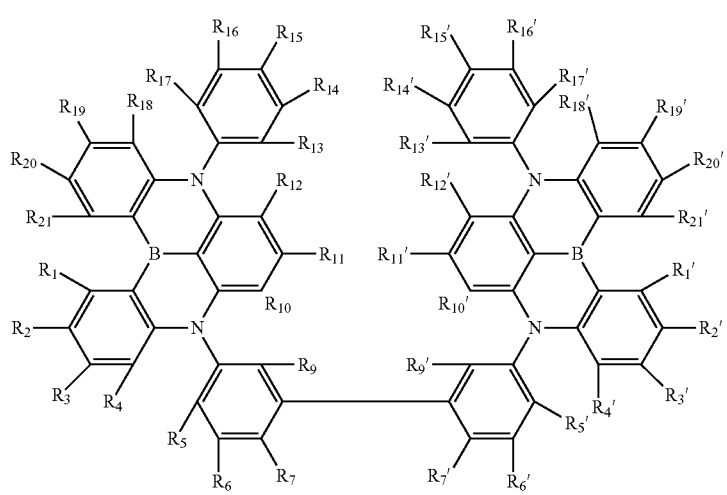

1-3B

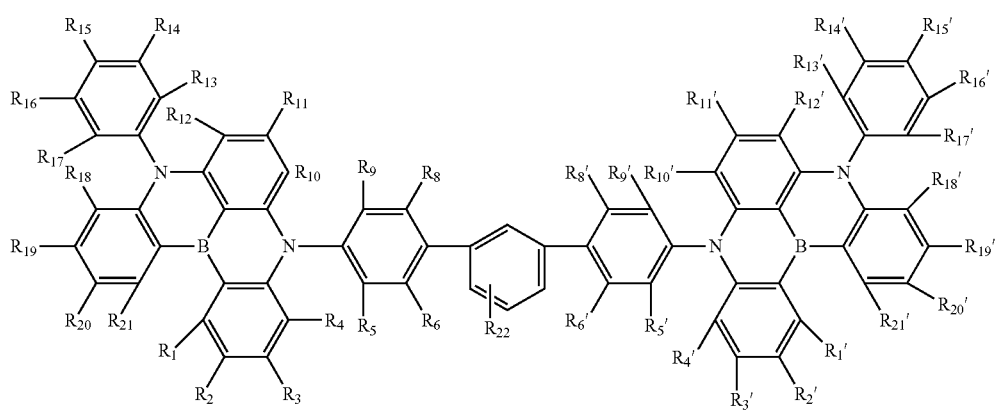

1-3C

-continued
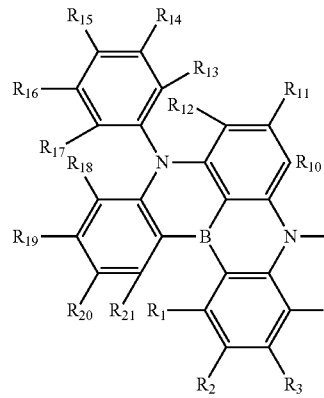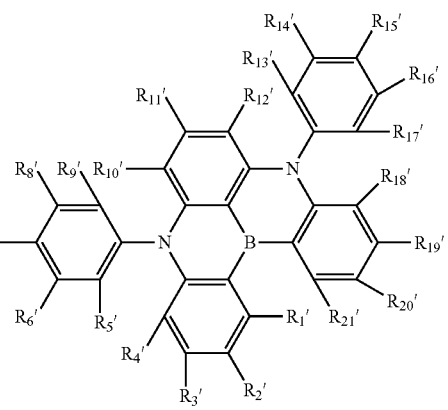
1-3D
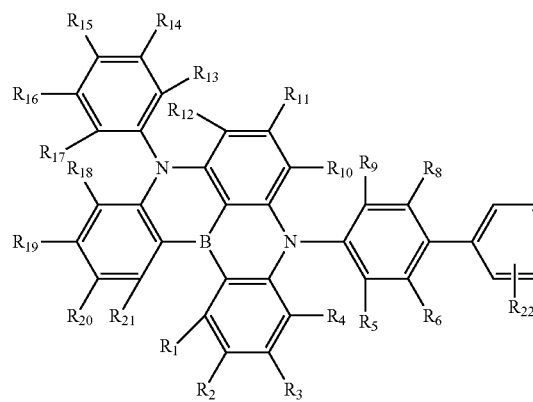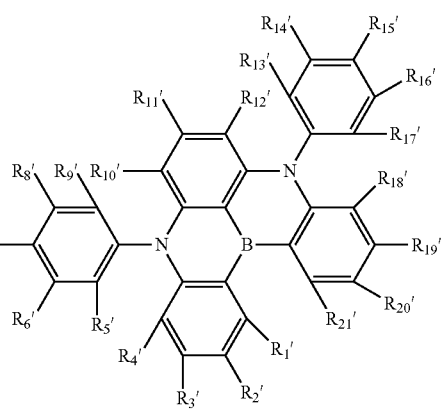
1-3E
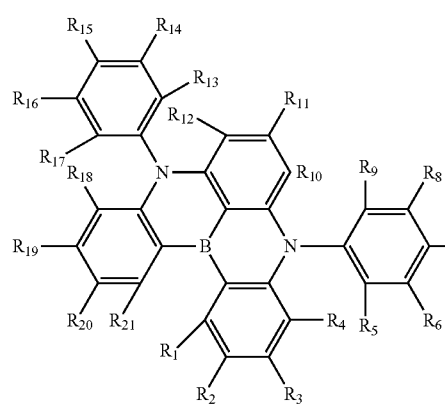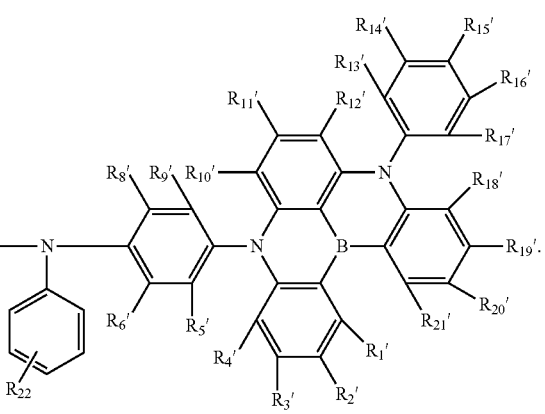
1-3F In Formula 1-3A to Formula 1-3F, $R_1$ to $R_{22}$ and $R_1'$ to $R_{21}'$ may each independently be a hydrogen atom, a deuterium atom, an alkyl group of 1 to 20 carbon atoms, a substituted or unsubstituted aryl group of 6 to 30 carbon atoms for forming a ring, a substituted or unsubstituted heteroaryl group of 2 to 30 carbon atoms for forming a ring, a substituted or unsubstituted oxy group, or a substituted or unsubstituted thio group. For example, $R_1$ to $R_{22}$ and $R_1'$ to $R_{21}'$ may each independently be a hydrogen atom, a methyl group, an isopropyl group, a t-butyl group, a phenyl group, etc., but an embodiment of the present disclosure is not limited thereto.

Formula 1-3A may be represented by Formula 1-3A' below.

Formula 1-3A'

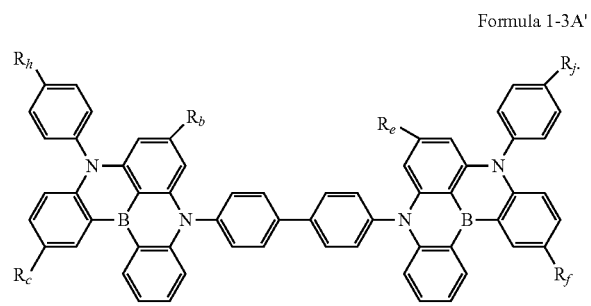

The polycyclic compound represented by Formula 1-3A' may be represented by Compound 1-3A-1 to Compound 1-3A-9 according to the combination of substituents as shown in Table 14 below. In Table 14, H represents a hydrogen atom, Me represents a methyl group, iPr represents an isopropyl group, tBu represents a t-butyl group, and Ph represents a phenyl group.

TABLE 14

| Compound number | $R_b$ | $R_c$ | $R_h$ | $R_e$ | $R_f$ | $R_j$ |
|---|---|---|---|---|---|---|
| 1-3A-1 | H | H | H | H | H | H |
| 1-3A-2 | H | Me | Me | H | Me | Me |
| 1-3A-3 | H | iPr | iPr | H | iPr | iPr |
| 1-3A-4 | H | tBu | tBu | H | tBu | tBu |
| 1-3A-5 | H | Ph | Ph | H | Ph | Ph |
| 1-3A-6 | Me | Me | Me | Me | Me | Me |
| 1-3A-7 | Me | iPr | iPr | Me | iPr | iPr |

TABLE 14-continued

| Compound number | $R_b$ | $R_c$ | $R_h$ | $R_e$ | $R_f$ | $R_j$ |
|---|---|---|---|---|---|---|
| 1-3A-8 | Me | tBu | tBu | Me | tBu | tBu |
| 1-3A-9 | Me | Ph | Ph | Me | Ph | Ph |

Formula 1-3B may be represented by Formula 1-3B' below.

Formula 1-3B'

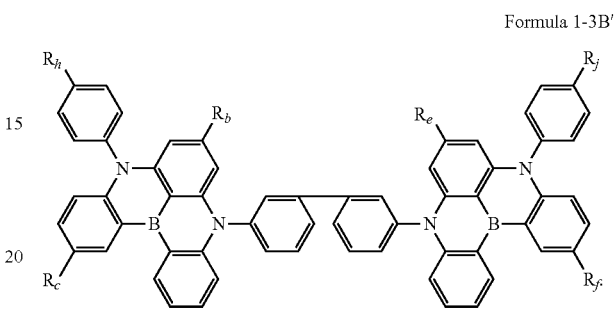

The polycyclic compound represented by Formula 1-3B' may be represented by Compound 1-3B-1 to Compound 1-3B-9 according to the combination of substituents as shown in Table 15 below. In Table 15, H represents a hydrogen atom, Me represents a methyl group, iPr represents an isopropyl group, tBu represents a t-butyl group, and Ph represents a phenyl group.

TABLE 15

| Compound number | $R_b$ | $R_c$ | $R_h$ | $R_e$ | $R_f$ | $R_j$ |
|---|---|---|---|---|---|---|
| 1-3B-1 | H | H | H | H | H | H |
| 1-3B-2 | H | Me | Me | H | Me | Me |
| 1-3B-3 | H | iPr | iPr | H | iPr | iPr |
| 1-3B-4 | H | tBu | tBu | H | tBu | tBu |
| 1-3B-5 | H | Ph | Ph | H | Ph | Ph |
| 1-3B-6 | Me | Me | Me | Me | Me | Me |
| 1-3B-7 | Me | iPr | iPr | Me | iPr | iPr |
| 1-3B-8 | Me | tBu | tBu | Me | tBu | tBu |
| 1-3B-9 | Me | Ph | Ph | Me | Ph | Ph |

Formula 1-3C may be represented by Formula 1-3C' below.

Formula 1-3C'

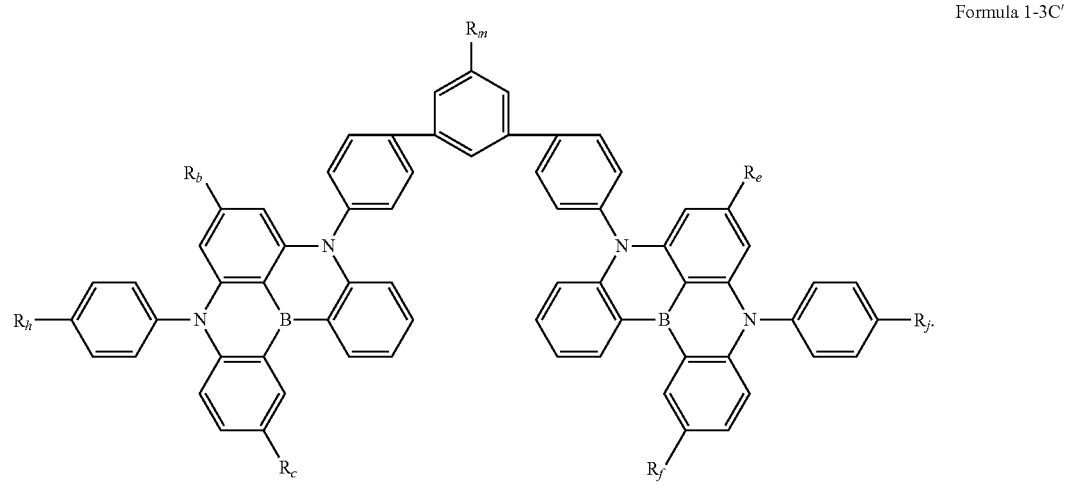

The polycyclic compound represented by Formula 1-3C′ may be represented by Compound 1-3C-1 to Compound 1-3C-9 according to the combination of substituents as shown in Table 16 below. In Table 16, H represents a hydrogen atom, Me represents a methyl group, iPr represents an isopropyl group, tBu represents a t-butyl group, and Ph represents a phenyl group.

TABLE 16

| Compound number | $R_b$ | $R_c$ | $R_h$ | $R_m$ | $R_e$ | $R_f$ | $R_j$ |
|---|---|---|---|---|---|---|---|
| 1-3C-1 | H | H | H | H | H | H | H |
| 1-3C-2 | H | Me | Me | H | H | Me | Me |
| 1-3C-3 | H | iPr | iPr | H | H | iPr | iPr |
| 1-3C-4 | H | tBu | tBu | H | H | tBu | tBu |
| 1-3C-5 | H | Ph | Ph | H | H | Ph | Ph |
| 1-3C-6 | Me | Me | Me | H | Me | Me | Me |
| 1-3C-7 | Me | iPr | iPr | H | Me | iPr | iPr |
| 1-3C-8 | Me | tBu | tBu | H | Me | tBu | tBu |
| 1-3C-9 | Me | Ph | Ph | H | Me | Ph | Ph |

Formula 1-3D may be represented by Formula 1-3D′ below.

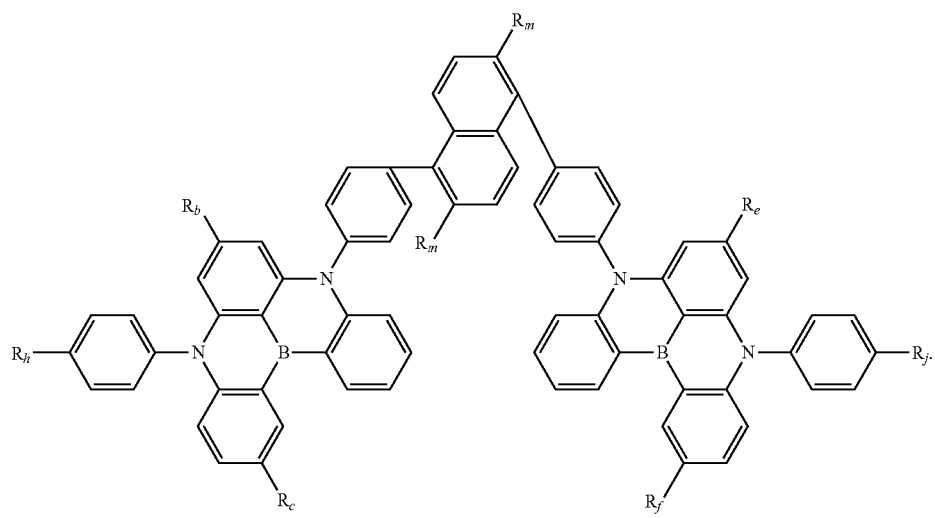

Formula 1-3D′

The polycyclic compound represented by Formula 1-3D′ may be represented by Compound 1-3D-1 to Compound 1-3D-10 according to the combination of substituents as shown in Table 17 below. In Table 17, H represents a hydrogen atom, Me represents a methyl group, iPr represents an isopropyl group, tBu represents a t-butyl group, and Ph represents a phenyl group.

Table 17

| Compound number | $R_b$ | $R_c$ | $R_h$ | $R_m$ | $R_e$ | $R_f$ | $R_j$ |
|---|---|---|---|---|---|---|---|
| 1-3D-1 | H | H | H | H | H | H | H |
| 1-3D-2 | H | Me | Me | H | H | Me | Me |
| 1-3D-3 | H | H | H | Me | H | H | H |
| 1-3D-4 | H | iPr | iPr | H | H | iPr | iPr |
| 1-3D-5 | H | tBu | tBu | H | H | tBu | tBu |
| 1-3D-6 | H | Ph | Ph | H | H | Ph | Ph |
| 1-3D-7 | Me | Me | Me | H | Me | Me | Me |
| 1-3D-8 | Me | iPr | iPr | H | Me | iPr | iPr |
| 1-3D-9 | Me | tBu | tBu | H | Me | tBu | tBu |
| 1-3D-10 | Me | Ph | Ph | H | Me | Ph | Ph |

Formula 1-3E may be represented by Formula 1-3E' below.

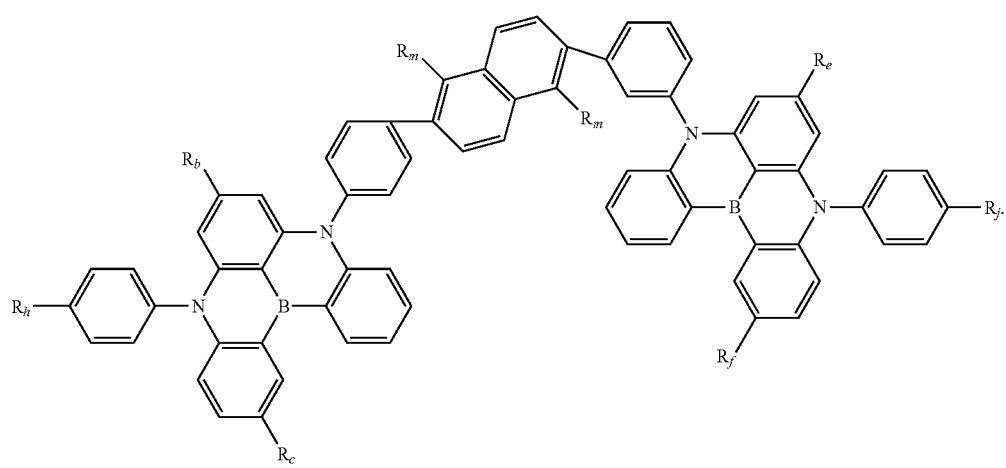

Formula 1-3E'

The polycyclic compound represented by Formula 1-3E' may be represented by Compound 1-3E-1 to Compound 1-3E-10 according to the combination of substituents as shown in Table 18 below. In Table 18, H represents a hydrogen atom, Me represents a methyl group, iPr represents an isopropyl group, tBu represents a t-butyl group, and Ph represents a phenyl group.

TABLE 18

| Compound number | $R_b$ | $R_c$ | $R_h$ | $R_m$ | $R_e$ | $R_f$ | $R_j$ |
|---|---|---|---|---|---|---|---|
| 1-3E-1 | H | H | H | H | H | H | H |
| 1-3E-2 | H | Me | Me | H | H | Me | Me |
| 1-3E-3 | H | H | H | Me | H | H | H |
| 1-3E-4 | H | iPr | iPr | H | H | iPr | iPr |
| 1-3E-5 | H | tBu | tBu | H | H | tBu | tBu |
| 1-3E-6 | H | Ph | Ph | H | H | Ph | Ph |
| 1-3E-7 | Me | Me | Me | H | Me | Me | Me |
| 1-3E-8 | Me | iPr | iPr | H | Me | iPr | iPr |
| 1-3E-9 | Me | tBu | tBu | H | Me | tBu | tBu |
| 1-3E-10 | Me | Ph | Ph | H | Me | Ph | Ph |

Formula 1-3F may be represented by Formula 1-3F' below.

The polycyclic compound represented by Formula 1-3F' may be represented by Compound 1-3F-1 to Compound 1-3F-10 according to the combination of substituents as shown in Table 19 below. In Table 19, H represents a hydrogen atom, Me represents a methyl group, iPr represents an isopropyl group, tBu represents a t-butyl group, and Ph represents a phenyl group.

TABLE 19

| Compound number | $R_a$ | $R_c$ | $R_h$ | $R_m$ | $R_d$ | $R_f$ | $R_j$ |
|---|---|---|---|---|---|---|---|
| 1-3F-1 | H | H | H | H | H | H | H |
| 1-3F-2 | H | Me | Me | H | H | Me | Me |
| 1-3F-3 | H | H | H | Me | H | H | H |
| 1-3F-4 | H | iPr | iPr | H | H | iPr | iPr |
| 1-3F-5 | H | tBu | tBu | H | H | tBu | tBu |
| 1-3F-6 | H | Ph | Ph | H | H | Ph | Ph |
| 1-3F-7 | Me | Me | Me | H | Me | Me | Me |
| 1-3F-8 | Me | iPr | iPr | H | Me | iPr | iPr |
| 1-3F-9 | Me | tBu | tBu | H | Me | tBu | tBu |
| 1-3F-10 | Me | Ph | Ph | H | Me | Ph | Ph |

The polycyclic compound of an embodiment may be any one among the compounds represented by Formula 1-1 to Formula 1-3. The organic electroluminescence device 10 of an embodiment may include at least one polycyclic compound selected from 1-1A-1 to 1-1A-9, 1-1B-1 to 1-1B-9,

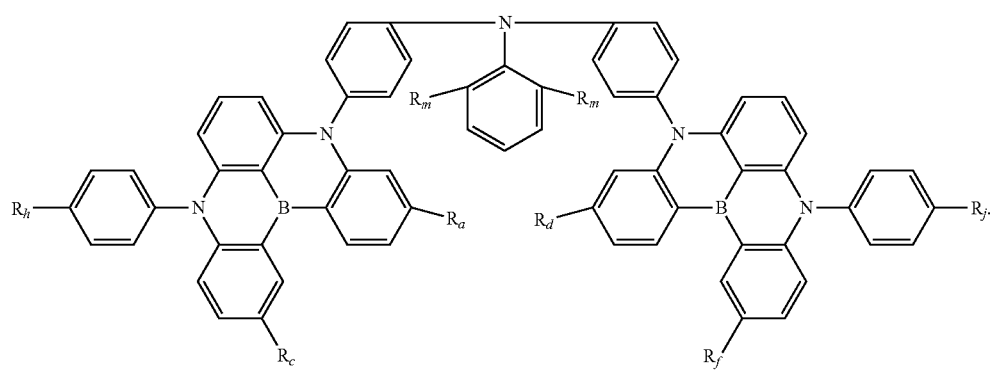

Formula 1-3F'

1-1C-1 to 1-1C-10, 1-1D-1 to 1-1D-10, 1-1E-1 to 1-1E-10, 1-1F-1 to 1-1F-9, 1-1G-1 to 1-1G-10, 1-1H-1 to 1-1H-10, 1-2A-1 to 1-2A-5, 1-2B-1 to 1-2B-5, 1-2C-1 to 1-2C-9, 1-2D-1 to 1-2D-10, 1-2E-1 to 1-2E-10, 1-3A-1 to 1-3A-9, 1-3B-1 to 1-3B-9, 1-3C-1 to 1-3C-9, 1-3D-1 to 1-3D-10, 1-3E-1 to 1-3E-10, and 1-3F-1 to 1-3F-10 in an emission layer EML. The polycyclic compound of an embodiment may be a material for emitting thermally activated delayed fluorescence. The polycyclic compound of an embodiment has a structure in which two polycyclic aromatic groups are combined via a linker, and may emit light of a narrow full width at half maximum (FWHM) in a deep blue wavelength region and may show high efficiency properties when compared with a compound having a structure including one polycyclic aromatic group which is not connected via a linker.

The polycyclic compound of an embodiment, represented by Formula 1 may be a light-emitting material having light-emitting center wavelength ($\lambda_{max}$) in a wavelength region of about 470 nm or less. For example, the polycyclic compound of an embodiment, represented by Formula 1 may be a light-emitting material having a light-emitting center wavelength in a wavelength region of about 430 nm to about 490 nm. The polycyclic compound of an embodiment, represented by Formula 1 may be a blue thermally activated delayed fluorescence dopant.

In the organic electroluminescent device 10 of an embodiment, the emission layer EML may emit delayed fluorescence. For example, the emission layer EML may emit thermally activated delayed fluorescence (TADF).

In some embodiments, the organic electroluminescence device 10 of an embodiment may include a plurality of emission layers. The plurality of emission layers may be laminated one by one. For example, the organic electroluminescence device 10 including the plurality of emission layers may emit white light. The organic electroluminescence device including the plurality of emission layers may be an organic electroluminescence device having a tandem structure. If the organic electroluminescence device 10 includes a plurality of emission layers, at least one emission layer EML may include the polycyclic compound of an embodiment.

In an embodiment, the emission layer EML includes a host and a dopant and may include the polycyclic compound of an embodiment as a dopant. For example, in the organic electroluminescence device 10 of an embodiment, the emission layer EML may include a host for emitting delayed fluorescence and a dopant for emitting delayed fluorescence, and may include the polycyclic compound as a dopant for emitting delayed fluorescence. The emission layer EML may include at least one of the polycyclic compounds of the present embodiments as a thermally activated delayed fluorescence dopant.

In an embodiment, the emission layer EML may be a delayed fluorescence emission layer, and the emission layer EML may include any suitable host material and the above-described polycyclic compound. For example, in an embodiment, the polycyclic compound may be used as a TADF dopant.

In an embodiment, the emission layer EML may include any suitable host material. For example, in an embodiment, the emission layer EML may include, as a host material, tris(8-hydroxyquinolinato)aluminum ($Alq_3$), 4,4'-bis(N-carbazolyl)-1,1'-biphenyl (CBP), poly(N-vinylcarbazole) (PVK), 9,10-di(naphthalene-2-yl)anthracene (ADN), 4,4',4''-tris(carbazol-9-yl)-triphenylamine (TCTA), 1,3,5-tris(N-phenylbenzimidazol-2-yl)benzene (TPBi), 3-tert-butyl-9,10-di(naphth-2-yl)anthracene (TBADN), distyrylarylene (DSA), 4,4'-bis(9-carbazolyl)-2,2''-dimethyl-biphenyl (CDBP), 2-methyl-9,10-bis(naphthalen-2-yl)anthracene (MADN), bis[2-(diphenylphosphino)phenyl]ether oxide (DPEPO), hexaphenyl cyclotriphosphazene (CP1), 1,4-bis(triphenylsilyl)benzene (UGH2), hexaphenylcyclotrisiloxane ($DPSiO_3$), octaphenylcyclotetrasiloxane ($DPSiO_4$), 2,8-bis(diphenylphosphoryl)dibenzo[b,d]furan (PPF), 3,3'-bis(N-carbazolyl)-1,1'-biphenyl (mCBP), 1,3-bis(N-carbazolyl)benzene (mCP), etc. However, an embodiment of the present disclosure is not limited thereto. Any suitable host materials for emitting delayed fluorescence other than the suggested host materials may be included.

In the organic electroluminescence device 10 of an embodiment, the emission layer EML may further include any suitable dopant material. In an embodiment, the emission layer EML may include, as a dopant, styryl derivatives (for example, 1,4-bis[2-(3-N-ethylcarbazolyl)vinyl]benzene (BCzVB), 4-(di-p-tolylamino)-4'-[(di-p-tolylamino)styryl] stilbene (DPAVB), and/or N-(4-((E)-2-(6-((E)-4-(diphenylamino)styryl)naphthalen-2-yl)vinyl)phenyl)-N-phenyl-benzenamine (N-BDAVBi)), perylene and/or the derivatives thereof (for example, 2,5,8,11-tetra-t-butylperylene (TBP)), pyrene and/or the derivatives thereof (for example, 1,1-dipyrene, 1,4-dipyrenylbenzene and/or 1,4-bis(N,N-diphenylamino)pyrene), etc.

In the organic electroluminescence device 10 of an embodiment, as shown in FIGS. 1 to 4, the electron transport region ETR is provided on the emission layer EML. The electron transport region ETR may include at least one selected from a hole blocking layer HBL, an electron transport layer ETL, and an electron injection layer EIL. However, an embodiment of the present disclosure is not limited thereto.

The electron transport region ETR may have a single layer formed using a single material, a single layer formed using a plurality of different materials, or a multilayer structure having a plurality of layers formed using a plurality of different materials.

For example, the electron transport region ETR may have a single layer structure of an electron injection layer EIL or an electron transport layer ETL, or a single layer structure formed using an electron injection material and an electron transport material. In some embodiments, the electron transport region ETR may have a single layer structure having a plurality of different materials, or a structure laminated from the emission layer EML of electron transport layer ETL/electron injection layer EIL, or hole blocking layer HBL/electron transport layer ETL/electron injection layer EIL, without limitation. The thickness of the electron transport region ETR may be, for example, from about 1,000 Å to about 1,500 Å.

The electron transport region ETR may be formed using one or more suitable methods such as a vacuum deposition method, a spin coating method, a cast method, a Langmuir-Blodgett (LB) method, an inkjet printing method, a laser printing method, and/or a laser induced thermal imaging (LITI) method.

If the electron transport region ETR includes an electron transport layer ETL, the electron transport region ETR may include an anthracene-based compound. The electron transport region may include, for example, tris(8-hydroxyquinolinato)aluminum (Alq3), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-yl)phenyl)-9,10-dinaphthylanthracene, 1,3,5-tri(1-phenyl-1H-benzo[d]imidazol-2-yl)benzene (TPBi), 2,9-dimethyl-4,7-diphenyl- 1,10-phenanthroline (BCP), 4,7-diphenyl-1,10-phenanthroline (Bphen), 3-(4-biphenylyl)-4-phenyl-5-tert-butylphenyl-1,2,4-triazole (TAZ), 4-(naphthalen-1-yl)-3,5-diphenyl-4H-1,2,4-triazole (NTAZ), 2-(4-biphenylyl)-5-(4-tert-butylphenyl)-1,3,4-oxadiazole (tBu-PBD), bis(2-methyl-8-quinolinolato-N1,O8)-(1,1'-biphenyl-4-olato) aluminum (BAlq), berylliumbis(benzoquinolin-10-olate) (Bebq2), 9,10-di(naphthalen-2-yl)anthracene (ADN), 1,3-bis[3,5-di(pyridine-3-yl)phenyl]benzene (BmPyPhB), or a mixture thereof, without limitation. The thickness of the electron transport layer ETL may be from about 100 Å to about 1,000 Å and may be, for example, from about 150 Å to about 500 Å. If the thickness of the electron transport layer ETL satisfies the above-described range, satisfactory (or suitable) electron transport properties may be obtained without substantial increase of a driving voltage.

If the electron transport region ETR includes the electron injection layer EIL, the electron transport region ETR may include a metal halide (such as LiF, NaCl, CsF, RbCl and/or RbI), a metal in lanthanoides (such as Yb), a metal oxide (such as $Li_2O$ and/or BaO), and/or lithium quinolate (LiQ). However, an embodiment of the present disclosure is not limited thereto. The electron injection layer EIL also may be formed using a mixture material of an electron transport material and an insulating organo metal salt. The organo metal salt may be a material having an energy band gap of about 4 eV or more. For example, the organo metal salt may include, for example, metal acetates, metal benzoates, metal acetoacetates, metal acetylacetonates, and/or metal stearates. The thickness of the electron injection layer EIL may be from about 1 Å to about 100 Å, and from about 3 Å to about 90 Å. If the thickness of the electron injection layer EIL satisfies the above described range, satisfactory (or suitable) electron injection properties may be obtained without inducing substantial increase of a driving voltage.

The electron transport region ETR may include a hole blocking layer HBL. The hole blocking layer HBL may include, for example, at least one of 2,9-dimethyl-4,7-diphenyl-1,10-phenanthroline (BCP), or 4,7-diphenyl-1,10-phenanthroline (Bphen). However, an embodiment of the present disclosure is not limited thereto.

The second electrode EL2 is provided on the electron transport region ETR. The second electrode EL2 may be a common electrode and/or a cathode. The second electrode EL2 may be a transmissive electrode, a transflective electrode or a reflective electrode. If the second electrode EL2 is the transmissive electrode, the second electrode EL2 may include a transparent metal oxide, for example, ITO, IZO, ZnO, ITZO, etc.

If the second electrode EL2 is the transflective electrode or the reflective electrode, the second electrode EL2 may include Ag, Mg, Cu, Al, Pt, Pd, Au, Ni, Nd, Ir, Cr, Li, Ca, LiF/Ca, LiF/Al, Mo, Ti, a compound thereof, or a mixture thereof (for example, a mixture of Ag and Mg). The second electrode EL2 may have a multilayered structure including a reflective layer or a transflective layer formed using any of the above-described materials and a transparent conductive layer formed using ITO, IZO, ZnO, ITZO, etc.

In some embodiments, the second electrode EL2 may be connected with an auxiliary electrode. If the second electrode EL2 is connected with the auxiliary electrode, the resistance of the second electrode EL2 may decrease.

On the second electrode EL2 of the organic electroluminescence device 10 of an embodiment, a capping layer (CPL) may be further placed. The capping layer (CPL) may include, for example, α-NPD, NPB, TPD, m-MTDATA, $Alq_3$, CuPc, N4,N4,N4',N4'-tetra(biphenyl-4-yl) biphenyl-4,4'-diamine (TPD15), 4,4',4''-tris(carbazol sol-9-yl) triphenylamine (TCTA), N, N'-bis(naphthalene-1-yl), etc.

The organic electroluminescence device 10 according to an embodiment of the present disclosure includes the polycyclic compound of an embodiment in the emission layer EML positioned between the first electrode EL1 and the second electrode EL2, thereby showing excellent (suitable) emission efficiency and a narrow full width at half maximum in a light-emitting wavelength region of blue light. In addition, the polycyclic compound according to an embodiment may emit thermally activated delayed fluorescence, and the emission layer EML may include the polycyclic compound of an embodiment to emit thermally activated delayed fluorescence and show high emission efficiency properties.

The polycyclic compound of an embodiment may be included in an organic layer other than the emission layer EML as a material for the organic electroluminescence device 10. For example, the organic electroluminescence device 10 according to an embodiment of the present disclosure may include the polycyclic compound in at least one functional layer between the first electrode EL1 and the second electrode EL2, or in the capping layer CPL on the second electrode EL2.

The polycyclic compound of an embodiment has a combined structure in which two polycyclic aromatic groups are connected via a linker, and may show high lowest triplet excitation energy level and be used as a material emitting delayed fluorescence. In addition, the organic electroluminescence device of an embodiment including the polycyclic compound of an embodiment in the emission layer emits blue light having a narrow full width at half maximum and may show high efficiency properties.

Hereinafter, the polycyclic compound according to an embodiment and the organic electroluminescence device of an embodiment of the present disclosure will be particularly explained referring to embodiments and comparative embodiments. The following embodiments are only illustrations to assist the understanding of the present disclosure, and the scope of the present disclosure is not limited thereto.

EXAMPLES

1. Synthesis of Polycyclic Compound of an Embodiment

First, the synthetic method of the polycyclic compound according to one or more embodiments will be particularly explained referring to the synthetic methods of Compound 1 to Compound 10. However, the synthetic methods of the polycyclic compounds explained below are only example embodiments, and the synthetic method of the polycyclic compound of the present disclosure is not limited thereto.

Example Compounds 1 to 10, which are provided as the examples below, are as follows:

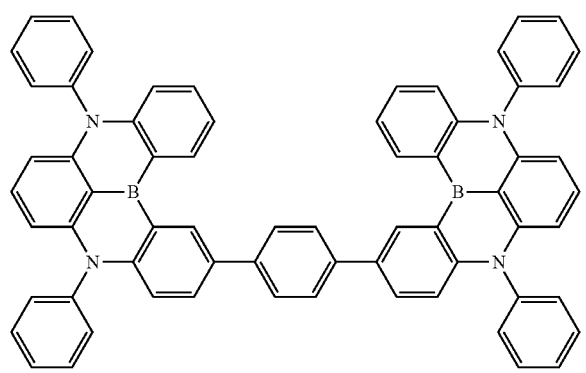
1
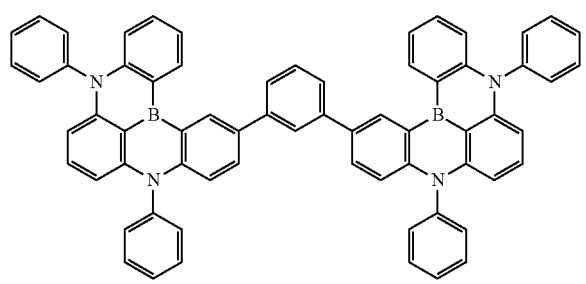
2
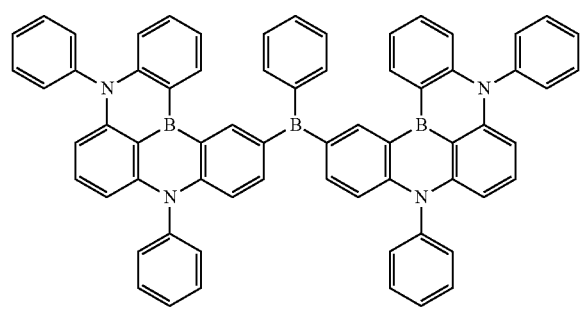
3
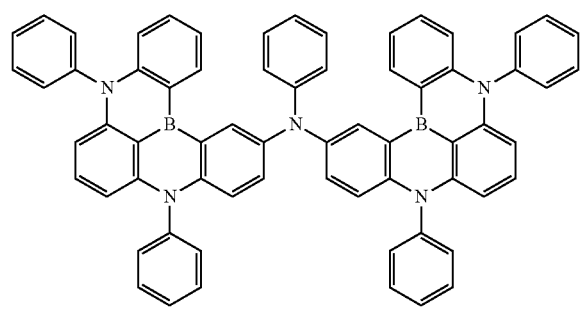
4
-continued
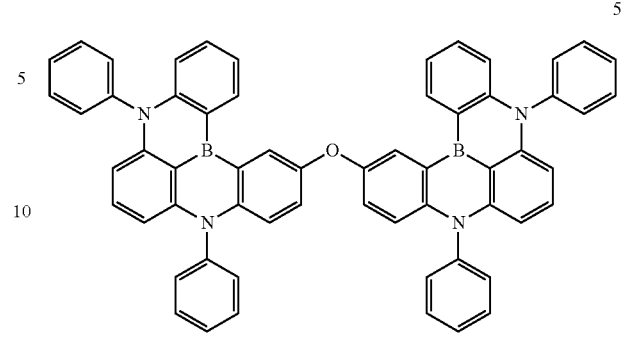
5
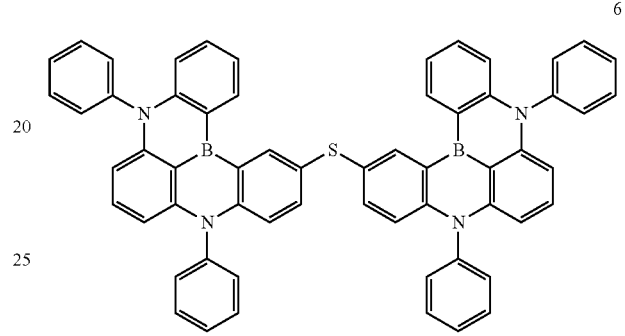
6
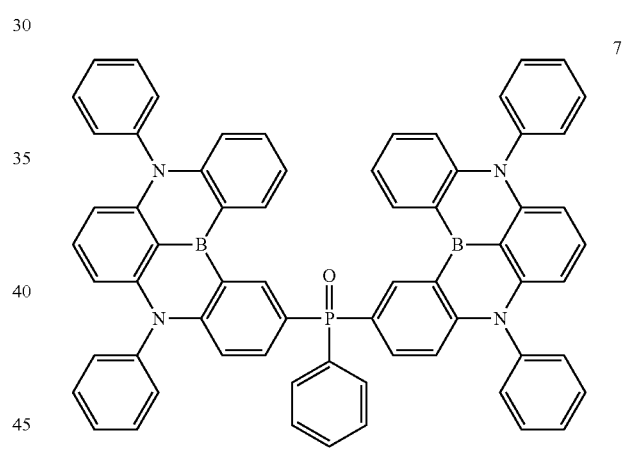
7
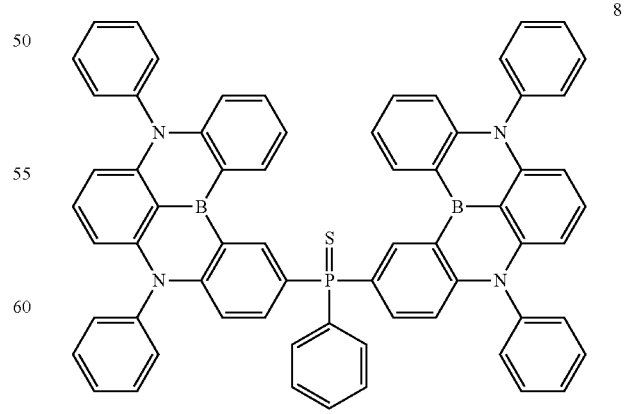
8

-continued

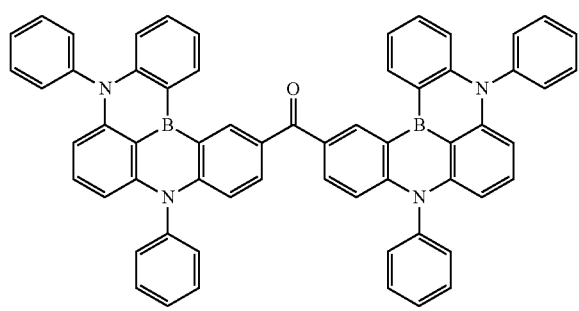

9

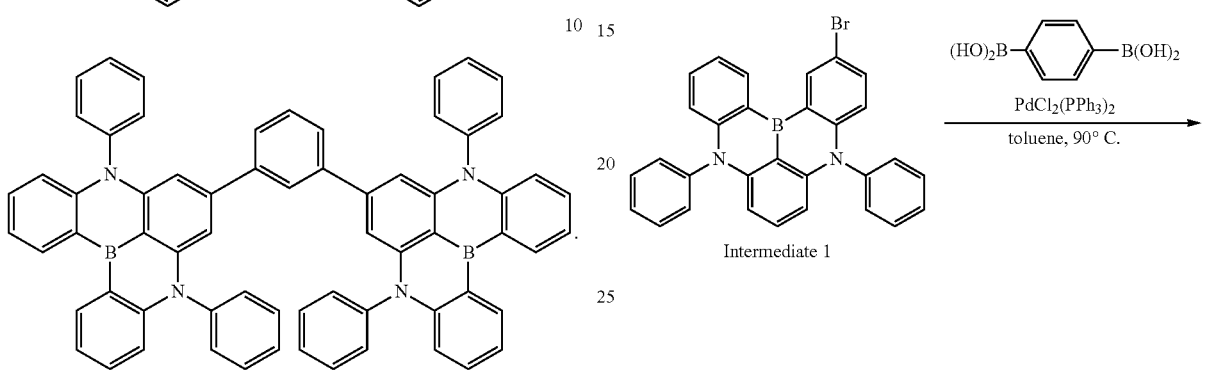

10

(1) Synthesis of Compound 1

Compound 1 according to an embodiment may be synthesized by, for example, the steps of Reaction 1-1 and Reaction 1-2 below.

Synthesis of Intermediate 1

Intermediate 1 may be synthesized by Reaction 1-1 below.

Reaction 1-1

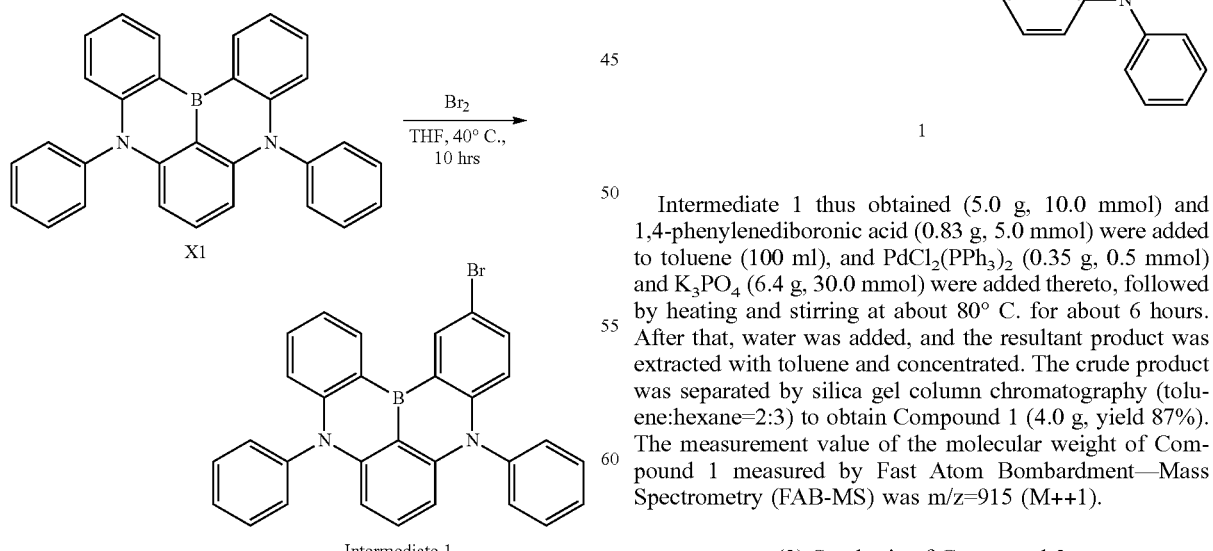

Compound X1 (5,9-diphenyl-5,9-dihydro-5,9-diaza-13b-boranaphtho[3,2,1-de]anthracene) (9.5 g, 22.6 mmol) was dissolved in THF (300 ml), and bromine (3.61 g, 22.6 mmol) was added thereto at about 40° C., followed by stirring for about 10 hours. After finishing the reaction, the resultant product was concentrated, filtered, and separated by silica gel column chromatography (toluene:hexane=2:3) to obtain Intermediate 1 (10.17 g, yield 90%).

Synthesis of Compound 1

Compound 1 may be synthesized by Reaction 1-2 below.

Intermediate 1 thus obtained (5.0 g, 10.0 mmol) and 1,4-phenylenediboronic acid (0.83 g, 5.0 mmol) were added to toluene (100 ml), and PdCl$_2$(PPh$_3$)$_2$ (0.35 g, 0.5 mmol) and K$_3$PO$_4$ (6.4 g, 30.0 mmol) were added thereto, followed by heating and stirring at about 80° C. for about 6 hours. After that, water was added, and the resultant product was extracted with toluene and concentrated. The crude product was separated by silica gel column chromatography (toluene:hexane=2:3) to obtain Compound 1 (4.0 g, yield 87%). The measurement value of the molecular weight of Compound 1 measured by Fast Atom Bombardment—Mass Spectrometry (FAB-MS) was m/z=915 (M++1).

(2) Synthesis of Compound 2

Compound 2 according to an embodiment may be synthesized by, for example, Reaction 2 below.

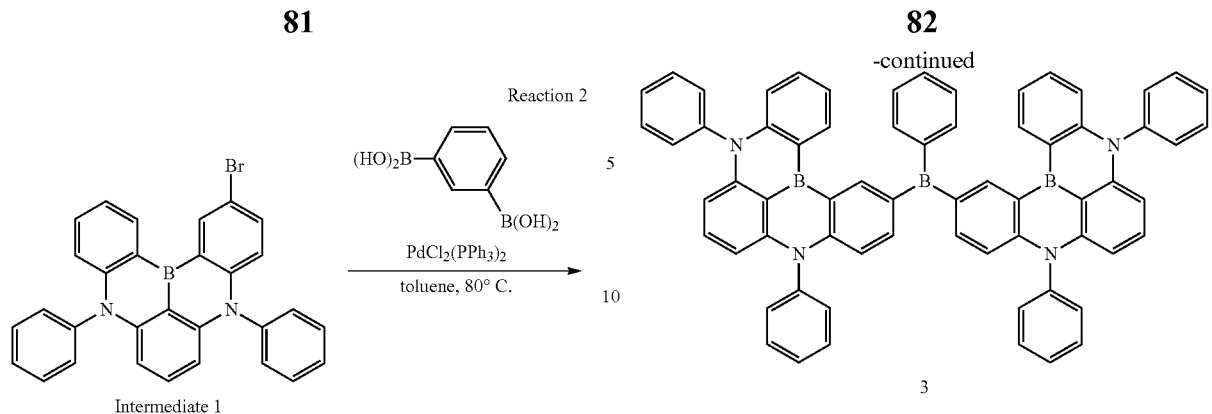

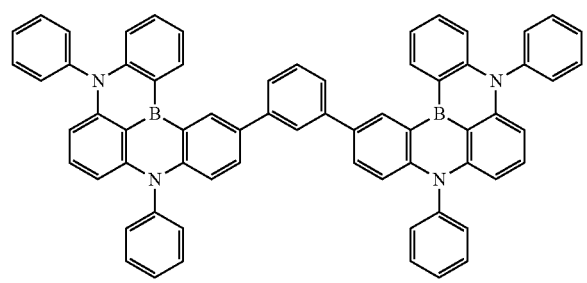

Intermediate 1 (5.0 g, 10.0 mmol) and 1,3-phenylenediboronic acid (0.83 g, 5.0 mmol) were added to toluene (100 ml), and PdCl₂ (PPh₃)₂ (0.35 g, 0.5 mmol) and K₃PO₄ (6.4 g, 30.0 mmol) were added thereto, followed by heating and stirring at about 80° C. for about 6 hours. After that, water was added, and the resultant product was extracted with toluene and concentrated. The product was separated by silica gel column chromatography (toluene:hexane=2:3) to obtain Compound 2 (3.8 g, yield 83%). The measurement value of the molecular weight of Compound 2 measured by FAB-MS was m/z=915 (M++1).

(3) Synthesis of Compound 3

Compound 3 according to an embodiment may be synthesized by, for example, Reaction 3 below.

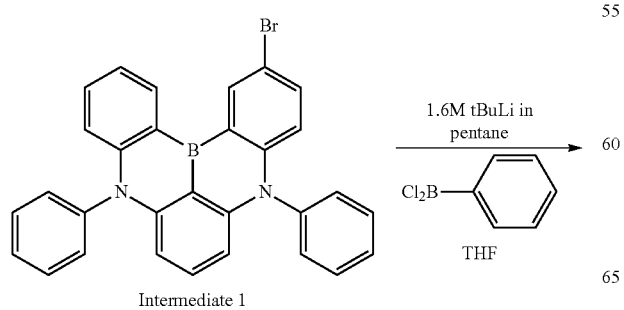

Intermediate 1 (4.0 g, 9.0 mmol) was added to THF (100 ml), and 1.6 M ᵗBuLi (a pentane solution, 11.2 ml, 17.9 mmol) was added thereto dropwisely at about −30° C. The temperature was increased to room temperature again, stirring was performed for about 2 hours, the temperature was cooled to about −78° C. again, and a THF solution (20 ml) of PhBCl₂ was added thereto dropwisely. The temperature was increased to room temperature again, stirring was performed for about 3 hours, and N,N-diisopropylethylamine (3.1 ml, 17.9 mmol) was added, followed by stirring overnight. Water and toluene were added to the reaction product and liquids were separated. An organic layer was concentrated and separated by silica gel column chromatography (toluene:hexane=1:1) to obtain Compound 3 (1.8 g, yield 48%). The measurement value of the molecular weight of Compound 3 measured by FAB-MS was m/z=927 (M⁺+1).

(4) Synthesis of Compound 4

Compound 4 according to an embodiment may be synthesized by, for example, Reaction 4 below.

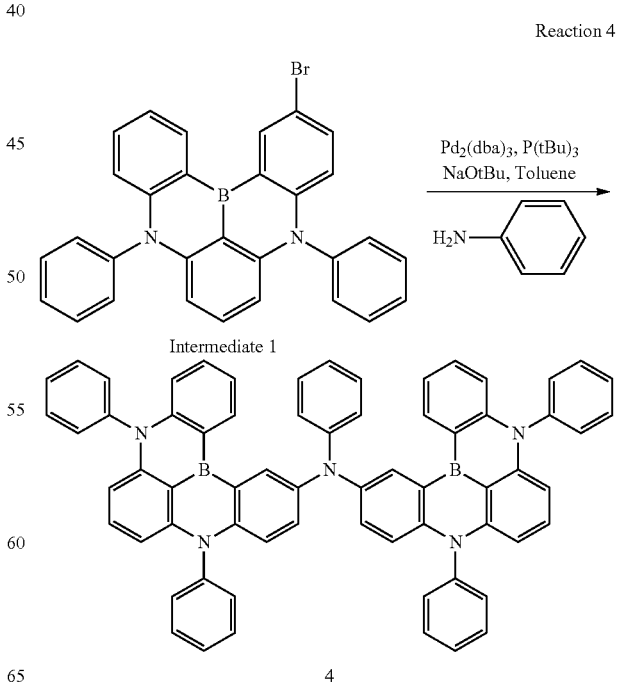

Intermediate 1 (2.5 g, 5.0 mmol), aniline (0.23 g, 2.5 mmol), Pd$_2$(dba)$_3$ (91.7 mg, 0.1 mmol), P($^t$Bu)$_3$HBF$_4$ (36.1 mg, 0.2 mmol), $^t$BuONa (1.13 g, 11.8 mmol) were added to toluene (50 ml), followed by stirring at about 100° C. for about 8 hours. Then, water was added, and liquid layers were separated. An organic layer was separated and concentrated. The crude product was separated by silica gel column chromatography (toluene:hexane=1:1) to obtain Compound 4 (1.86 g, yield 80%). The measurement value of the molecular weight of Compound 4 measured by FAB-MS was m/z=930 (M$^+$+1).

(5) Synthesis of Compound 5

Compound 5 according to an embodiment may be synthesized by, for example, Reaction 5 below.

Reaction 5

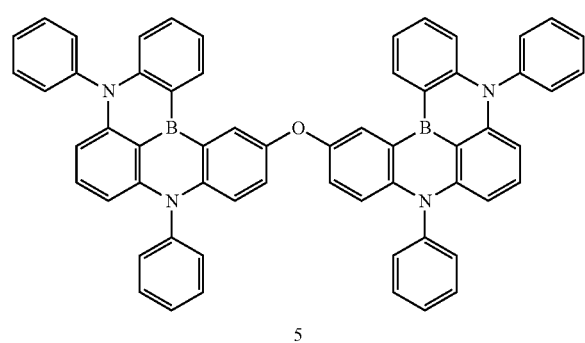

Intermediate 1

Intermediate 1 (3.0 g, 6.0 mmol), Pd$_2$(dba)$_3$ (110 mg, 0.12 mmol), P($^t$Bu)$_3$HBF$_4$ (43.3 mg, 0.24 mmol), K$_3$PO$_4$·H$_2$O (4.14 g, 18 mmol) were stirred at about 100° C. for about 24 hours. Then, water was added, and liquid layers were separated. An organic layer was separated and concentrated. The crude product was separated by silica gel column chromatography (toluene:hexane=1:1) to obtain Compound 5 (1.30 g, yield 51%). The measurement value of the molecular weight of Compound 5 measured by FAB-MS was m/z=855 (M$^+$+1).

(6) Synthesis of Compound 6

Compound 6 according to an embodiment may be synthesized by, for example, Reaction 6 below.

Reaction 6

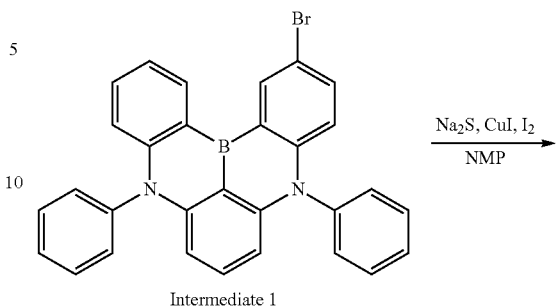

Intermediate 1

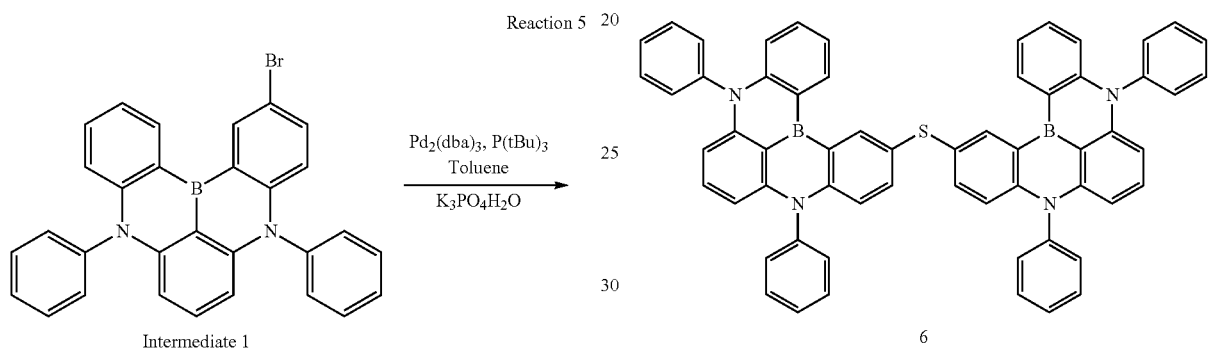

6

Intermediate 1 (5.0 g, 10 mmol), Na$_2$S (3.9 g, 50 mmol), CuI (0.19 g, 1.0 mmol) and I$_2$ (a small amount) were added to NMP (50 ml), followed by stirring at about 200° C. for about 48 hours. Then, water was added, and liquid layers were separated. An organic layer was separated and concentrated. The crude product was separated by silica gel column chromatography (toluene:hexane=1:1) to obtain Compound 6 (1.30 g, yield 30%). The measurement value of the molecular weight of Compound 6 measured by FAB-MS was m/z=871 (M$^+$+1).

(7) Synthesis of Compound 7

Compound 7 according to an embodiment may be synthesized by, for example, Reaction 7 below.

Reaction 7

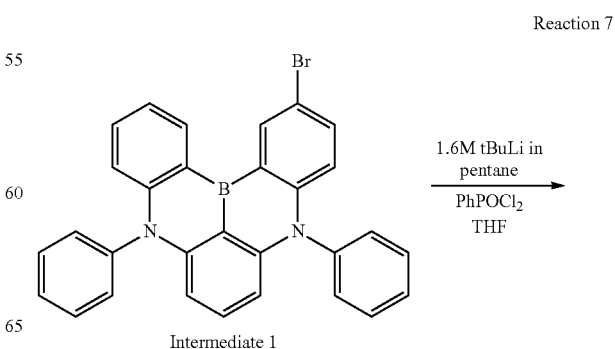

Intermediate 1

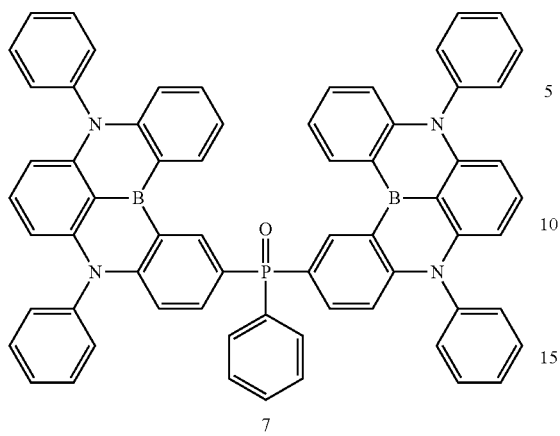

7

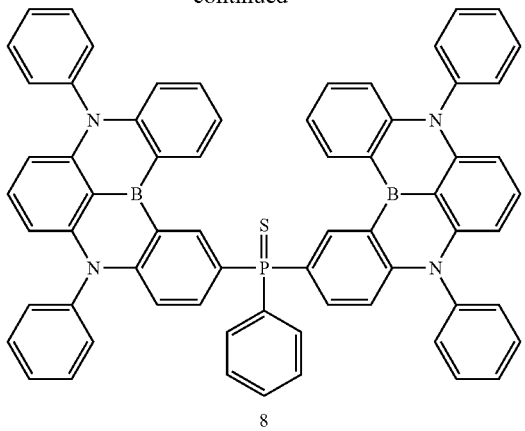

8

Intermediate 1 (8.0 g, 16 mmol) was added to tBuPh (100 ml), and 1.6 M ᵗBuLi (a pentane solution, 22.4 ml, 35.8 mmol) was added thereto dropwisely at about −30° C. The temperature was increased to room temperature again, stirring was performed for about 2 hours, the temperature was cooled to about −78° C. again, and PhPOCl$_2$ (3.5 g, 17.5 mmol) was added thereto dropwisely, followed by stirring overnight. Water and toluene were added to the reaction solution and liquid layers were separated. An organic layer was concentrated and separated by silica gel column chromatography (toluene:hexane=1:1) to obtain Compound 7 (4.0 g, yield 52%). The measurement value of the molecular weight of Compound 7 measured by FAB-MS was m/z=963 (M$^+$+1).

(8) Synthesis of Compound 8

Compound 8 according to an embodiment may be synthesized by, for example, Reaction 8 below.

Reaction 8

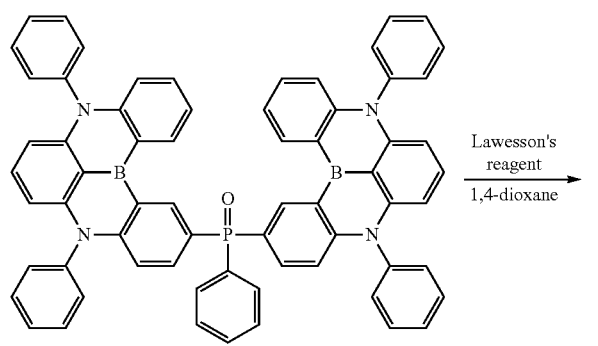

7

Compound 7 (3.0 g, 3.1 mmol) synthesized from Reaction 7 was added to 1,4-dioxane (50 ml), and Lawesson's reagent (1.89 g, 4.67 mmol) was added thereto, followed by heating and refluxing the mixture for about 60 hours. Water and toluene were added to the reaction solution and liquid layers were separated. An organic layer was concentrated and separated by silica gel column chromatography (toluene:hexane=1:1) to obtain Compound 8 (1.1 g, yield 35%). The measurement value of the molecular weight of Compound 8 measured by FAB-MS was m/z=979 (M$^+$+1).

(9) Synthesis of Compound 9

Compound 9 according to an embodiment may be synthesized by, for example, Reaction 9 below.

Reaction 9

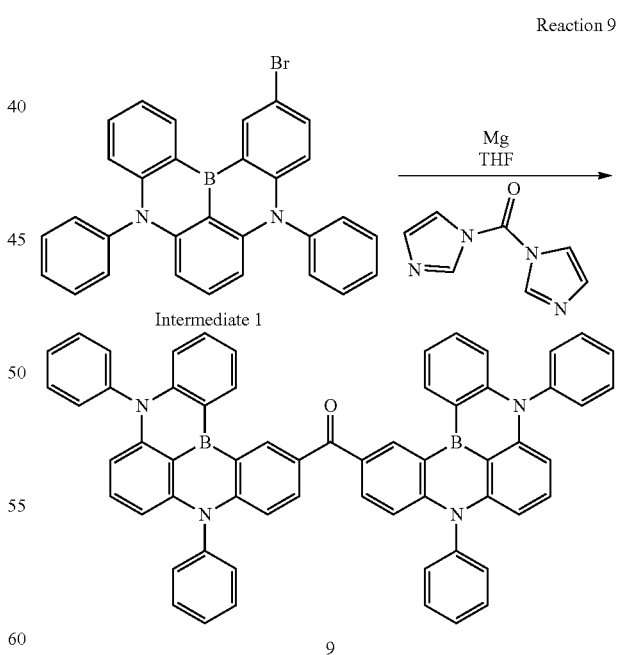

9

Intermediate 1 (8.0 g, 16 mmol) and Mg (0.39 g, 16 mmol) were added to THF and stirred at room temperature for about 1 hour. The reaction solution was added to a THF solution (100 ml) of 1,1'-carbonyldiimidazole (8.57 g, 52.9 mmol) dropwisely. After standing for cooling for about 12 hours, an aqueous NH₄Cl solution was added to the reaction solution, extraction was conducted with ethyl acetate, and an organic layer was concentrated. The crude product was separated by silica gel column chromatography (toluene:hexane=1:1) to obtain Compound 9 (1.1 g, yield 36%). The measurement value of the molecular weight of Compound 9 measured by FAB-MS was m/z=867 (M⁺+1).

(10) Synthesis of Compound 10

Compound 10 according to an embodiment may be synthesized by, for example, Reaction 10-1 to Reaction 10-3 below.

Synthesis of Intermediate 2

Intermediate 2 may be synthesized by the following Reaction 10-1:

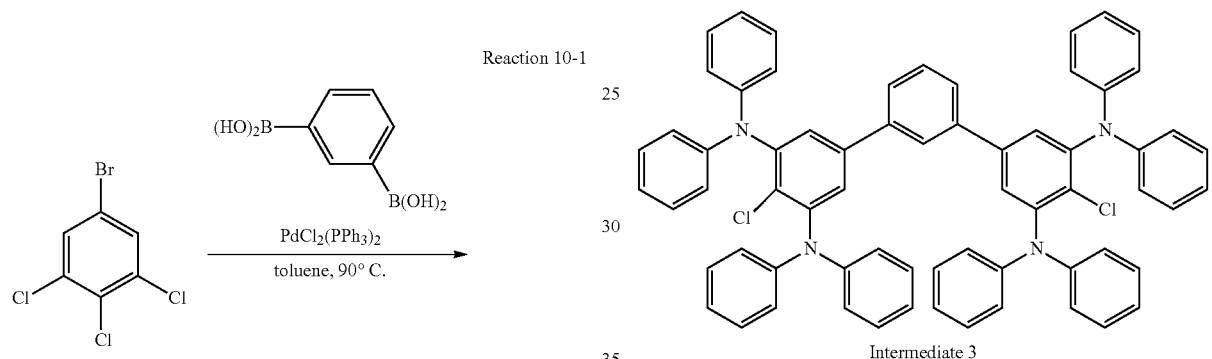

5-bromo-1,2,3-trichlorobenzene and 1,3-phenylenediboronic acid (0.83 g, 5.0 mmol) were added to toluene (100 ml), and PdCl₂ (PPh₃)₂ (0.35 g, 0.5 mmol) and K₃PO₄ (6.4 g, 30.0 mmol) were added thereto, followed by heating and stirring at about 90° C. for about 6 hours. After that, water was added, the resultant product was extracted with toluene and concentrated. The crude product was separated by silica gel column chromatography (toluene:hexane=2:3) to obtain Intermediate 2 (yield 70%).

Synthesis of Intermediate 3

Intermediate 3 may be synthesized by the following Reaction 10-2:

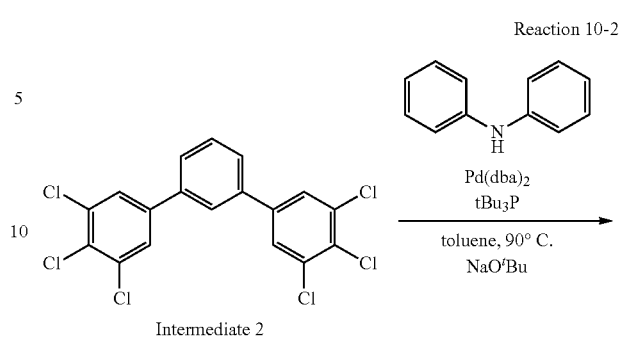

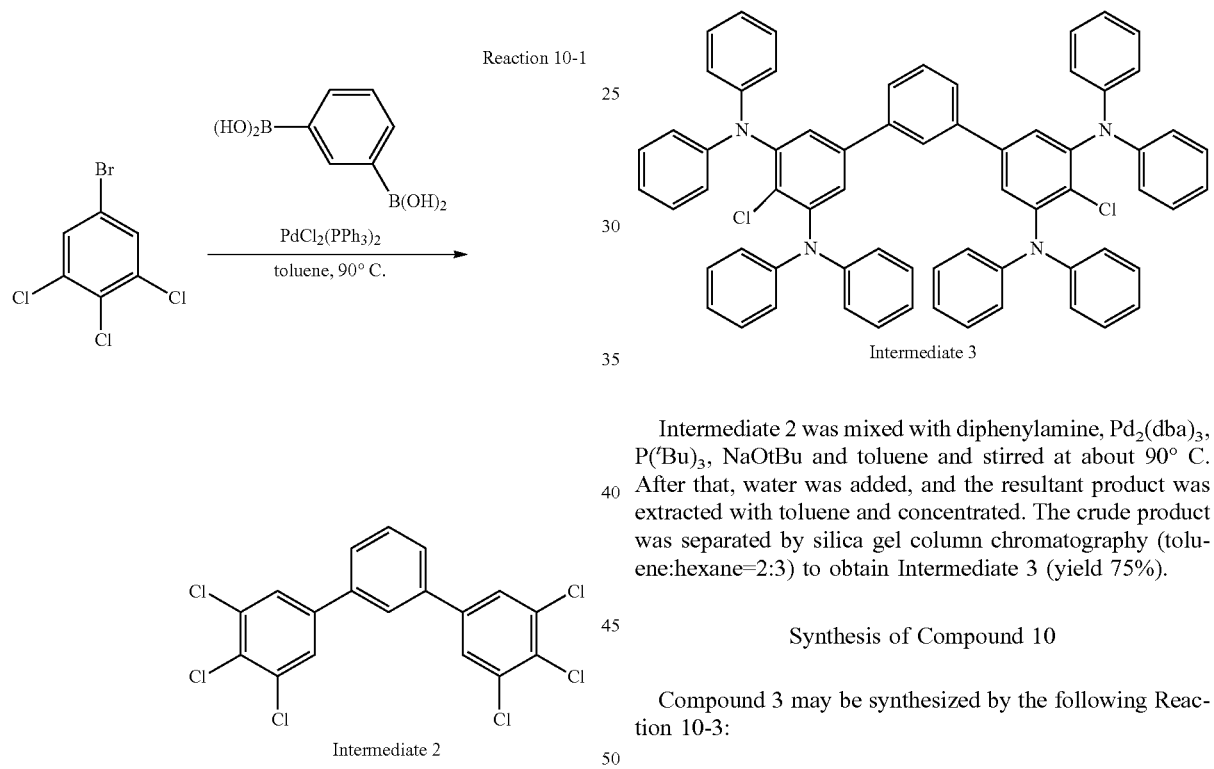

Intermediate 2 was mixed with diphenylamine, Pd₂(dba)₃, P(ᵗBu)₃, NaOtBu and toluene and stirred at about 90° C. After that, water was added, and the resultant product was extracted with toluene and concentrated. The crude product was separated by silica gel column chromatography (toluene:hexane=2:3) to obtain Intermediate 3 (yield 75%).

Synthesis of Compound 10

Compound 3 may be synthesized by the following Reaction 10-3:

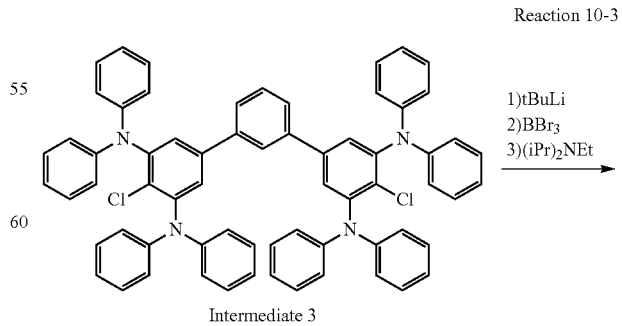

-continued

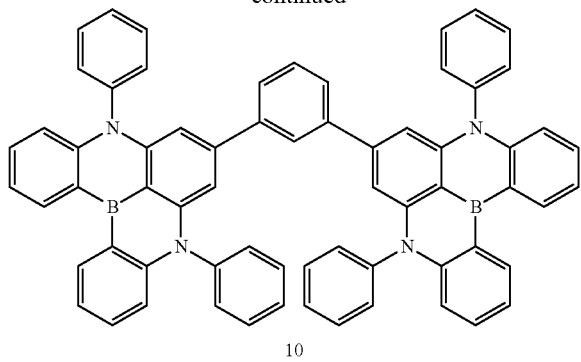

10

To a flask containing Intermediate 3 and tert-butylbenzene, under a nitrogen atmosphere, a 1.7 M tert-butyllithium pentane solution was added at about −30° C. After finishing dropwise addition, the temperature was increased to about 60° C. and stirring was performed for about 2 hours. Components having a boiling point lower than that of tert-butylbenzene were distilled off under a reduced pressure. The temperature was cooled to about −30° C., boron tribromide was added, the temperature was increased to room temperature, and stirring was performed for about 0.5 hours. After that, the temperature was cooled to about 0° C. again, N,N-diisopropylethylamine was added, stirring was performed at room temperature until mixture was cooled, and the temperature was increased to about 120° C., followed by heating and stirring for about 3 hours. The reaction solution was cooled to room temperature, an aqueous sodium acetate solution, which was cooled in an ice bath, and then heptane were added thereto, and liquid layers were separated. Then, the crude product was separated by silica gel column chromatography (toluene:hexane=2:3) to obtain Compound 10 (yield 13%). The measurement value of the molecular weight of Compound 10 measured by FAB-MS was m/z=915 (M$^+$+1).

In the above-described synthetic examples, the synthetic methods of Compound 1 and Compound 10 and the synthesis of the intermediate compounds were conducted referring to a published patent document, WO 2016-152544, which is incorporated herein in its entirety by reference.

2. Evaluation of Polycyclic Compound and Manufacture and Evaluation Organic Electroluminescence Device Evaluation on the fluorescence-emitting properties of the polycyclic compound of an embodiment and the organic electroluminescence device of an embodiment including the polycyclic compound of an embodiment in an emission layer, was conducted by methods described below. The manufacturing method of an organic electroluminescence device for the device evaluation is described below.

Organic electroluminescence devices of Example 1 to Example 10 were manufactured using the polycyclic compounds of Compounds 1 to 10 as dopant materials for an emission layer, respectively. In addition, the organic electroluminescence devices of Comparative Examples were manufactured using Comparative Compounds X-1 to X-6 as dopant materials of an emission layer, respectively.

The Comparative Compounds used in the Comparative Examples are as follows:

X-1

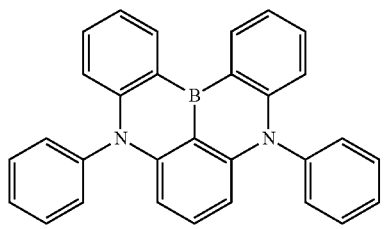

X-2

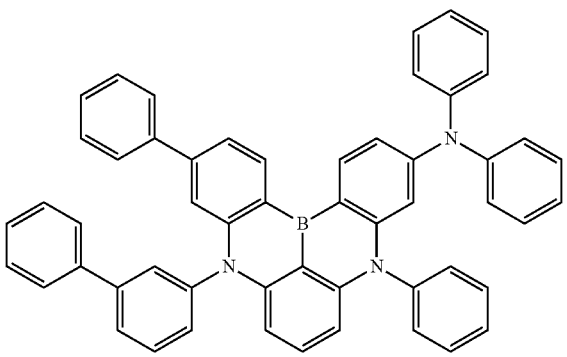

X-3

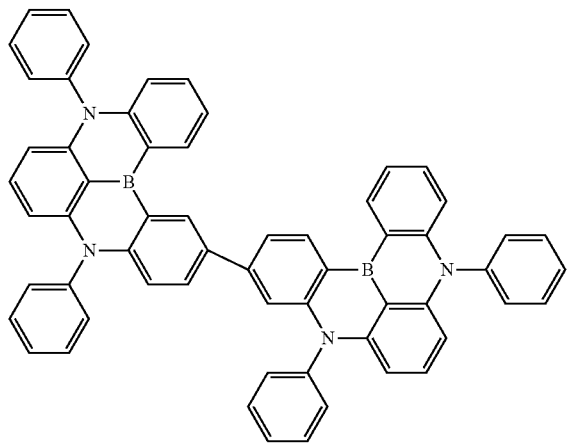

X-4

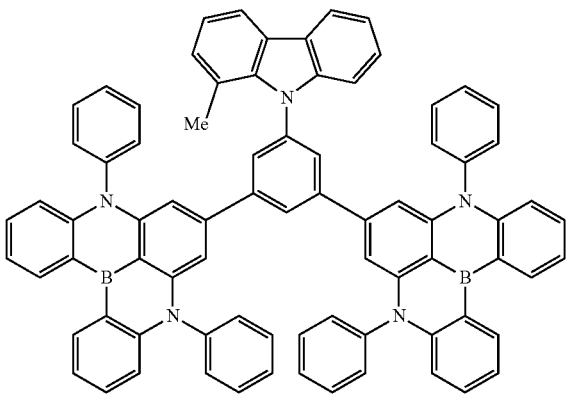

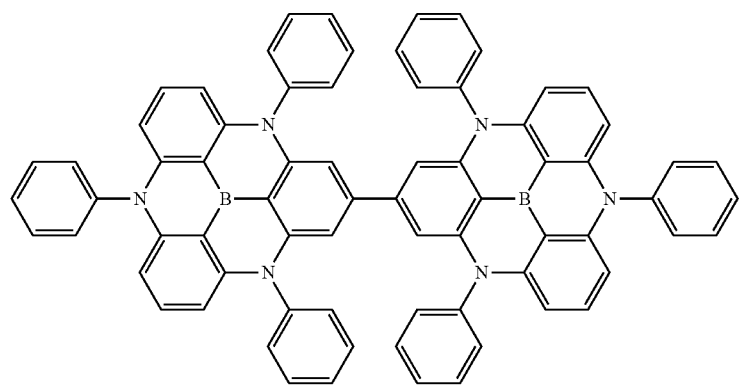

X-5

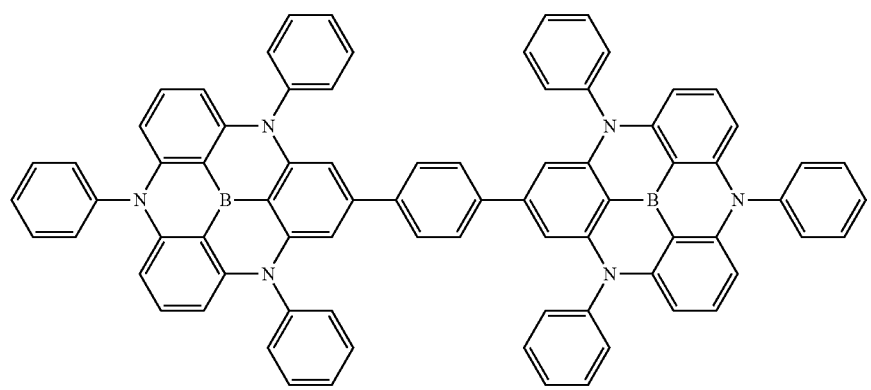

X-6

Evaluation of Light-Emitting Properties of Compound 5.0 mM of a toluene solution was prepared using each of the Example Compounds and Comparative Compounds, and light-emitting properties were evaluated using JASCO V-670 spectrometer. Emission spectrum was measured at room temperature and 77K. In Table 20, the maximum emission wavelength Amax in the emission spectrum and a full width at half maximum (FWHM) in the emission spectrum measured at room temperature are shown. In addition, the Ti level was calculated from the onset value of the emission spectrum at 77K.

TABLE 20

| Compound | $\lambda_{max}$ (nm) | FWHM (nm) | $T_1$ level (eV) |
| --- | --- | --- | --- |
| Compound 1 | 466 | 24.8 | 2.57 |
| Compound 2 | 465 | 25.8 | 2.58 |
| Compound 3 | 438 | 22.3 | 2.74 |
| Compound 4 | 458 | 26.7 | 2.56 |
| Compound 5 | 465 | 26.8 | 2.57 |
| Compound 6 | 464 | 26.6 | 2.58 |
| Compound 7 | 447 | 35.5 | 2.75 |
| Compound 8 | 453 | 38.6 | 2.73 |
| Compound 9 | 466 | 33.6 | 2.63 |
| Compound 10 | 463 | 29.0 | 2.63 |
| Comparative Compound X-1 | 459 | 28 | 2.58 |
| Comparative Compound X-2 | 467 | 28 | 2.56 |
| Comparative Compound X-3 | 464 | 25.7 | 2.58 |
| Comparative Compound X-4 | 468 | 35 | 2.53 |
| Comparative Compound X-5 | 432 | 43 | 2.72 |
| Comparative Compound X-6 | 445 | 46 | 2.68 |

Referring to the results of Table 20, the polycyclic compounds of the Examples showed the maximum light-emitting wavelength of about 470 nm or less, and from this result, it may be concluded that deep blue light was emitted. In addition, the polycyclic compounds of the Examples were found to show similar light-emitting wavelength and a T1 level as Comparative Compounds X-1 and X-2, which had only one polycyclic aromatic group. The polycyclic compounds of the Examples exhibited a T1 level of about 2.5 eV or more, and by having a high T1 level, the emission of thermally activated delayed fluorescence is considered possible.

Manufacture of Organic Electroluminescence Device

On a glass substrate, ITO with a thickness of about 1,500 Å was patterned and washed with ultra-pure water, cleaned with ultrasonic waves, exposed to UV for about 30 minutes and treated with ozone. Then, HAT-CN was deposited to a thickness of about 100 Å, α-NPD was deposited to about 800 Å, and mCP was deposited to a thickness of about 50 Å to form a hole transport region.

Then, the polycyclic compound of an embodiment (or the Comparative Compound) and mCBP were co-deposited in a ratio of 1:99 to form an emission layer to a thickness of about 200 Å. In more detail, the emission layer formed by mixing and depositing one of Compound 1 to Compound 10 with mCBP in Example 1 to Example 10, respectively, or by mixing and depositing one of Comparative Compounds X-1 to X-6 with mCBP in Comparative Example 1 to Comparative Example 6, respectively.

After that, on the emission layer, a layer with a thickness of about 300 Å was formed using TPBi, and a layer with a thickness of about 50 Å was formed using Liq to form an electron transport region. Then, a second electrode with a thickness of about 1,000 Å was formed using aluminum (A1).

In the Examples, the hole transport region, the emission layer, the electron transport region, and the second electrode were formed using a vacuum deposition apparatus.

Evaluation of Properties of Organic Electroluminescence Device

In Table 21, the evaluation results on the organic electroluminescence devices of Example 1 to Example 10, and Comparative Example 1 to Comparative Example 6 are shown. In Table 21, the maximum light-emitting wavelength ($\lambda_{max}$), and external quantum efficiency ($EQE_{max}$, $EQE_{max, 1000\ nit}$) of the organic electroluminescence devices thus manufactured were compared and are shown. In the evaluation results of the properties of the Examples and the Comparative Examples shown in Table 21, the maximum light-emitting wavelength ($\lambda_{max}$) represents a wavelength showing the maximum value in the emission spectrum, $EQE_{max}$ among the external quantum efficiency represents the maximum value of the external quantum yield, and the external quantum efficiency $EQE_{max, 1000\ nit}$ represents the yield at a point where luminance is 1,000 cd/m².

TABLE 21

| Example | Dopant material | $\lambda_{max}$ (nm) | $EQE_{max}$ (%) | $EQE_{max, 1000nit}$ (%) |
|---|---|---|---|---|
| Example 1 | Compound 1 | 468 | 17.8 | 12.7 |
| Example 2 | Compound 2 | 466 | 20.8 | 13.3 |
| Example 3 | Compound 3 | 445 | 16.3 | 11.4 |
| Example 4 | Compound 4 | 460 | 16.2 | 11.0 |
| Example 5 | Compound 5 | 467 | 18.3 | 12.4 |
| Example 6 | Compound 6 | 470 | 15.9 | 8.2 |
| Example 7 | Compound 7 | 445 | 10.3 | 5.3 |
| Example 8 | Compound 8 | 450 | 12.3 | 8.9 |
| Example 9 | Compound 9 | 463 | 12.7 | 9.3 |
| Example 10 | Compound 10 | 465 | 17.5 | 10.2 |
| Comparative Example 1 | Comparative Compound X-1 | 459 | 13.2 | 5.4 |
| Comparative Example 2 | Comparative Compound X-2 | 467 | 14.2 | 6.4 |
| Comparative Example 3 | Comparative Compound X-3 | 464 | 7.2 | 2.7 |
| Comparative Example 4 | Comparative Compound X-4 | 470 | 7.1 | 4.1 |
| Comparative Example 5 | Comparative Compound X-5 | 464 | 3.2 | 1.6 |
| Comparative Example 6 | Comparative Compound X-6 | 470 | 4.8 | 1.2 |

Referring to the results of Table 21, it was confirmed that the organic electroluminescence devices of Example 1 to Example 10 showed excellent maximum emission efficiency properties when compared with the organic electroluminescence devices of Comparative Example 3 to Comparative Example 6.

The Example Compounds used in Examples 1, 2 and 10 (Compounds 1, 2, and 10) had a connected structure including two of the moiety of Comparative Compound X-1 used in Comparative Compound 1. The two moieties in the Example Compounds were connected using an arylene group linker. Examples 1, 2 and 10 were found to emit light in a wavelength region which is similar to that of Comparative Example 1, and showed improved emission efficiency properties as compared with Comparative Example 1. As such, it is believed that the Example Compounds of the present disclosure, which had a connected structure of two aromatic groups connected via a linker showed improved emission efficiency without affecting an emission wavelength or full width at half maximum as compared with a compound having one aromatic group.

Meanwhile, the $EQE_{max, 1000\ nit}$ values of Comparative Example 1 to Comparative Example 6 were markedly low when compared with those of Example 1 to Example 10. It is believed that the Example Compounds of the present disclosure showed excellent thermal stability and reliability properties when compared with Comparative Compounds X-3 to X-6, which had two aromatic groups, as well as with Comparative Compounds including only one aromatic group.

Comparative Compound X-4 used in Comparative Example 4 had a connected structure of two aromatic groups by a linker, but had a structure in which phenylene group linker was substituted with a carbazole group, and was confirmed to show lower emission efficiency properties when compared with Example 10. It is believed that in Comparative Compound X-4, light could not be emitted due to the rotation and/or vibration of the carbazole group which was substituted on the phenylene group, and energy was dissipated to degrade emission efficiency.

The polycyclic compound of an embodiment has a connected structure of two aromatic groups connected via a linker and may show improved emission efficiency properties when compared with a compound structure having one aromatic group, while maintaining emission wavelength properties and color purity properties of the aromatic group. The organic electroluminescence device of an embodiment includes the polycyclic compound of an embodiment in an emission layer, thereby achieving narrow full width at half maximum in a blue emission wavelength region and showing excellent color properties and high emission efficiency properties.

The organic electroluminescence device of an embodiment may show improved device characteristics with a high efficiency in a blue wavelength region.

The polycyclic compound of an embodiment is included in an emission layer of an organic electroluminescence device and may contribute to increasing the efficiency of the organic electroluminescence device.

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all subranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Although the example embodiments of the present disclosure have been described, it is understood that the present disclosure should not be limited to these example embodiments but various changes and modifications can be made by one ordinary skilled in the art within the spirit and scope of the present disclosure as hereinafter claimed by the following claims and their equivalents.

What is claimed is:

1. An organic electroluminescence device, comprising:
a first electrode;
a second electrode on the first electrode; and
an emission layer between the first electrode and the second electrode, the emission layer comprising a polycyclic compound represented by Formula 1,
wherein the first electrode and the second electrode are each independently comprise at least one selected from Ag, Mg, Cu, Al, Pt, Pd, Au, Ni, Nd, Ir, Cr, Li, Ca, LiF/Ca, LiF/Al, Mo, Ti, In, Sn, and Zn, a compound of two or more selected from Ag, Mg, Cu, Al, Pt, Pd, Au, Ni, Nd, Ir, Cr, Li, Ca, LiF/Ca, LiF/Al, Mo, Ti, In, Sn, and Zn, a mixture of two or more selected from Ag, Mg, Cu, Al, Pt, Pd, Au, Ni, Nd, Ir, Cr, Li, Ca, LiF/Ca, LiF/Al, Mo, Ti, In, Sn, and Zn, or an oxide thereof:

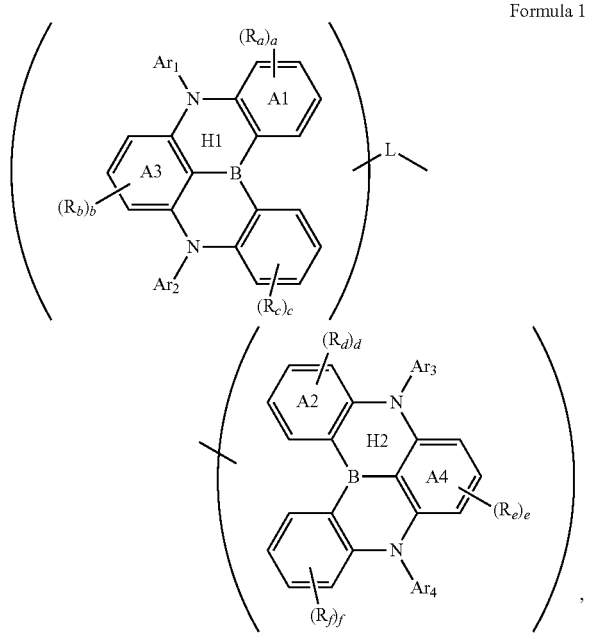

Formula 1 and wherein, in Formula 1,
Ar$_1$ to Ar$_4$ are each independently a substituted or unsubstituted aryl group of 6 to 30 ring-forming carbon atoms,
R$_a$ to R$_f$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group,
"a", "c", "d", and "f" are each independently an integer of 0 to 4, "b" and "e" are each independently an integer of 0 to 3,
ring A1 and ring A2 are connected via L,
ring A3 and ring A4 are connected via L, or
ring H1 and ring H2 are connected via L, wherein L interconnects Ar$_1$ and Ar$_3$
L is O, S, BR$_p$, NR$_q$, (P=O)R$_s$, (P=S)R$_t$, (C=O), or a substituted or unsubstituted heteroarylene group of 2 to 30 ring-forming carbon atoms, and
R$_p$, R$_q$, R$_s$, and R$_t$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

2. The organic electroluminescence device of claim 1, wherein Ar$_1$ to Ar$_4$ are each independently a substituted or unsubstituted phenyl group.

3. The organic electroluminescence device of claim 1, wherein Formula 1 is represented by any one selected from Formula 1-1 to Formula 1-3:

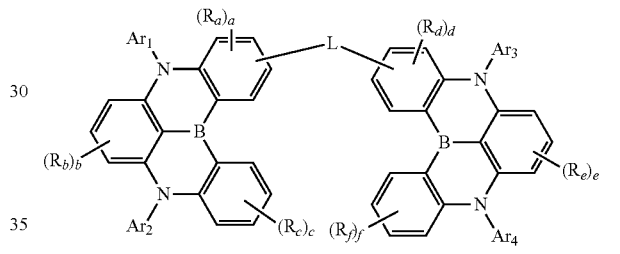

Formula 1-1

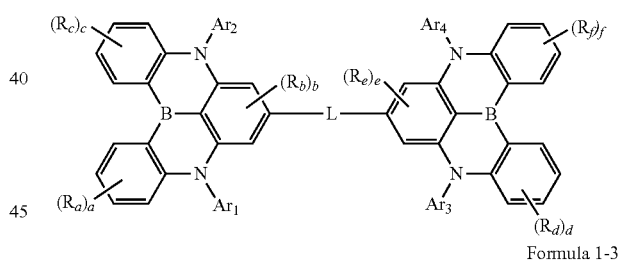

Formula 1-2

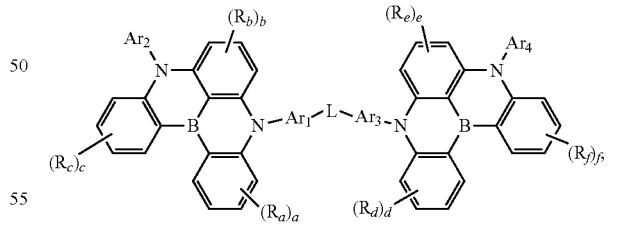

Formula 1-3 wherein, in Formula 1-1 to Formula 1-3,
Ar$_1$ to Ar$_4$, R$_a$ to R$_f$, "a" to "f", and L are the same as defined in Formula 1.

4. The organic electroluminescence device of claim 1, wherein Formula 1 is represented by Formula 2:

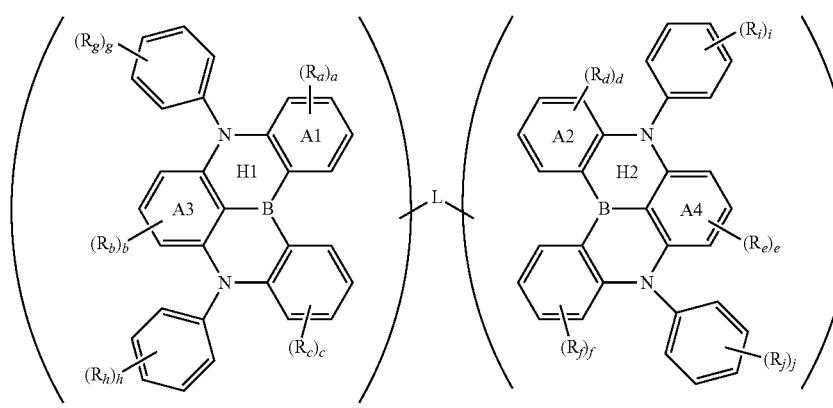

Formula 2 wherein, in Formula 2, $R_g$, $R_h$, $R_i$, and $R_j$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group, ring A1 and ring A2 are connected via L or ring A3 and ring A4 are connected via L, "g", "h", "i", and j" are each independently an integer of 0 to 5, and L, $R_a$ to $R_f$, and "a" to "f" are the same as defined in Formula 1.

5. The organic electroluminescence device of claim 1, wherein the emission layer is to emit delayed fluorescence.

6. The organic electroluminescence device of claim 1, wherein the emission layer comprises a host and a dopant, and the dopant comprises the polycyclic compound.

7. The organic electroluminescence device of claim 1, wherein the emission layer is to emit light with a center wavelength of about 430 nm to about 470 nm.

8. The organic electroluminescence device of claim 3, wherein Formula 1-1 is represented by any one selected from Formula 1-1H to Formula 1-1O:

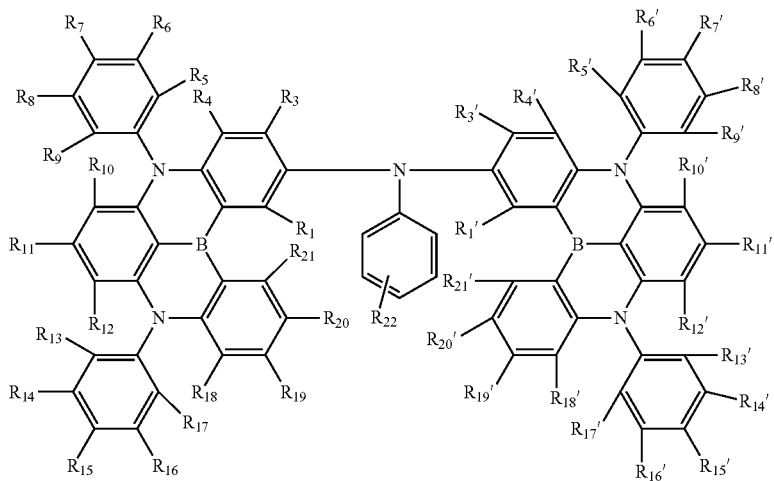

1-1H

-continued
1-1I
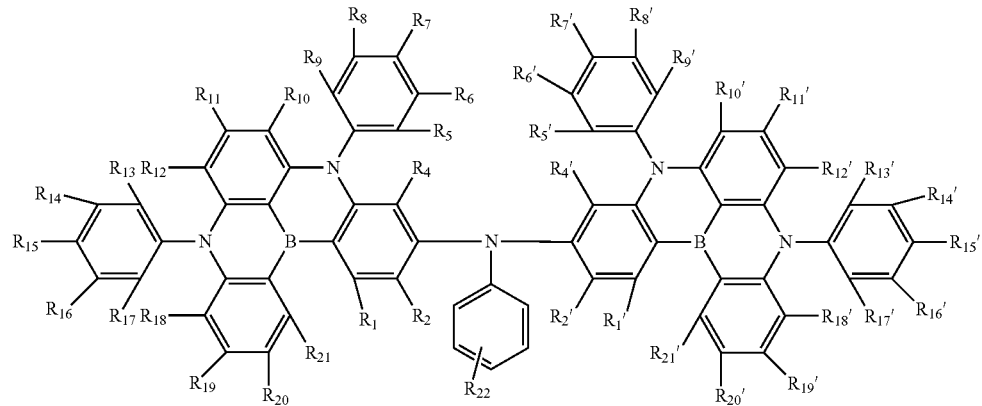
1-1J
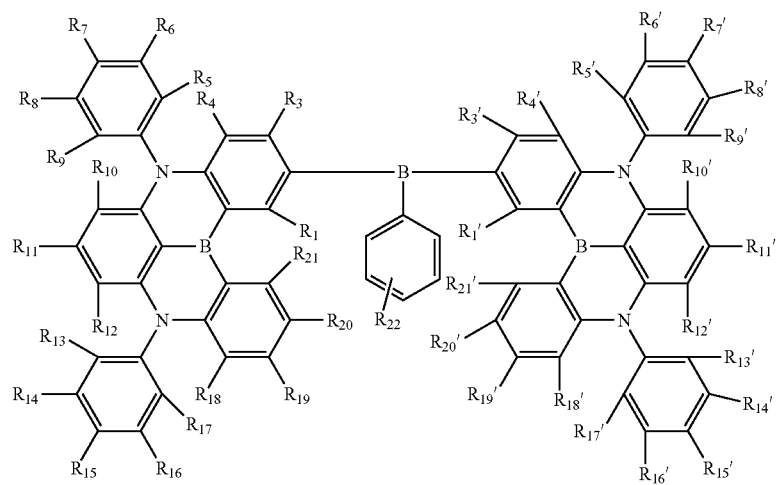
1-1K
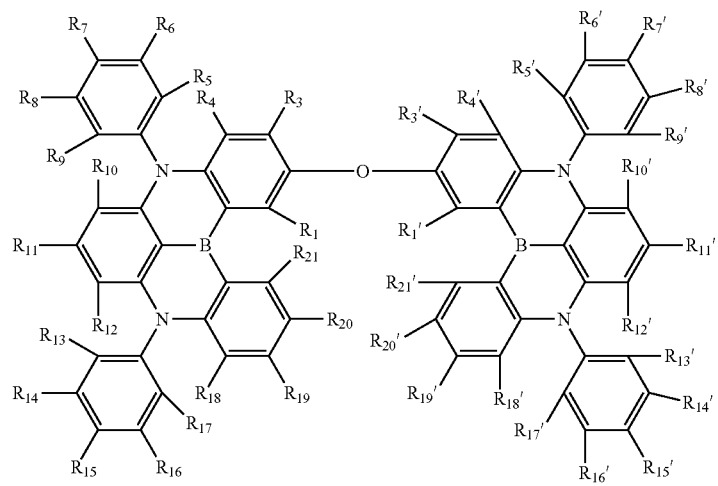

-continued
1-1L
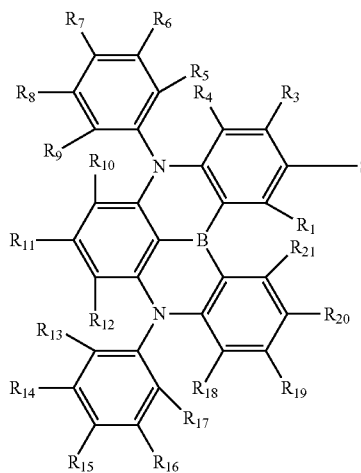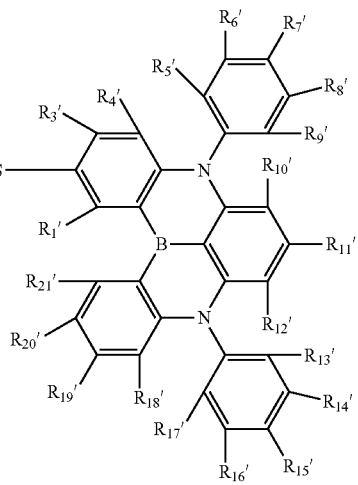
1-1M
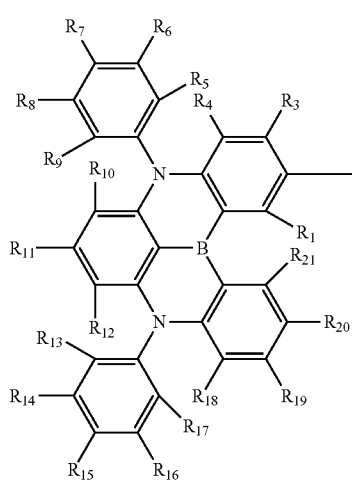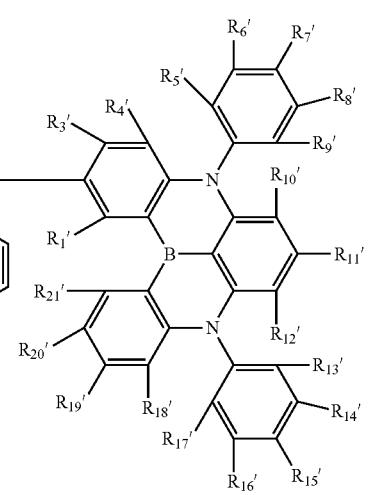
1-1N
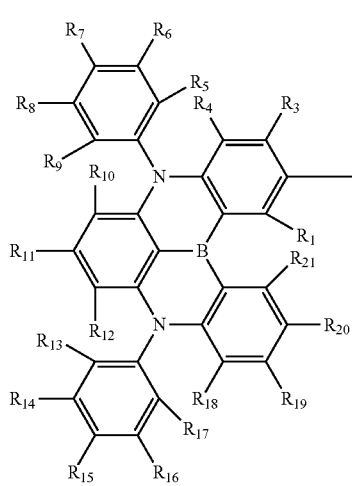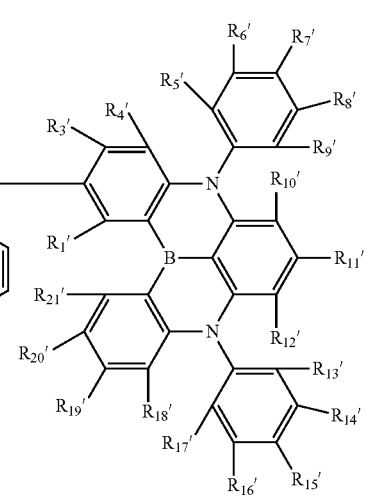

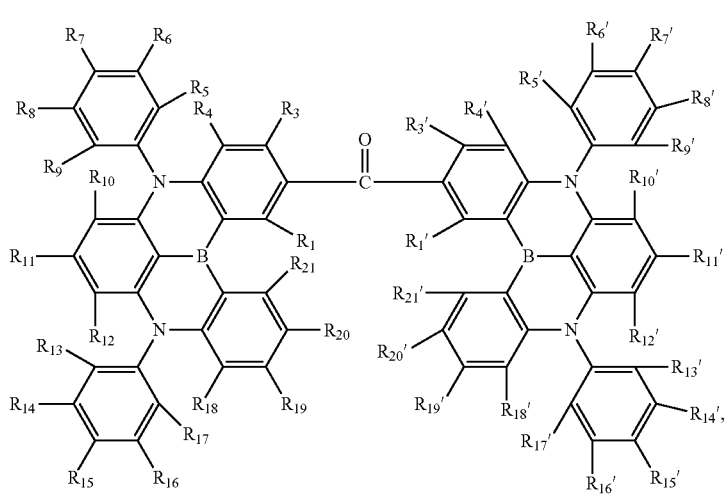

1-1O wherein, in Formula 1-1H to Formula 1-1O,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

9. The organic electroluminescence device of claim 3, wherein Formula 1-2 is represented by Formula 1-2E:

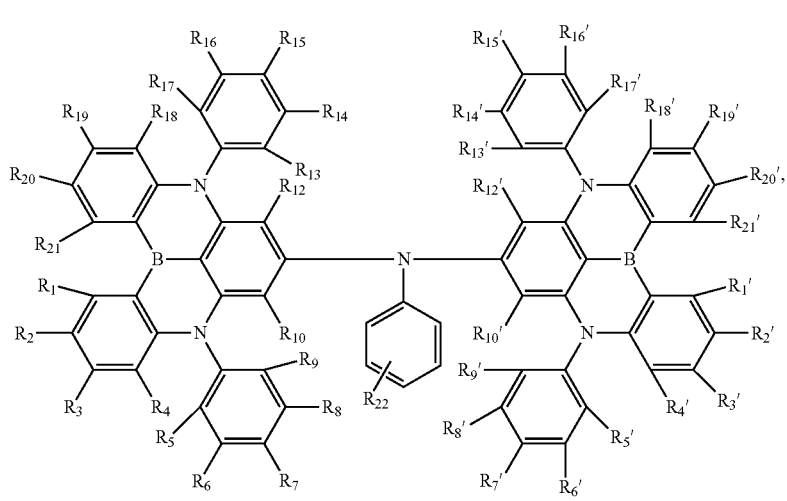

1-2E wherein, in Formula 1-2E,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

10. The organic electroluminescence device of claim 3, wherein Formula 1-3 is represented by Formula 1-3F:

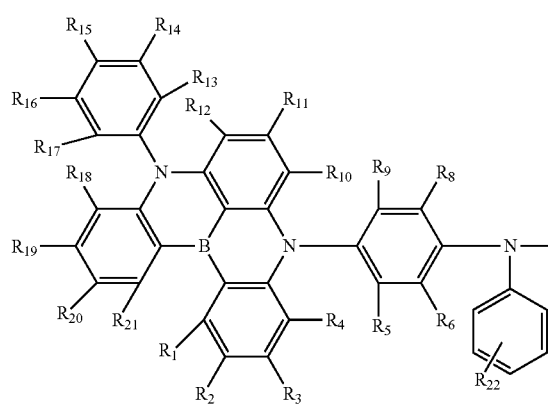
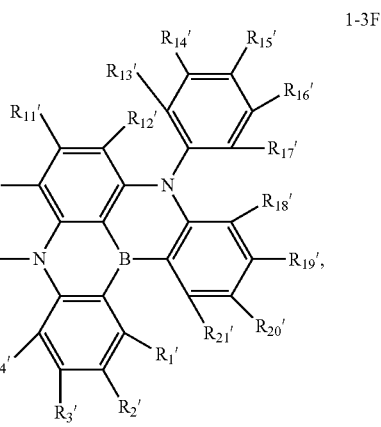

1-3F wherein, in Formula 1-3F,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

11. A polycyclic compound represented by the following Formula 1:

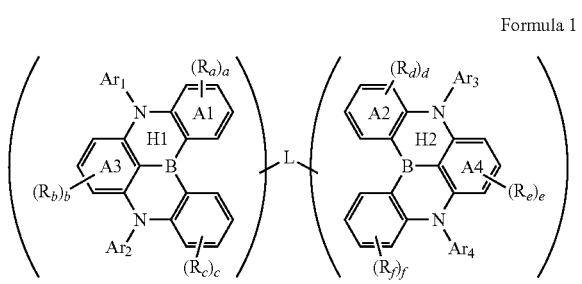

Formula 1 wherein, in Formula 1,
$Ar_1$ to $Ar_4$ are each independently a substituted or unsubstituted aryl group of 6 to 30 ring-forming carbon atoms,
$R_a$ to $R_f$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group,
"a", "c", "d", and "f" are each independently an integer of 0 to 4,
"b" and "e" are each independently an integer of 0 to 3,
ring A1 and ring A2 are connected via L,
ring A3 and ring A4 are connected via L, or
ring H1 and ring H2 are connected via L, wherein L interconnects $Ar_1$ and $Ar_3$
L is O, S, $BR_p$, $NR_q$, $(P=O)R_s$, $(P=S)R_t$, or $(C=O)$, or a substituted or unsubstituted heteroarylene group of 2 to 30 ring-forming carbon atoms, and
$R_p$, $R_q$, $R_s$, and $R_t$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

12. The polycyclic compound of claim 11, wherein $Ar_1$ to $Ar_4$ are each independently a substituted or unsubstituted phenyl group.

13. The polycyclic compound of claim 11, wherein Formula 1 is represented by any one selected from Formula 1-1 to Formula 1-3:

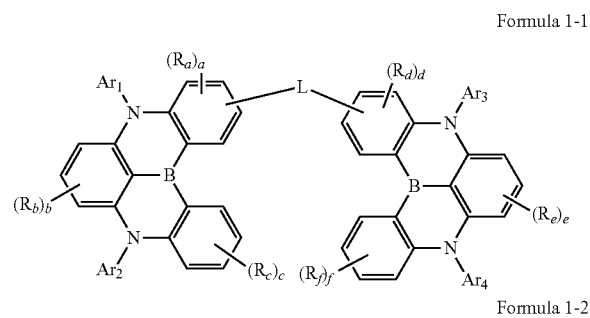

Formula 1-1

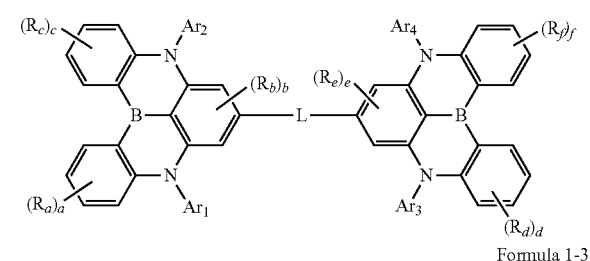

Formula 1-2

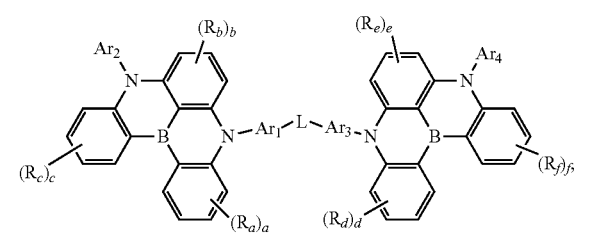

Formula 1-3 wherein, in Formula 1-1 to Formula 1-3,
$Ar_1$ to $Ar_4$, $R_a$ to $R_f$, "a" to "f", and L are the same as defined in Formula 1.

14. The polycyclic compound of claim 11, wherein Formula 1 is represented by the following Formula 2:

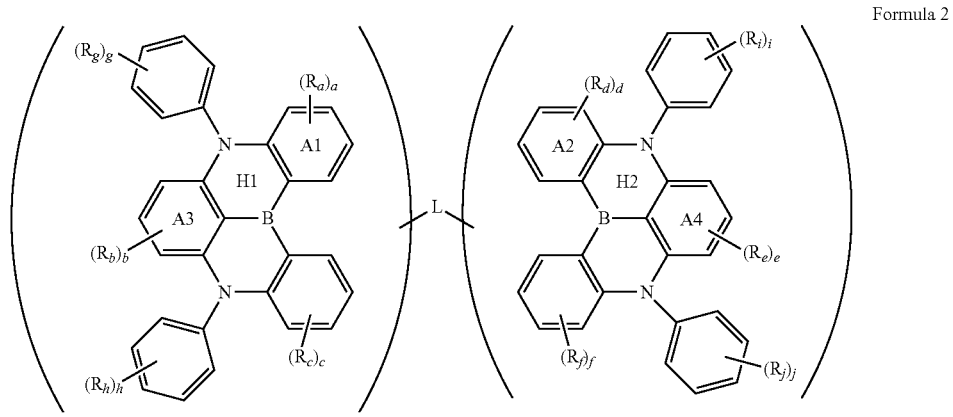

Formula 2 wherein, in Formula 2, $R_g$, $R_h$, $R_i$, and $R_j$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group, ring A1 and ring A2 are connected via L or ring A3 and ring A4 are connected via L, "g", "h", "i", and j" are each independently an integer of 0 to 5, and L, $R_a$ to $R_f$, and "a" to "f" are the same as defined in Formula 1.

15. The polycyclic compound of claim 11, wherein in Formula 1, L is represented by any one selected from Formulae L3 to L9:

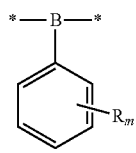

L3

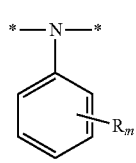

L4

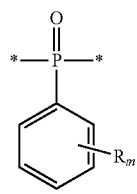

L5

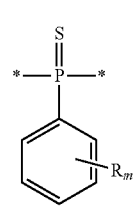

L6

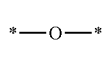

L7

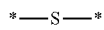

L8

L9 wherein, in Formulae L3 to L9, $R_m$ is a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

16. The polycyclic compound of claim 13, wherein Formula 1-1 is represented by any one selected from Formula 1-1H to Formula 1-1O:

1-1H
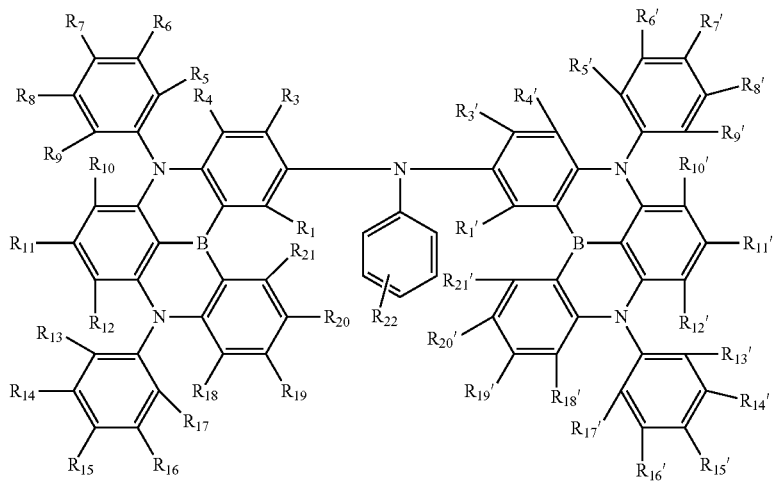
1-1I
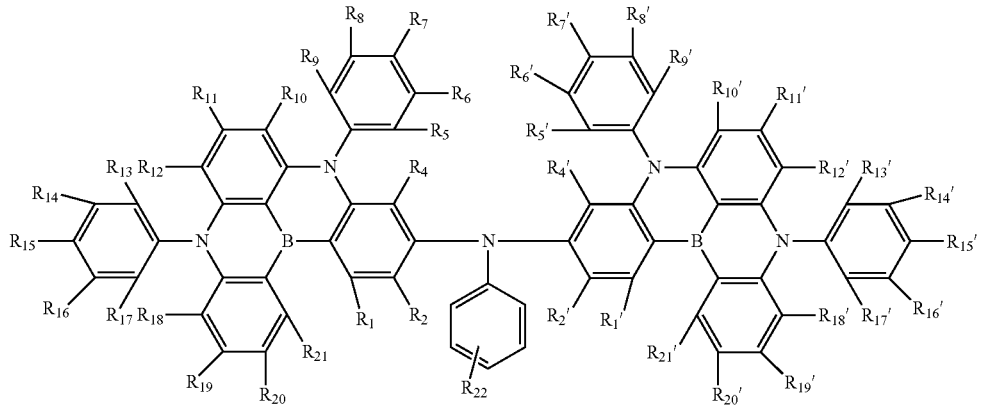
1-1J
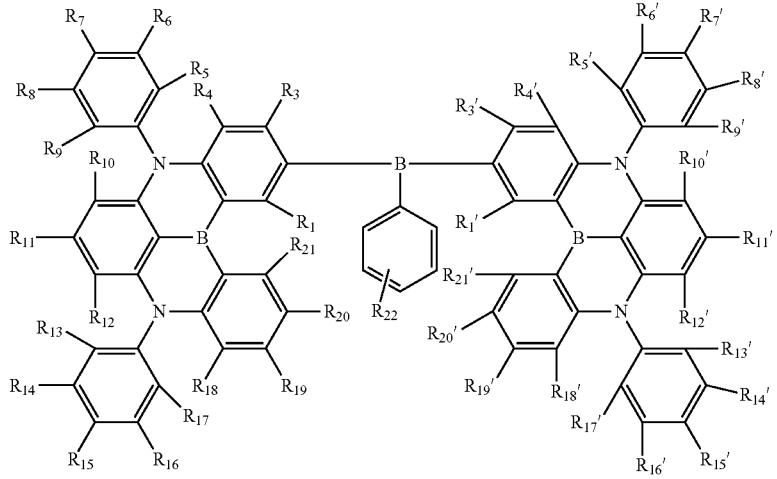

1-1K
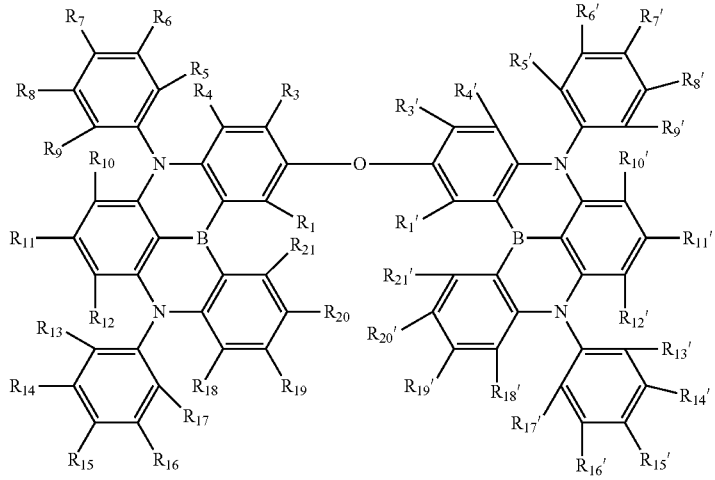
1-1L
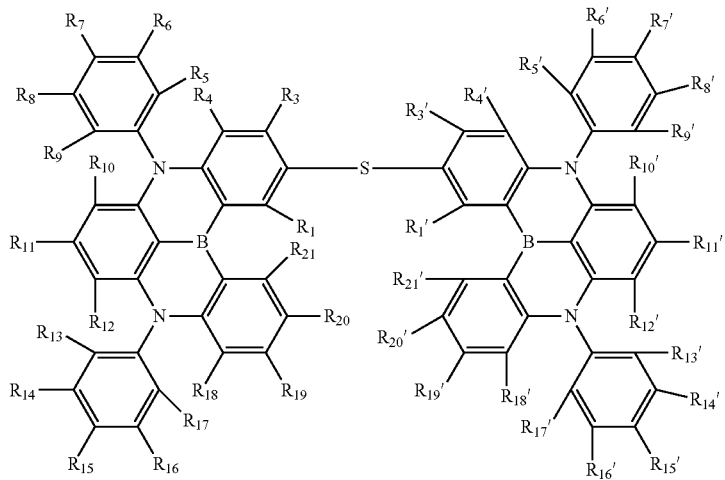
1-1M
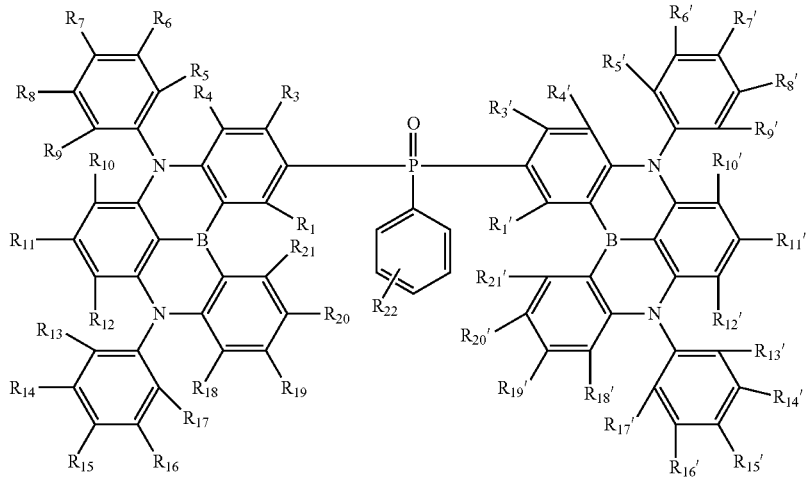

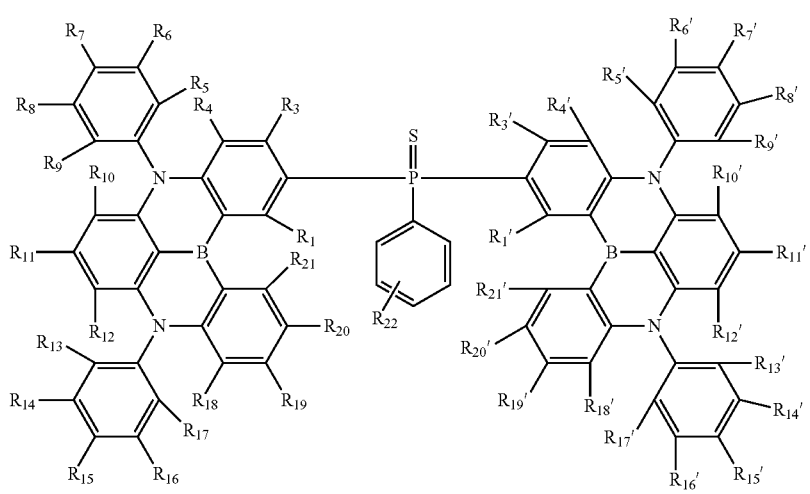

1-1N

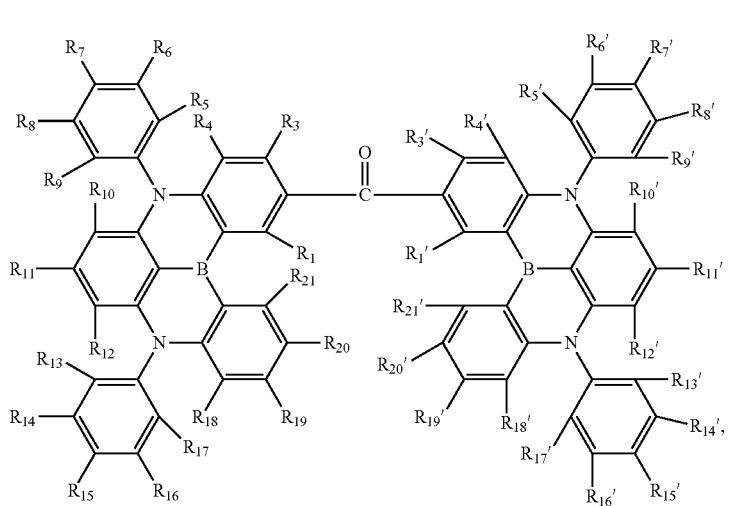

1-1O wherein, in Formula 1-1H to Formula 1-1O,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

17. The polycyclic compound of claim 13, wherein Formula 1-2 is represented by any one selected from Formula 1-2A to Formula 1-2E:

1-2E

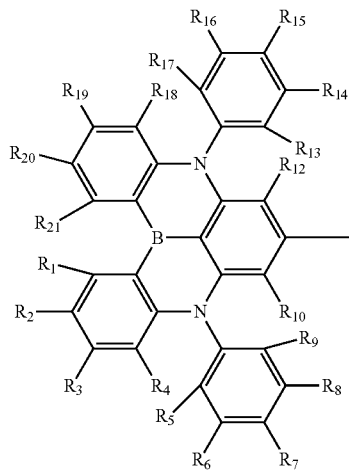
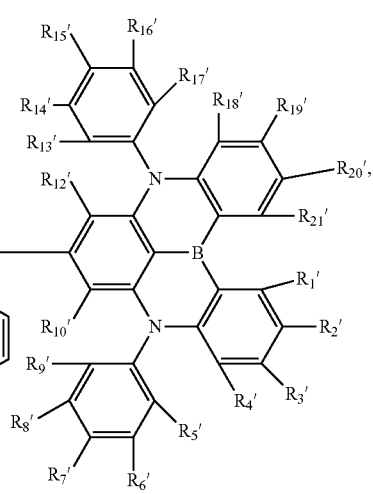

wherein, in Formula 1-2E,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group, and
provided that $R_{22}$ is not a substituted or unsubstituted carbazole group.

18. The polycyclic compound of claim 13, wherein Formula 1-3 is represented by Formula 1-3F:

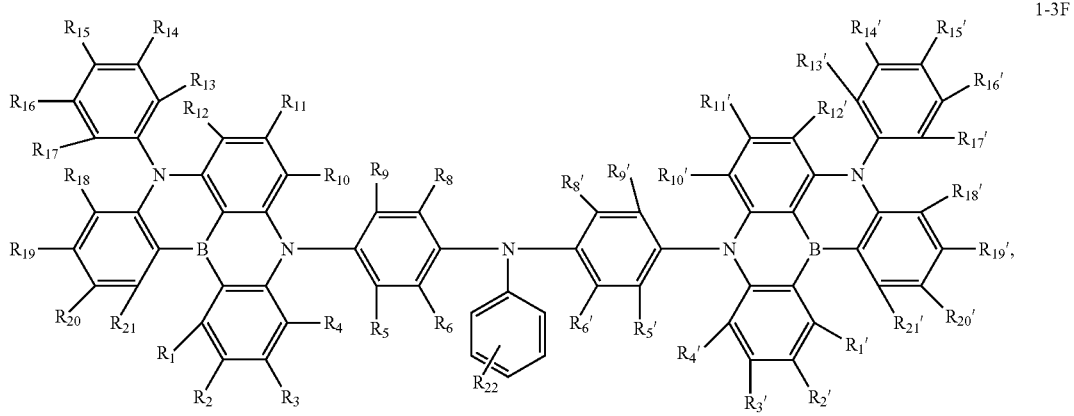

1-3F wherein, in Formula 1-3F,
$R_1$ to $R_{22}$ and $R_1'$ to $R_{21}'$ are each independently a hydrogen atom, a deuterium atom, an alkyl group of 1 to 20 carbon atoms, a substituted or unsubstituted aryl group of 6 to 30 ring-forming carbon atoms, a substituted or unsubstituted heteroaryl group of 2 to 30 ring-forming carbon atoms, a substituted or unsubstituted oxy group, or a substituted or unsubstituted thio group.

19. The polycyclic compound of claim 11, wherein the polycyclic compound represented by Formula 1 is a blue dopant to emit blue light having a center wavelength of about 470 nm or less.

20. The polycyclic compound of claim 11, wherein the polycyclic compound represented by Formula 1 is a material to emit thermally activated delayed fluorescence.

* * * * *